(12) United States Patent
Zhao et al.

(10) Patent No.: US 8,323,521 B2
(45) Date of Patent: Dec. 4, 2012

(54) PLASMA GENERATION CONTROLLED BY GRAVITY-INDUCED GAS-DIFFUSION SEPARATION (GIGDS) TECHNIQUES

(75) Inventors: Jianping Zhao, Houston, TX (US); Lee Chen, Cedar Creek, TX (US); Merritt Funk, Austin, TX (US); Toshihisa Nozawa, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 365 days.

(21) Appl. No.: 12/853,771

(22) Filed: Aug. 10, 2010

(65) Prior Publication Data
US 2011/0039355 A1 Feb. 17, 2011

Related U.S. Application Data

(60) Provisional application No. 61/233,401, filed on Aug. 12, 2009.

(51) Int. Cl.
*H01L 21/66* (2006.01)
(52) U.S. Cl. .......... 216/59; 216/67; 438/5; 438/9; 438/14; 438/689; 438/710; 438/714; 427/569
(58) Field of Classification Search .......... None
See application file for complete search history.

(56) References Cited

U.S. PATENT DOCUMENTS

| | | | |
|---|---|---|---|
| 5,024,716 A | 6/1991 | Sato | |
| 5,846,883 A * | 12/1998 | Moslehi | 438/711 |
| 6,802,944 B2 * | 10/2004 | Ahmad et al. | 204/192.23 |
| 7,500,397 B2 | 3/2009 | Weigel et al. | |
| 7,609,357 B2 | 10/2009 | Kim | |
| 2003/0213559 A1* | 11/2003 | Goodman | 156/345.28 |
| 2005/0199341 A1* | 9/2005 | Delp et al. | 156/345.24 |
| 2005/0260420 A1 | 11/2005 | Collins et al. | |
| 2006/0183055 A1 | 8/2006 | O'Neill et al. | |
| 2007/0002264 A1 | 1/2007 | Kim | |
| 2007/0039835 A1 | 2/2007 | Rossier et al. | |
| 2008/0199977 A1 | 8/2008 | Weigel et al. | |
| 2008/0302652 A1* | 12/2008 | Entley et al. | 204/157.15 |
| 2009/0084501 A1* | 4/2009 | Chen et al. | 156/345.26 |
| 2010/0041234 A1 | 2/2010 | Weigel et al. | |

* cited by examiner

*Primary Examiner* — Anita Alanko
(74) *Attorney, Agent, or Firm* — Manuel B. Mandriaga

(57) ABSTRACT

The invention can provide apparatus and methods of processing a substrate using plasma generation by gravity-induced gas-diffusion separation techniques. By adding or using gases including inert and process gases with different gravities (i.e., ratio between the molecular weight of a gaseous constituent and a reference molecular weight), a two-zone or multiple-zone plasma can be formed, in which one kind of gas can be highly constrained near a plasma generation region and another kind of gas can be largely separated from the aforementioned gas due to differential gravity induced diffusion and is constrained more closer to a wafer process region than the aforementioned gas.

20 Claims, 32 Drawing Sheets

FIG. 1     100

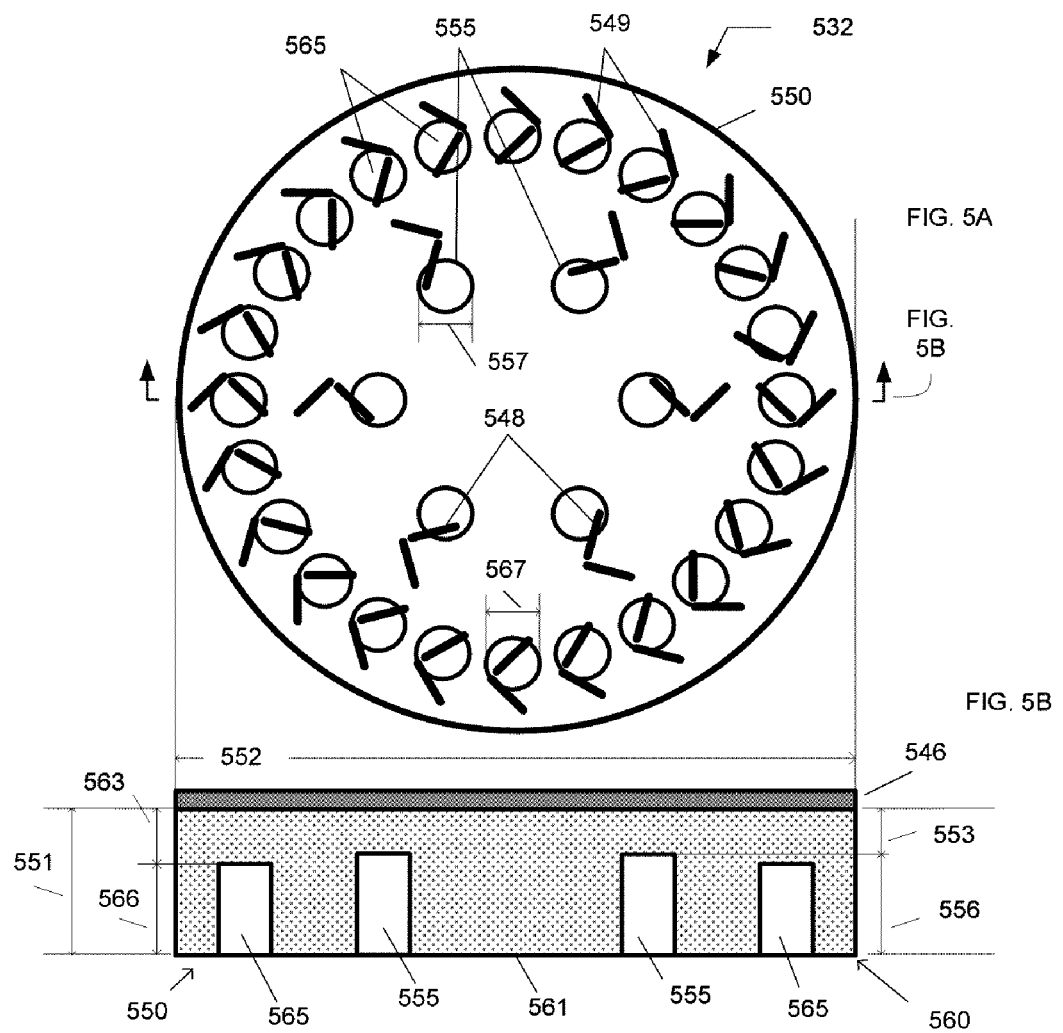

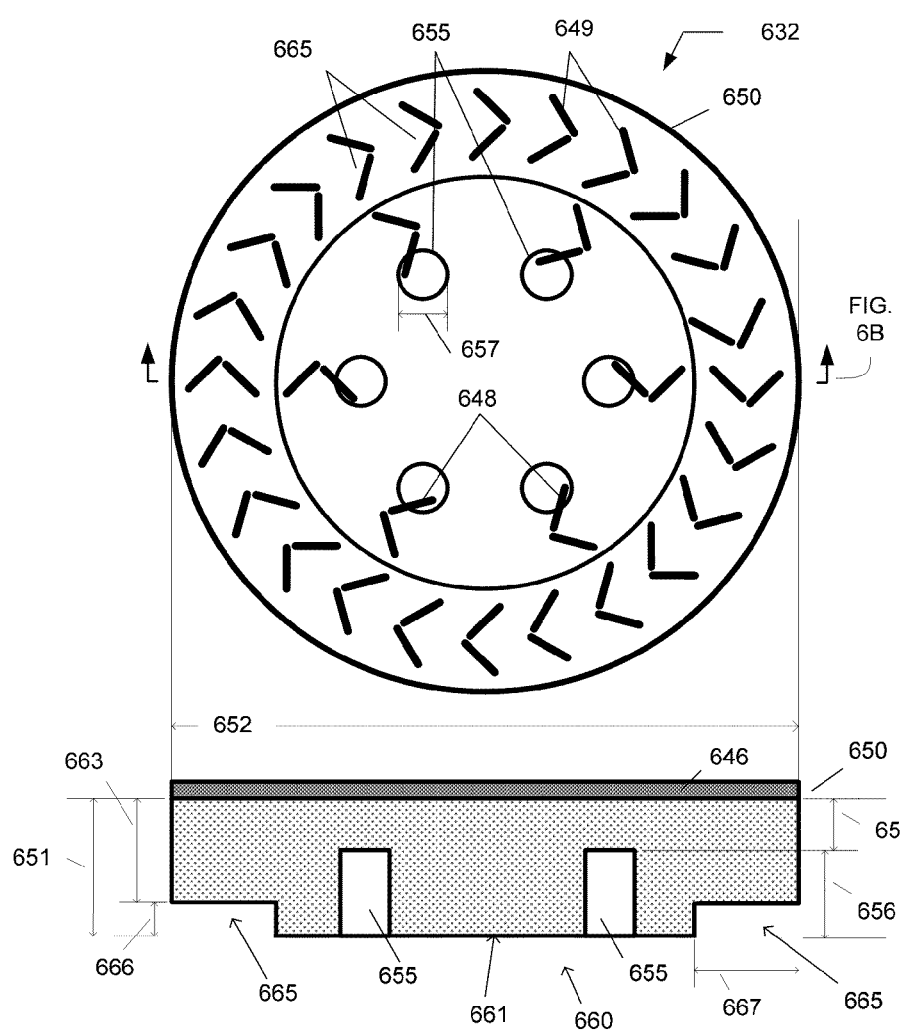

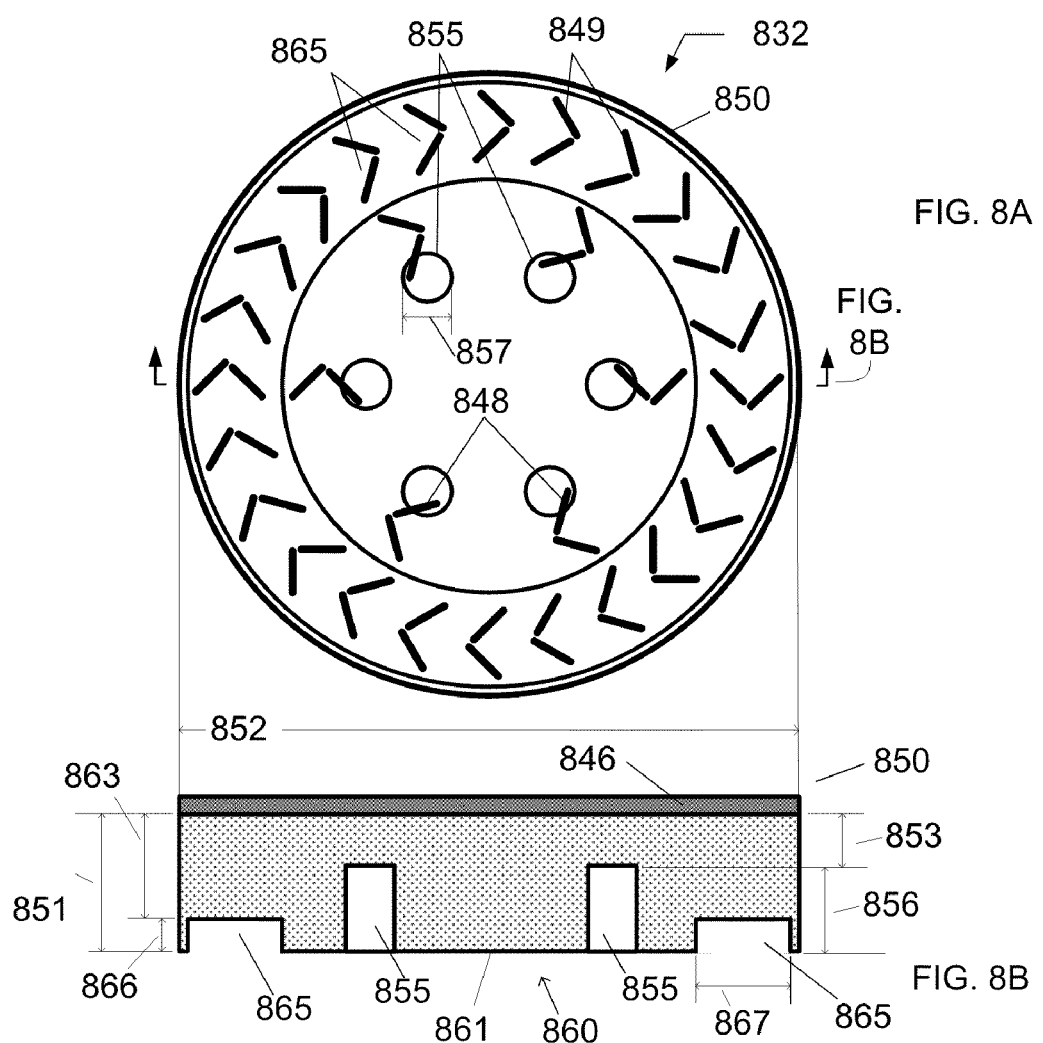

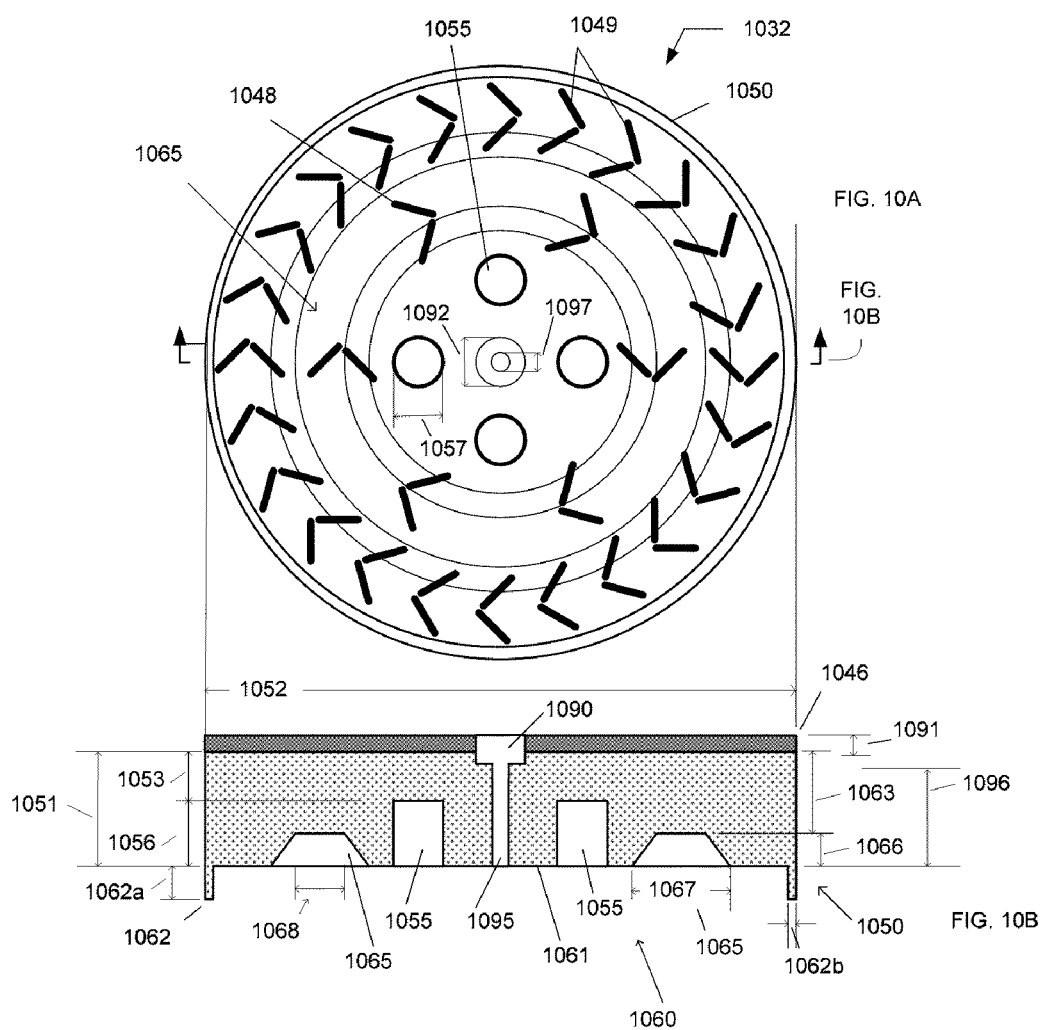

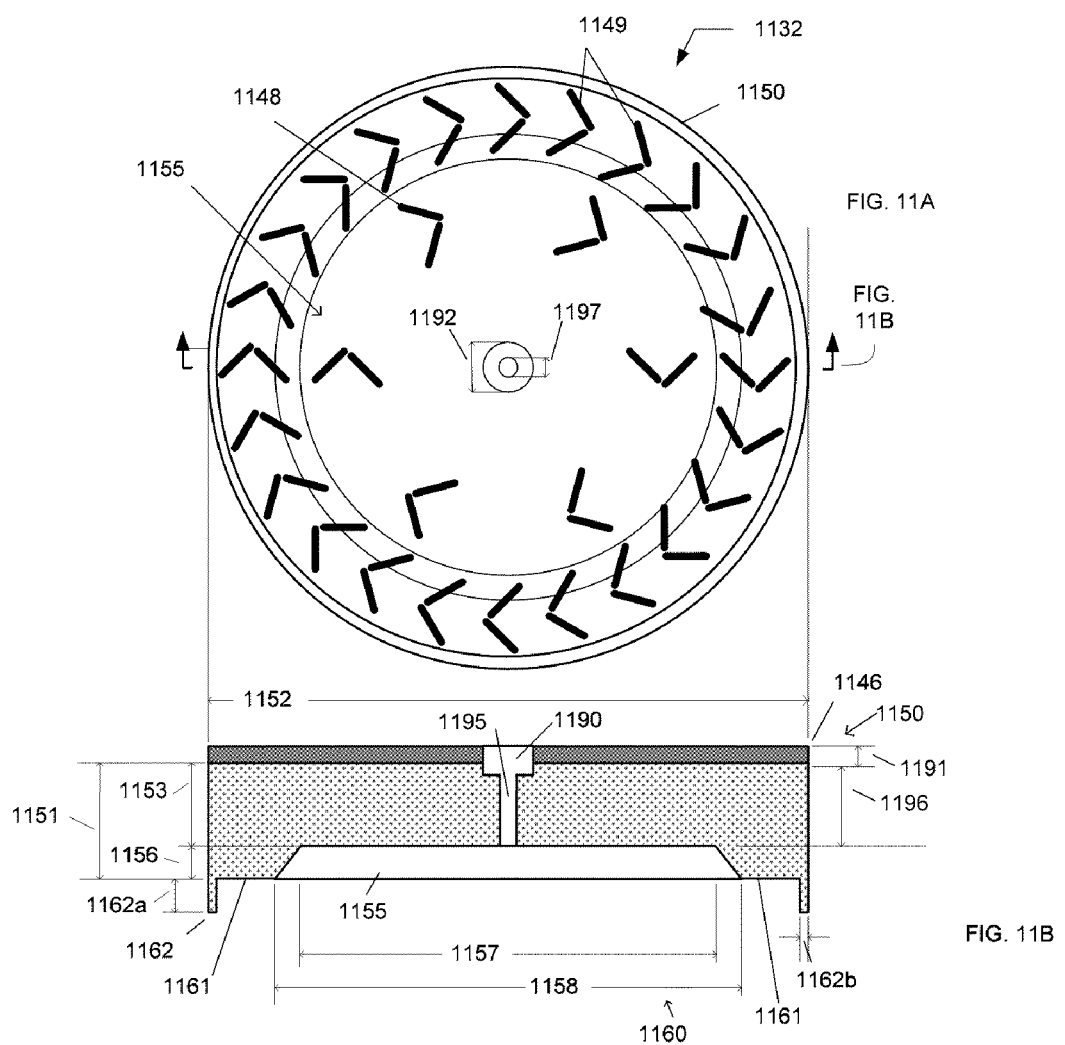

Stabilizing Plasma (150mT, 2500W)

He/Ar/O$_2$: 0/200/600

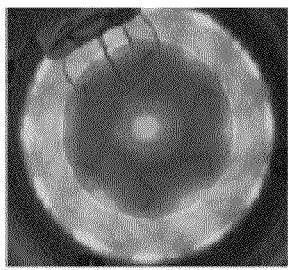

hybrid150mT200_600 sccm 2500W
Not Tuned

He/Ar/O$_2$: 25/175/600

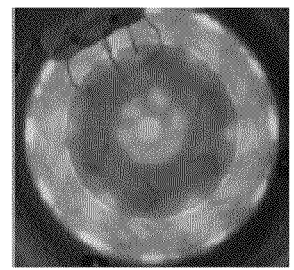

hybrid150mT25_175_600sccm 2500W
Not Tuned

He/Ar/O$_2$: 45/155/600

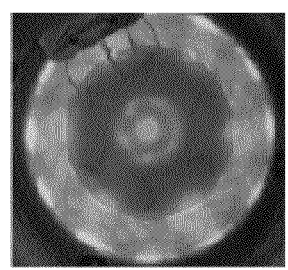

hybrid150mT45_155_600 sccm 2500W
Stable (0.2 mw/cm$^2$)

He/Ar/O$_2$: 50/150/600

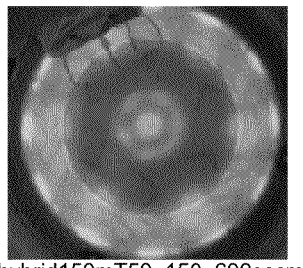

hybrid150mT50_150_600sccm 2500W
Stable (0.15 mw/cm$^2$)

He/Ar/O$_2$: 75/125/600

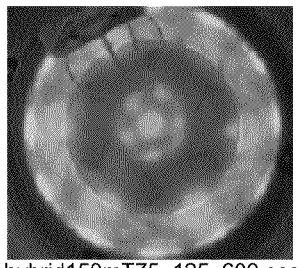

hybrid150mT75_125_600 sccm 2500W
Stable (0.06 mw/cm$^2$)

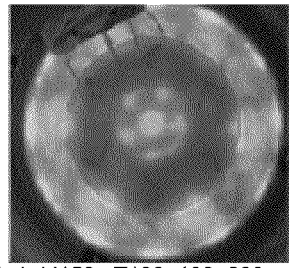

hybrid150mT100_100_600sccm 2500W
Stable (0.04 mw/cm$^2$)

He/Ar/O$_2$: 150/50/600

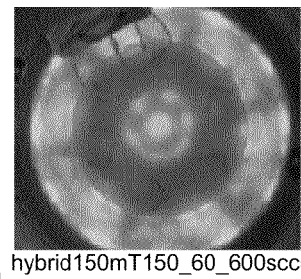

hybrid150mT150_60_600sccm 2500W
Stable (0.05 mw/cm$^2$)

He/Ar/O$_2$: 200/0/600

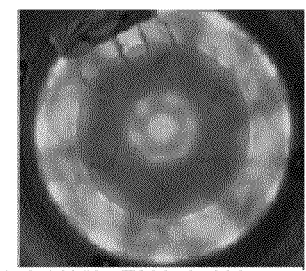

hybrid150mT200_0_600sccm 2500W
Stable (0.02 mw/cm$^2$)

Adding He can tune and stabilize plasma that was not tuned

EM radiation at the chamber bottom decreases with adding He to Ar/O$_2$ mixture

| Test Chamber: | 300mm |
|---|---|
| Wafer: | Clear Quartz |
| No Lower RF Unit | |

| EM Radiation measurements |
|---|
| EM High Frequency Radiation Meter Model: Narda Safty Test Solutions EMR-300 |
| EM Probe: Narda Safty Test Solutions E field 40Ghz BN 2244/31 AG 0055 |
| Measureemnt Position: Through quartz wafer and through lower glass window (same locations as the camera) |

| FIG. 13A = | Stabilizing Plasma | | | | | Results | |
|---|---|---|---|---|---|---|---|
| Pressure(mT) | Power(w) | O2 Flow(sccm) | Ar (sccm) | He(sccm) | Total Flow | EM(mW/cm2) | Stability |
| 150 | 2500 | 600 | 200 | 0 | 800 | na | Not Tuned |
| 150 | 2500 | 600 | 175 | 25 | 800 | na | Not Tuned |
| 150 | 2500 | 600 | 155 | 45 | 800 | 0.2 | Stable |
| 150 | 2500 | 600 | 150 | 50 | 800 | 0.15 | Stable |
| 150 | 2500 | 600 | 75 | 125 | 800 | 0.06 | Stable |
| 150 | 2500 | 600 | 100 | 100 | 800 | 0.04 | Stable |
| 150 | 2500 | 600 | 50 | 150 | 800 | 0.05 | Stable |
| 150 | 2500 | 600 | 0 | 200 | 800 | 0.02 | Stable |

FIG. 13B

Flickering Suppression (80mT, 2500W

He/Ar/O$_2$: 0/200/600      He/Ar/O$_2$: 50/150/600      He/Ar/O$_2$: 0/200/600

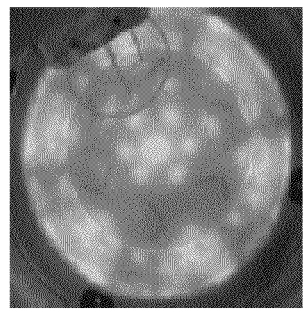   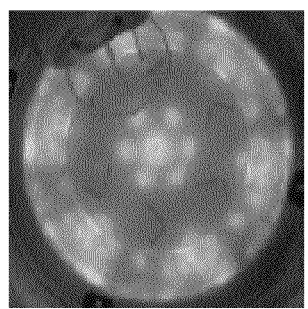   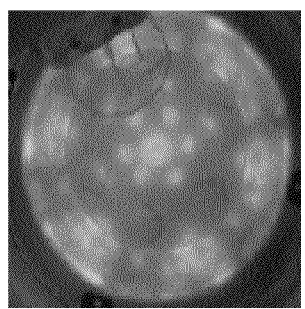

hybrid 80mT 0_200_600 sccm2500W    hybrid 80mT 50_150_600 sccm2500W    hybrid 80mT 0_200_600 sccm2500W
Flickering                     Stable   Adding He              Flickering Again

He/Ar/O$_2$: 50/150/600      He/Ar/O$_2$: 100/100/600      Stop He

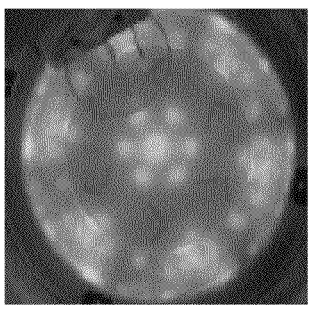   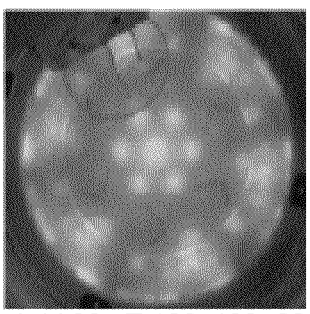

← Constant total flow rate hybrid 80mT 50_150_600 sccm2500W    hybrid 80mT 100_100_600 sccm2500W
Stable Again                    Stable

He/Ar/O$_2$: 50/200/600           Adding He Again

Adding He suppresses the plasma flickering

Adding He makes mode pattern more symmetrical hybrid 80mT 50_200_600 sccm2500W
Stable

← Total flow rate increased

FIG. 14A

| Test Chamber: | 300mm |
| --- | --- |
| Wafer: | Clear Quartz |
| No Lower RF Unit | |

| EM Radiation measurements | |
| --- | --- |
| EM High Frequency Radiation Meter Model: Narda Safty Test Solutions EMR-300 | |
| EM Probe: Narda Safty Test Solutions E field 40Ghz BN 2244/31 AG 0055 | |
| Measureemnt Position: Through quartz wafer and through lower glass window (same locations as the camera) | |

FIG. 14A = Flickering Suppression - more symmetrical, uniform plasma

| Sequence | Pressure(mT) | Power(w) | O2 Flow(sccm) | Ar (sccm) | He(sccm) | Total Flow | Stability | Notes |
| --- | --- | --- | --- | --- | --- | --- | --- | --- |
| 1 | 80 | 2500 | 600 | 200 | 0 | 800 | Flikering | |
| 2 | 80 | 2500 | 600 | 150 | 50 | 800 | Stable | added He |
| 3 | 80 | 2500 | 600 | 200 | 0 | 800 | Flikering | Stopped he |
| 4 | 80 | 2500 | 600 | 150 | 50 | 800 | Stable | Added He again |
| 5 | 80 | 2500 | 600 | 100 | 100 | 800 | Stable | |
| 6 | 80 | 2500 | 600 | 200 | 50 | 850 | Stable | Increased total flow |

FIG. 14B

Stabilizing Plasma (20mT, 3500W)
He/Ar/O$_2$: 0/200/600
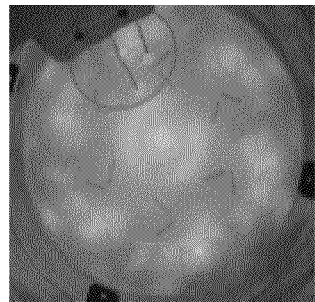
hybrid20mT0_200_600sccm 3500W
Flickering
He/Ar/O$_2$: 100/100/600
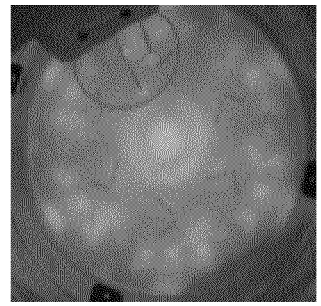
hybrid20mT100_100_600 sccm 3500W
Slightly Flickering
He/Ar/O$_2$: 125/75/600
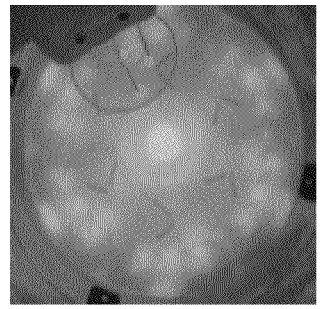
hybrid20mT125_75_600 sccm 3500W
Stable
He/Ar/O$_2$: 150/50/600
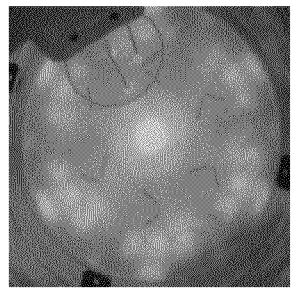
hybrid20mT150_50_600 sccm 3500W
Stable
He/Ar/O$_2$: 175/25/600
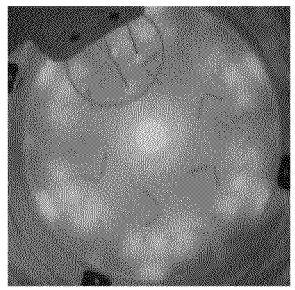
hybrid20mT175_25_600sccm 3500W
Stable
FIG. 15A
Adding He suppresses the plasma flickering at low pressure and high power

| Test Chamber: | 300mm |
|---|---|
| Wafer: | Clear Quartz |
| No Lower RF Unit | |

| EM Radiation measurements |
|---|
| EM High Frequency Radiation Meter Model: Narda Safty Test Solutions EMR-300 |
| EM Probe: Narda Safty Test Solutions E field 40Ghz BN 2244/31 AG 0055 |
| Measureemnt Position: Through quartz wafer and through lower glass window (same locations as the camera) |

| FIG. 15A = | Stabling Plasma - Low Pressure Hign Power | | | | | Results |
|---|---|---|---|---|---|---|
| Pressure(mT) | Power(w) | O2 Flow(sccm) | Ar (sccm) | He(sccm) | Total Flow | Stability |
| 20 | 3500 | 600 | 200 | 0 | 800 | Flikering |
| 20 | 3500 | 600 | 100 | 100 | 800 | Slight Flicker |
| 20 | 3500 | 600 | 75 | 125 | 800 | Stable |
| 20 | 3500 | 600 | 50 | 150 | 800 | Stable |
| 20 | 3500 | 600 | 25 | 175 | 800 | Stable |

FIG. 15B

Flickering Suppression (20mT, 2000W)
He/Ar/O$_2$: 0/200/600
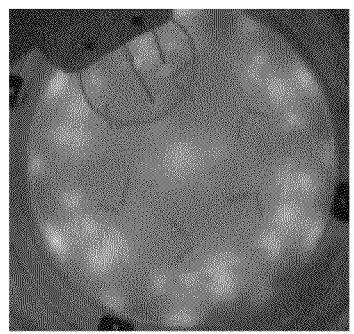
hybrid20mT0_200_600sccm 2000W
Flickering
He/Ar/O$_2$: 150/50/600
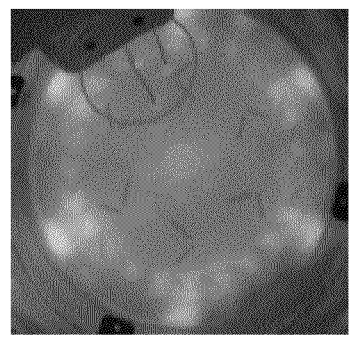
hybrid20mT150_50_600sccm 2000W
Stable
He/Ar/O$_2$: 175/25/600
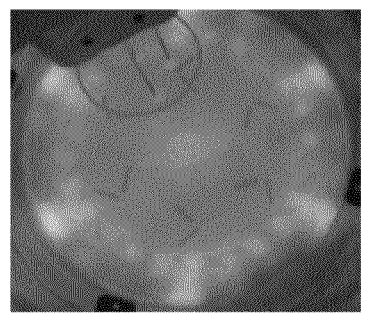
hybrid20mT175_25_600sccm 2000W
Stable
FIG. 16A
Adding He suppresses the plasma flickering at low pressure and middle power

| Test Chamber: | 300mm |
|---|---|
| Wafer: | Clear Quartz |
| No Lower RF Unit | |

| EM Radiation measurements |
|---|
| EM High Frequency Radiation Meter Model: Narda Safty Test Solutions EMR-300 |
| EM Probe: Narda Safty Test Solutions E field 40Ghz BN 2244/31 AG 0055 |
| Measureemnt Position: Through quartz wafer and through lower glass window (same locations as the camera) |

| FIG. 16A = | Stabling Plasma - Low Pressure , Middle Power | | | | | Results |
|---|---|---|---|---|---|---|
| Pressure(mT) | Power(w) | O2 Flow(sccm) | Ar (sccm) | He(sccm) | Total Flow | Stability |
| 20 | 2000 | 600 | 200 | 0 | 800 | Flikering |
| 20 | 2000 | 600 | 50 | 150 | 800 | Stable |
| 20 | 2000 | 600 | 25 | 175 | 800 | Stable |

FIG. 16B

Flickering Suppression (20mT, 1500W)
He/Ar/O$_2$: 0/200/600
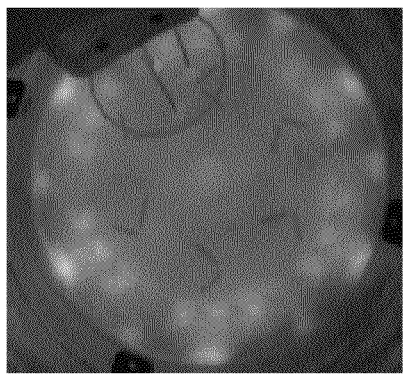
hybrid20mT0_200_600sccm1500W
Flickering
He/Ar/O$_2$: 75/125/600
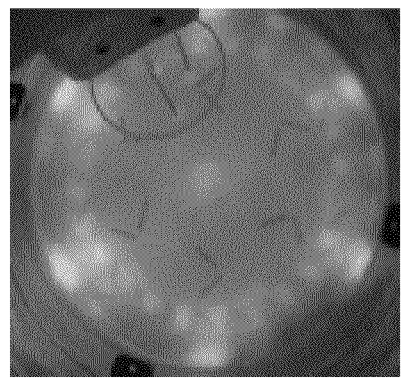
hybrid20mT75_125_600sccm1500W
Stable
Adding He suppresses the plasma flickering at low pressure and low power
FIG. 17A

| Test Chamber : | 300mm |
| Wafer: | Clear Quartz |
| No Lower RF Unit | |

| EM Radiation measurements |
| --- |
| EM High Frequency Radiation Meter Model: Narda Safty Test Solutions EMR-300 |
| EM Probe: Narda Safty Test Solutions E field 40Ghz BN 2244/31 AG 0055 |
| Measureemnt Position: Through quartz wafer and through lower glass window (same locations as the camera) |

| FIG. 17A = | Stabling Plasma - Low Pressure Low Power | | | | | Results |
| --- | --- | --- | --- | --- | --- | --- |
| Pressure(mT) | Power(w) | O2 Flow(sccm) | Ar (sccm) | He(sccm) | Total Flow | Stability |
| 20 | 1500 | 600 | 200 | 0 | 800 | Flikering |
| 20 | 1500 | 600 | 125 | 75 | 800 | Stable |

FIG. 17B

Flickering Suppression (10mT, 2500W)
He/Ar/O$_2$: 0/200/600
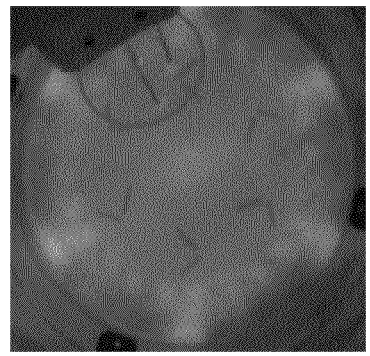
hybrid10mT0_200_600sccm2500W
Flickering
He/Ar/O$_2$: 25/175/600
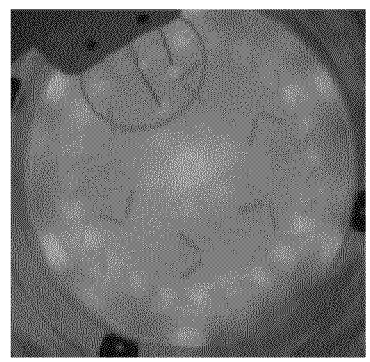
hybrid10mT25_175_600sccm2500W
Stable
He/Ar/O$_2$: 50/150/600
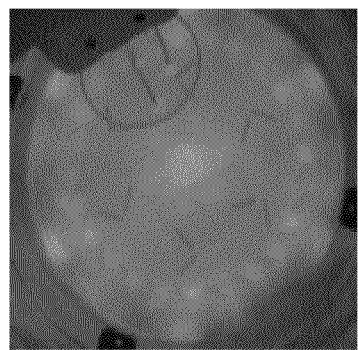
hybrid10mT50_150_600sccm2500W
Stable
FIG. 18A
Adding He suppresses the plasma flickering at very low pressure

| Test Chamber: | 300mm |
|---|---|
| Wafer: | Clear Quartz |
| No Lower RF Unit | |

| EM Radiation measurements |
|---|
| EM High Frequency Radiation Meter Model: Narda Safty Test Solutions EMR-300 |
| EM Probe: Narda Safty Test Solutions E field 40Ghz BN 2244/31 AG 0055 |
| Measureemnt Position: Through quartz wafer and through lower glass window (same locations as the camera) |

FIG. 18A

| FIG. 18A = | Flickering Suppression - very Low Pressure plasma | | | | | Results |
|---|---|---|---|---|---|---|
| Pressure(mT) | Power(w) | O2 Flow(sccm) | Ar (sccm) | He(sccm) | Total Flow | Stability |
| 10 | 2500 | 600 | 200 | 0 | 800 | Flikering |
| 10 | 2500 | 600 | 175 | 175 | 950 | Stable |
| 10 | 2500 | 600 | 150 | 150 | 900 | Stable |

FIG. 18B

Blocking EM Radiation (150mT, 1000W)
He/Ar/O$_2$: 0/200/600
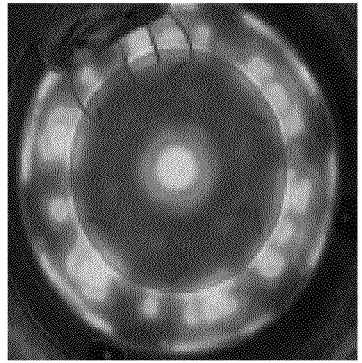
hybrid150mT0_200_600sccm1000W
5.6 mW/cm$^2$
He/Ar/O$_2$: 100/100/600
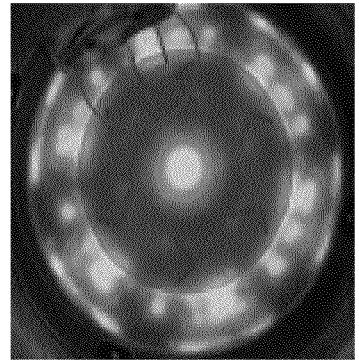
hybrid150mT100_100_600sccm1000W
3.4 mW/cm$^2$
He/Ar/O$_2$: 200/0/600
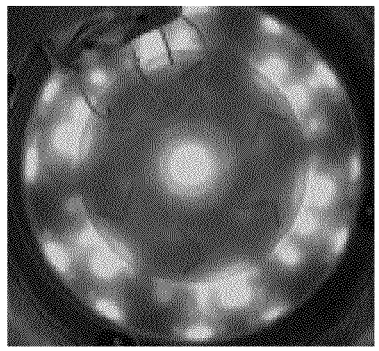
hybrid150mT200_0_600sccm1000W
0.6 mW/cm$^2$
FIG. 19A
EM radiation at the chamber bottom decreases with adding He to Ar/O$_2$ mixture

| Test Chamber: | 300mm |
|---|---|
| Wafer: | Clear Quartz |
| No Lower RF Unit | |

| EM Radiation measurements |
|---|
| EM High Frequency Radiation Meter Model: Narda Safty Test Solutions EMR-300 |
| EM Probe: Narda Safty Test Solutions E field 40Ghz BN 2244/31 AG 0055 |
| Measureemnt Position: Through quartz wafer and through lower glass window (same locations as the camera) |

FIG. 19A =

| Blocking EM Radiation | | | | | | Results | |
|---|---|---|---|---|---|---|---|
| Pressure(mT) | Power(w) | O2 Flow(sccm) | Ar (sccm) | He(sccm) | Total Flow | EM(mW/cm2) | Stability |
| 150 | 1000 | 600 | 200 | 0 | 800 | 5.6 | Stable |
| 150 | 1000 | 600 | 100 | 100 | 800 | 3.4 | Stable |
| 150 | 1000 | 600 | 0 | 200 | 800 | 0.6 | Stable |

FIG. 19B

Uniformity Knob (150mT, 2500W
He/Ar/O$_2$: 0/245/600          He/Ar/O$_2$: 195/50/600
 
hybrid150mT0_245_600sccm2500W     hybrid150mT195_50_600sccm2500W
Adding He adjusts central density, implying an uniformity knob
FIG. 20A

| Test Chamber: | 300mm |
| Wafer: | Clear Quartz |
| No Lower RF Unit | |

| EM Radiation measurements |
| --- |
| EM High Frequency Radiation Meter Model: Narda Safty Test Solutions EMR-300 |
| EM Probe: Narda Safty Test Solutions E field 40Ghz BN 2244/31 AG 0055 |
| Measureemnt Position: Through quartz wafer and through lower glass window (same locations as the camera) |

Fig 20b  Uniformity Knob (150mT, 2500W)            Results

| Pressure(mT) | Power(w) | O2 Flow(sccm) | Ar (sccm) | He(sccm) | Total Flow | Uniformity | Stability |
| --- | --- | --- | --- | --- | --- | --- | --- |
| 150 | 2500 | 600 | 245 | 0 | 845 | center higher density | Stable |
| 150 | 2500 | 600 | 50 | 195 | 845 | edge higher density | Stable |

PLASMA GENERATION CONTROLLED BY GRAVITY-INDUCED GAS-DIFFUSION SEPARATION (GIGDS) TECHNIQUES

BACKGROUND OF THE INVENTION

1. Field of the Invention

The invention relates to plasma generation systems that are controlled using Gravity-Induced Gas-Diffusion Separation (GIGDS) techniques.

2. Description of Related Art

Typically, during semiconductor processing, a plasma etch process is utilized to remove or etch material along fine lines or within vias or contacts patterned on a semiconductor substrate. The plasma etch process generally involves positioning a semiconductor substrate with an overlying patterned, protective layer, for example a photoresist layer, into a process chamber. In addition, during semiconductor processing, a plasma enhanced chemical vapor deposition (PECVD) process can be utilized to deposit material to fill trenches, vias, and/or contacts patterned on the semiconductor substrate.

For example, in plasma etch processes, once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a portion of the gas species present is ionized following collisions with energetic electrons. Moreover, the heated electrons serve to dissociate some species of the mixture of gas species and create reactant specie(s) suitable for the exposed-surface etch chemistry. Once the plasma is formed, any exposed surfaces of the substrate are etched by the plasma. The process is adjusted to achieve optimal conditions, including an appropriate concentration of desirable reactant and ion populations to etch various features (e.g., trenches, vias, contacts, etc.) in the exposed regions of substrate. Such substrate materials where etching is required include silicon dioxide ($SiO_2$), poly-silicon, and silicon nitride, for example.

Conventionally, various techniques have been implemented for exciting a gas into plasma for the treatment of a substrate during semiconductor device fabrication, as described above. In particular, ("parallel plate") capacitively coupled plasma (CCP) processing systems, or inductively coupled plasma (ICP) processing systems have been utilized commonly for plasma excitation. Among other types of plasma sources, there are microwave plasma sources (including those utilizing electron-cyclotron resonance (ECR)), surface wave plasma (SWP) sources, and helicon plasma sources.

SWP sources are known to offer improved plasma processing performance, particularly for etching processes, over CCP systems, ICP systems and resonantly heated systems. SWP sources produce a high degree of ionization at a relatively lower Boltzmann electron temperature ($T_e$). In addition, SWP sources generally produce plasma richer in electronically excited molecular species with reduced molecular dissociation. However, the practical implementation of SWP sources still suffers from several deficiencies including, for example, plasma stability and uniformity.

In current semiconductor process, electronegative gases (e.g. $O_2$, NO, $N_2O$, $Cl_2$, HBr, $F_2$, $S_xF_y$, $C_xF_y$, $C_xF_yH_z$, or their mixtures, etc.) are often added into electropositive gases such as $N_2$ or inert gases (e.g. Ar) for etch, deposition, and cleaning. Due to the interaction between electropositive ionization (produce positive ions and electrons) and electronegative ionization (produce positive ions and negative ions along with small amount electrons), the balance between electron attachment and electron detachment may not continue. Together with other known or unknown reasons, plasma generation using mixtures of electronegative gas and electropositive gas have many kinds of problems and issues related to process control and quality.

Instability can be a problem in a plasma source. For example, plasma generation can be unstable and this instability may manifest as plasma "flickering", or the plasma source may not be tuned at certain process conditions when using a mixture of electronegative gas and electropositive gas. The instability problem can influence the process performance by restricting the process window, affecting plasma uniformity, reducing productivity by adding stabilization time, or may even cause device failure, etc.

Electromagnetic (EM) radiation can be a problem in a plasma source. For example, the electron density in the plasma is lower when one or more electronegative gases are added. As a result, the EM wave would not be blocked (absorbed) by plasma (plasma electrons), and the EM wave would propagate to the wafer area, or areas with sensitive devices attached to the plasma chamber. Such EM radiation could damage the wafer thereby causing device and process failure, or adversely affect the sensitive devices attached to the plasma chamber. Therefore, the plasma process has to be restricted to electron over-dense conditions, such as higher power or specific ranges of pressure, and this limits the process window and adds energy cost.

Uniformity can be another exemplary problem in a plasma source. In some cases, the electron density and ion density may not be uniform because the electronegative discharge is strongly dependant on the electrical field intensity. For example, there can be strong electronegative discharge with very low electron density, or there can be totally electropositive discharge with very low negative ion density, or there can be other types of discharges that can be between the two extreme conditions, depending on pressure, partial pressure (or flow rate ratio) of electronegative gas to electropositive gas, and power. If, at the plasma generation region, the electric field is not uniformly distributed, then a non-uniformly distributed electronegative discharge region and electropositive discharge region can cause a non-uniform electron density and ion density. This non-uniformity may also affect plasma stability.

Erosion and contamination problems can also exist in a plasma source when the plasma is generated near the plasma-dielectric interface. The reactive and corrosive electronegative gas or other process gas cause dielectric plate erosion by chemical reaction and/or by physical sputtering and contamination. This induces not only plasma generation and control problems, but also reduces the lifetime of the dielectric plate, and requires extra plate cleaning processes and/or replacement. In addition, this erosion and contamination would increase particle density that may cause device/wafer failure.

The above are only several examples that would be induced by adding electronegative gas or other process gases in the plasma process chamber. The problems are not limited to those examples and are not limited to microwave plasma source, meaning that those problems can be associated to any plasma source and processes.

SUMMARY OF THE INVENTION

The invention relates to plasma generation systems that are controlled using Gravity-Induced Gas-Diffusion Separation (GIGDS) techniques.

The basic concept is to control plasma generation by gravity-induced gas-diffusion separation techniques. By adding or using gases including inert and process gases with different gravities (i.e., ratio between the molecular weight of a gaseous constituent and a reference molecular weight), a two-zone or multiple-zone plasma can be formed, in which one kind of gas can be highly constrained near a plasma generation region and another kind of gas can be largely separated from the aforementioned gas due to differential gravity induced diffusion and is constrained more closer to a wafer process region than the aforementioned gas. Here, one kind of gas not only means one gas, but also means a mixture of several gases, and the mixture can include either electropositive discharge gas or electronegative discharge gas. The same meaning also applies to another kind of gas. When the mixing occurs, the same gases can be used or different gases can be used. In addition, there is often no clear boundary between the different kinds of gases, and the mixing can occur at one or more different regions. In many examples, electropositive gases are often preferred to be constrained near the plasma generation (power source) region for most applications, which therefore can efficiently block (absorb) EM radiation due to high electron density in electropositive plasma as in microwave plasma sources.

The Gravity-Induced Gas-Diffusion Separation-Controlled (GIGDSC) plasma processing system and the Gravity-Induced Gas-Diffusion Separation (GIGDS) techniques associated therewith can be applied to any kind of plasma generation methods, any kind of plasma sources, and any kind of plasma processes. For example, the GIGDSC plasma processing system can include radio frequency (RF) sources, CCP sources, ICP sources, microwave radial line slotted antenna (RLSA) plasma sources, surface wave plasma sources, microwave electron cyclotron resonance (ECR) sources, etc, as some examples. In the following, one or more surface wave plasmas are presented to address the novelty and concept of the invention. However, the invention should cover any kind of plasma sources, plasma generation methods, and plasma processes using the method and concept addressed herein.

The GIGDSC plasma processing systems that use plasma generation controlled by gravity-induced gas-diffusion separation techniques are presented herein as exemplary semiconductor processing systems. In addition, GIGDS techniques can be applied to any kind of plasma sources, to any kind of plasma generation methods, to any kind of plasma processes including those used for semiconductor process, such as RF CCP, ICP, microwave RLSA plasma, surface wave plasma, microwave ECR plasma, etc, as some examples. In the following, surface wave plasmas are described and discussed to address the novelty and concept of the invention. However, the invention can cover any kind of plasma sources, plasma generation methods, and plasma processes using the GIGDSC plasma processing system and methods addressed herein. The basic concept is to control plasma generation by gravity-induced gas-diffusion separation techniques. By adding or using gases including inert and process gases with different gravities, a two-zone or multiple-zone plasma can be formed, in which one kind of gas can be highly constrained near a plasma generation region and another kind of gas would be largely separated from the aforementioned gas due to differential gravity induced diffusion and is constrained more closer to a wafer process region than the aforementioned gas. Here, one kind of gas not only means one gas, but also means a mixture of several gases, and the mixture can include either electropositive discharge gas or electronegative discharge gas. The same meaning also applies to another kind of gas. When the mixing occurs, the same gases can be used or different gases can be used. In addition, there is often no clear boundary between the different kinds of gases, and the mixing can occur at one or more different regions. In many examples, electropositive gases are often preferred to be constrained near the plasma generation (power source) region for most applications, which therefore can efficiently block (absorb) EM radiation due to high electron density in electropositive plasma as in microwave plasma source.

In some embodiments, surface wave plasma (SWP) sources are used. The SWP source comprises an electromagnetic (EM) wave launcher configured to couple EM energy in a desired EM wave mode to a plasma by generating a surface wave on a plasma-facing surface of the EM wave launcher adjacent the plasma. The EM wave launcher comprises a slotted antenna having a plurality of slots. The plurality of slots is configured to couple the EM energy from a first region above the slotted antenna to a second region below the slotted antenna. A dielectric plate or resonator plate is positioned in the second region and has a lower surface that includes the plasma-facing surface of the EM wave launcher. The SWP source further comprises a first recess configuration formed in the plasma-facing surface, wherein the first recess configuration is substantially aligned with a first arrangement of slots in the plurality of slots, and a second recess configuration formed in the plasma-facing surface, wherein the second recess configuration is either partly aligned with a second arrangement of slots in the plurality of slots or not aligned with the second arrangement of slots in the plurality of slots. A power coupling system is coupled to the EM wave launcher and configured to provide the EM energy to the EM wave launcher for forming the plasma.

According to other embodiments, other surface wave plasma (SWP) sources are used. The SWP source comprises an electromagnetic (EM) wave launcher configured to couple EM energy in a desired EM wave mode to plasma by generating a surface wave on a plasma-facing surface of the EM wave launcher adjacent said plasma. The EM wave launcher comprises a slotted antenna having a plurality of slots formed therethrough configured to couple the EM energy from a first region above the slotted antenna to a second region below the slotted antenna, and a resonator plate positioned in the second region and having a lower surface including the plasma-facing surface of the EM wave launcher. A first recess configuration is formed in the plasma-facing surface, wherein the first recess configuration is substantially aligned with a first arrangement of slots in the plurality of slots. Additionally, means for stabilizing the plasma for a pressure in the process space ranging from about 10 mtorr to about one torr is provided, wherein the means for stabilizing the plasma is formed in the plasma-facing surface of the resonator plate. Furthermore, the SWP source comprises a power coupling system coupled to the EM wave launcher and configured to provide the EM energy to the EM wave launcher for forming the plasma.

BRIEF DESCRIPTION OF THE DRAWINGS

In the accompanying drawings:

FIG. 5A illustrates a bottom view of an EM wave launcher in accordance with embodiments of the invention;

FIG. 5B illustrates a schematic cross-sectional view of a portion of the EM wave launcher depicted in FIG. 5A;

FIG. 6A illustrates a bottom view of an EM wave launcher in accordance with embodiments of the invention;

FIG. 6B illustrates a schematic cross-sectional view of a portion of the EM wave launcher depicted in FIG. 6A;

FIG. 8A illustrates a bottom view of an EM wave launcher in accordance with embodiments of the invention;

FIG. 8B illustrates a schematic cross-sectional view of a portion of the EM wave launcher depicted in FIG. 8A;

FIG. 10A illustrates a bottom view of an EM wave launcher in accordance with additional embodiments of the invention;

FIG. 10B illustrates a schematic cross-sectional view of a portion of the EM wave launcher depicted in FIG. 10A;

FIG. 11A illustrates a bottom view of an EM wave launcher in accordance with additional embodiments of the invention;

FIG. 11B illustrates a schematic cross-sectional view of a portion of the EM wave launcher depicted in FIG. 11A;

FIG. 13A illustrates exemplary process data in accordance with embodiments of the invention, and FIG. 13B illustrates a set of process conditions and process results associated with FIG. 13A;

FIG. 14A illustrates exemplary flicker suppression data in accordance with embodiments of the invention, and FIG. 14B illustrates a set of process conditions and process results associated with FIG. 14A;

FIG. 15A illustrates exemplary stabilization data in accordance with embodiments of the invention, and FIG. 15B illustrates a set of process conditions and process results associated with FIG. 15A;

FIG. 16A illustrates additional exemplary stabilization data in accordance with embodiments of the invention, and FIG. 16B illustrates a set of process conditions and process results associated with FIG. 16A;

FIG. 17A illustrates additional exemplary stabilization data in accordance with embodiments of the invention, and FIG. 17B illustrates a set of process conditions and process results associated with FIG. 17A;

FIG. 18A illustrates additional exemplary flicker suppression data in accordance with embodiments of the invention, and FIG. 18B illustrates a set of process conditions and process results associated with FIG. 18A;

FIG. 19A illustrates exemplary blocking data in accordance with embodiments of the invention, and FIG. 14B illustrates a set of process conditions and process results associated with FIG. 19A;

FIG. 20A illustrates additional uniformity data in accordance with embodiments of the invention, and FIG. 20B illustrates a set of process conditions and process results associated with FIG. 20A;

DETAILED DESCRIPTION OF EXEMPLARY EMBODIMENTS

Gravity-Induced Gas-Diffusion Separation-Controlled (GIGDSC) plasma processing systems and techniques for controlling plasma generation are disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features that, notwithstanding the inventive nature of the general concepts being explained, are also of an inventive nature.

Figure 1:
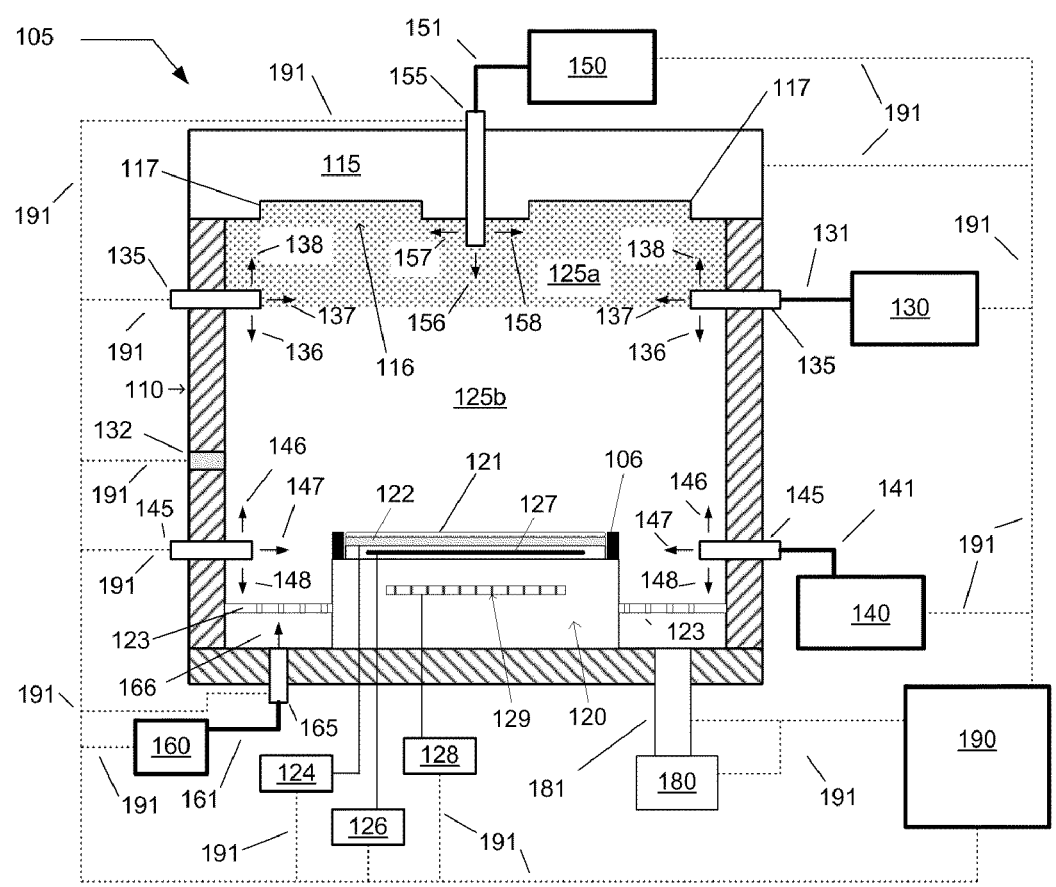
FIG. 1 illustrates a simplified schematic representation of a Gravity-Induced Gas-Diffusion Separation-Controlled (GIGDSC) plasma processing system in accordance with embodiments of the invention.

Referring now to the drawings, wherein like reference numerals designate identical or corresponding parts throughout the several views. FIG. 1 illustrates a simplified schematic representation of a first Gravity-Induced Gas-Diffusion Separation-Controlled (GIGDSC) plasma processing system in accordance with embodiments of the invention. The first GIGDSC plasma processing system 100 can comprise a dry plasma etching system or a plasma enhanced deposition system or any other plasma processing system. The first GIGDSC plasma processing system 100 can include a first GIGDSC plasma processing subsystem 105, a first gas supply system 130 coupled to the GIGDSC plasma processing subsystem 105, a second gas supply system 140 coupled to the first GIGDSC plasma processing subsystem 105, a third gas supply system 150 coupled to the first GIGDSC plasma processing subsystem 105, a fourth gas supply system 160 coupled to the first GIGDSC plasma processing subsystem 105, a first pumping system 180 coupled the first GIGDSC plasma processing subsystem 105, and a first control system 190 coupled to the first GIGDSC plasma processing subsystem 105, coupled to the first gas supply system 130, coupled to the second gas supply system 140, coupled to the third gas supply system 150, coupled to first pumping system 180, and coupled to a first pressure control system 181. For example, control bus 191 can be used to couple the first control system 190 to the required elements in the first GIGDSC plasma processing system 100 as shown in FIG. 1. Alternatively, one or more of the gas supply systems (130, 140, 150, and 160) may not be required.

The first GIGDSC plasma processing subsystem 105 can include a first process chamber 110 configured to define a plurality of plasma/processing spaces (125a and 125b). Alternatively, one or more of the plasma/processing spaces (125a and 125b) may be configured differently or may not be required. The first process chamber 110 can include a first substrate holder 120 configured to support a first substrate 121. The first substrate 121 can be exposed to plasma or process chemistry in the plasma processing space 125b when the first process chamber includes a plurality of plasma/processing spaces (125a and 125b).

In some embodiments, the first substrate holder 120 can be coupled to ground. For example, when the first substrate 121 is clamped to substrate holder 120, a ceramic electrostatic clamp (ESC) layer may insulate the first substrate 121 from the grounded substrate holder 120.

The first GIGDSC plasma processing subsystem 105 can include a substrate temperature control system 128 coupled to temperature control elements 129 in the first substrate holder 120 and configured to adjust and control the temperature of first substrate 121. Alternatively, the first GIGDSC plasma processing subsystem 105 can include temperature control elements (not shown) in one or more of the walls of the first process chamber 110 and/or any other component within the first GIGDSC plasma processing subsystem 105.

In order to improve the thermal transfer between the first substrate 121 and first substrate holder 120, the first substrate holder 120 can include one or more thermal transfer elements 122 that can be coupled to a thermal control system 124. For example, the thermal transfer elements 122 can include an electrostatic clamping (ESC) electrode (not shown) that can be coupled to a clamping supply in the thermal control system 124 and that can be used to affix the first substrate 121 to an upper surface of first substrate holder 120. In some embodiments, one or more of the thermal transfer elements 122 can be used to isolate the first substrate 121 from the first substrate holder 120 when it is grounded. In addition, the thermal transfer elements 122 can further include backside gas elements (not shown) that can be coupled to a backside gas delivery system in the thermal control system 124. One or more of the thermal transfer elements 122 can be configured to introduce gas to the backside of the first substrate 121 in order to improve the gas-gap thermal conductance between the first substrate 121 and first substrate holder 120, and temperature control of the first substrate 121 is required at elevated or reduced temperatures. For example, the thermal transfer elements 122 can include two-zone (center/edge) backside gas elements, and the helium gas gap pressure can be independently varied between the center and the edge of the first substrate 121.

In some embodiments, the first substrate holder 120 can comprise an electrode 127 through which RF power is coupled to the processing plasma in plasma processing space 125b. For example, the first substrate holder 120 can be electrically biased at a RF voltage via the transmission of RF power from a RF generator 126 to the electrode 127 in the first substrate holder 120. When the RF bias is used, the RF bias can serve to heat electrons to form and maintain the processing plasma in plasma processing space 125b. The operating frequency for the RF generator 126 can range from about 0.1 MHz to about 100 MHz. RF systems for plasma processing are well known to those skilled in the art. Alternatively, RF power may be applied to the substrate holder electrode at multiple frequencies or may not be required. In other embodiments, DC power can be provided to the electrode 127.

In addition, the first substrate holder 120 may be surrounded by a first baffle member 123 that extends beyond a peripheral edge of the first substrate holder 120. The baffle member 123 may serve to homogeneously distribute the pumping speed delivered by the pressure control system 181 to the interior of the first process chamber 110. The baffle member 123 may be fabricated from a dielectric material, such as quartz, or alumina The baffle member 123 may provide a high RF impedance to ground for the plasma in the interior of the first process chamber 110.

In some embodiments, a first conductive focus ring 106 can be used, and the first conductive focus ring 106 can include a silicon-containing material and can be disposed on the top of the first substrate holder 120. In some examples, first conductive focus ring 106 can be configured to surround the electrode 127, the thermal transfer elements 122, and the first substrate 121 to improve uniformity at the edge of the substrate. In other examples, the conductive focus ring 106 can include a correction ring portion (not shown) that can be used to modify the edge temperature of the first substrate 121. Alternatively, a non-conductive focus ring may be used.

Furthermore, the first GIGDSC plasma processing subsystem 105 can include one or more first process sensors 132 coupled to the first process chamber 110. Alternatively, the number and position of the first process sensors 132 may be different. In various embodiments, the first process sensors 132 can include one or more optical devices for monitoring the light emitted from the plasma in the first process chamber 110. For example, one or more Optical Emission Spectroscopy (OES) sensors may be used, and the OES data can be used as ignition data, operational data, or endpoint data.

The first process sensors 132 can include gas-sensing devices for monitoring and/or controlling input gasses, process gasses, and/or exhaust gasses. In addition, the first process sensors 132 can include pressure sensors, temperature sensors, current and/or voltage probes, power meters, spectrum analyzers, or an RF impedance analyzer, or any combination thereof Furthermore, the first process sensors 132 can include sensors pertaining to the helium backside gas pressure, the helium backside flow, electrostatic clamping (ESC) voltage, ESC current, substrate holder temperature (or lower electrode (LEL) temperature), coolant temperature, DC conductive bias electrode temperature, forward RF power, reflected RF power, electrode DC bias, RF peak-to-peak voltage, chamber wall temperature, process gas flow rates, process gas partial pressures, matching network settings, a focus ring thickness, RF hours, focus ring RF hours, and any statistic thereof.

In addition, the first GIGDSC plasma processing subsystem 105 can include a first plasma source 115 that is coupled to the first process chamber 110, and is configured to form first plasma in the plasma generation space 125a, to form second plasma in the plasma processing space 125b, or any combination thereof. The first plasma source 115 can include a plasma-facing surface 116 having a plurality of recesses 117 therein. The first plasma source 115 can include a surface wave plasma (SWP) source that can include a radial line slotted antenna (RLSA) as shown herein. In alternate embodiments, an ICP plasma source, a CCP plasma source, or any other plasma sources may be used.

In some embodiments, the first GIGDSC plasma processing subsystem 105 can include one or more first gas supply elements 135 that can be coupled to the first gas supply system 130 using at least one first gas supply lines 131. Alternatively, the first gas supply system 130, the first gas supply lines 131, and/or the first gas supply element 135 may be configured differently. The first gas supply element 135 can be coupled to the first process chamber 110 and can be configured as a ring structure to introduce a first process gas into the first process chamber 110 in a first direction 136, and/or in a second direction 137, and/or in a third direction 138, or in any combination thereof. In addition, the first gas supply element 135 can be configured to introduce the first process gas to the plasma generation space 125a and/or to the plasma processing space 125b.

In other embodiments, the first GIGDSC plasma processing subsystem 105 can include one or more second gas supply elements 145 that can be coupled to the second gas supply system 140 using at least one second gas supply lines 141. Alternatively, the second gas supply system 140, the second gas supply lines 141, and/or the second gas supply element 145 may be configured differently. The second gas supply element 145 can be coupled to the first process chamber 110 and can be configured as a ring structure to introduce a second process gas into the first process chamber 110 in a first direction 146, and/or in a second direction 147 and/or in a third direction 148, or in any combination thereof. In addition, the second gas supply element 145 can be configured to introduce the second process gas to plasma generation space 125a and/or to the plasma processing space 125b.

In additional embodiments, the first GIGDSC plasma processing subsystem 105 can include one or more third gas supply elements 155 that can be coupled to the third gas supply system 150 using at least one third gas supply lines 151. Alternatively, the third gas supply system 150, the third gas supply lines 151, and/or the third gas supply element 155 may be configured differently. The third gas supply element 155 can be coupled to the first process chamber 110 and can be configured to introduce a third process gas into the first process chamber 110 in a first direction 156, in a second direction 157, or in a third direction 158, or in any combination thereof. In addition, the third gas supply element 155 can be configured to introduce the third process gas to plasma generation space 125a and/or to the plasma processing space 125b.

In still additional embodiments, the first GIGDSC plasma processing subsystem 105 can include one or more fourth gas supply elements 165 that can be coupled to the fourth gas supply system 160 using at least one fourth gas supply lines 161. Alternatively, the fourth gas supply system 160, the fourth gas supply lines 161, and/or the fourth gas supply element 155 may be configured differently. The fourth gas supply element 165 can be coupled to the bottom of the first process chamber 110 and can be configured to introduce a fourth process gas into the first process chamber 110 in a first direction 166, or in any other direction. In addition, the fourth gas supply element 165 can be configured to introduce the fourth process gas to plasma generation space 125a, to the plasma processing space 125b, or to any combination thereof.

During dry plasma etching, the first and/or the second process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CH_3F$, $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or SF6 or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma-enhanced deposition, the process gas may comprise a film forming precursor, a reduction gas, or an inert gas, or a combination of two or more thereof.

In addition, the first pressure control system 181 can be used to couple the first pumping system 180 to the first process chamber 110, and can be configured to evacuate the first process chamber 110, as well as control the pressure within the first process chamber 110. Furthermore, the first control system 190 can be coupled to the first process chamber 110, the first substrate holder 120, and the first plasma source 115. The first control system 190 can be configured to execute a GIGDSC-related process recipe for performing at least one of an etch process and a deposition process in the GIGDSC plasma processing system 100 using one or more GIGDSC-related procedures or models.

Referring still to FIG. 1, the first GIGDSC plasma processing system 100 may be configured to process 200 mm substrates, 300 mm substrates, or larger-sized substrates. In fact, it is contemplated that the GIGDSC plasma processing system may be configured to process substrates, wafers, solar panels, video screens, or LCDs regardless of their size, as would be appreciated by those skilled in the art. Therefore, while aspects of the invention will be described in connection with the processing of a semiconductor substrate, the invention is not limited solely thereto.

As described above, the first process chamber 110 can be configured to facilitate the generation and stabilization of plasma in the plasma/processing spaces (125a and 125b) and to generate a stable process chemistry plasma in plasma processing space 125b adjacent a surface of the first substrate 121. For example, in an etch process, the process gas can include molecular constituents that when dissociated are reactive with the material being etched on the substrate surface. For example, when one or more plasmas are formed in one or more of the plasma/processing spaces (125a and/or 125b) heated electrons can collide with molecules in the plasma-forming gases causing dissociation and the formation of reactive radicals for performing an etch process.

While FIG. 1 shows the first gas supply element 135 at a first position in the upper portion of the first process chamber 110 and within the plasma generation space 125a, the invention is not limited to this configuration. In other configurations, the first gas supply element 135 may be positioned below the plasma generation space 125a. For example, the first gas supply element 135 can be located within 200 mm from the plasma-facing (outer) surface 116 of the first plasma source 115 and, desirably, the first gas supply element 135 can be positioned within a range of approximately 10 mm to approximately 150 mm from the plasma-facing (outer) surface 116 of the first plasma source 115.

While FIG. 1 shows the second gas supply element 145 at a second position in the lower portion of the first process chamber 110 within the plasma processing space 125*b*, the invention is not limited to this configuration. For example, the second gas supply element 145 can be located within 200 mm from the bottom of the first process chamber 110 and, desirably, the second gas supply element 145 can be positioned within a range of approximately 10 mm to approximately 150 mm from the bottom of the first process chamber 110.

When the first process chamber 110 is configured to use the GIGDS-related procedures or techniques, separate plasma generation spaces 125*a* and plasma processing spaces 125*b*, such as that shown in the first GIGDSC plasma processing system 100 of FIG. 1 can provide improved process control and improved stability control over conventional plasma processing systems. In some examples, one or more gas mixtures can be provided by one or more of the gas supply elements (135, 145, 155, and 165), to control the formation of a dense plasma with a high population of high energy electrons in the plasma generation space 125*a*, while producing a less dense, lower temperature stable plasma in the plasma processing space 125*b*. When the gas mixture includes at least one light gas and at least one heavy-gas, the at least one light gas can separate from the at least one heavy-gas due to differences in their respective molecular weight or differences in gravity (i.e., ratio between the molecular weight of a gaseous constituent and a reference molecular weight). In other examples, separate injection schemes can also be used for the light-gas and the heavy-gas. The gas separation techniques, described herein, provide greater control over the process at both the plasma generation region and the substrate surface region by concentrating gases of different gravities at different regions. By using this approach, plasma generation (including stability, uniformity, etc.), gas chemistry, and plasma chemistry at the substrate surface can be controlled.

Additionally, the configuration of exemplary GIGDSC plasma processing system 100 shown in FIG. 1 can reduce damage to chamber components such as the first substrate holder 120, by preventing high energy plasma species from passing through the plasma processing space (125*b*). Still referring to FIG. 1, the plasma generation space 125*a* can be defined as a "light-gas" region that can include a high concentration of one or more "light-gases"; one portion of the second process space can be defined as a "mixed-gas" region that can include a combination of one or more "light-gases" and one or more "heavy-gases"; and a second portion of the second process space can be defined as a "heavy-gas" region that can include a high concentration of one or more "heavy-gases".

In some examples, when a pure $O_2$ or $Ar/O_2$ mixture is used to create plasma in a SWP source, stability control can present a problem. When stability control becomes a problem, one or more "light-gases" such as $H_2$, He, or Ne gases can be added into the pure $O_2$ or $Ar/O_2$ mixture in the plasma in the SWP source if the plasma generation region is on the top. The "light-gas" can be injected into the first process chamber 110 from the side, from the bottom, or from the top of first process chamber 110 using one or more of the gas supply elements (135, 145, 155, and 165). Alternatively, one or more of the gas supply elements (135, 145, 155, and 165) may not be required. The light-gases and heavy-gases can be injected separately or can be injected as a mixture, and the light-gases can quickly separate from other heavy-gas and be concentrated near the top of plasma generation region (e.g., the plasma generation space 125*a*). Therefore, plasma generation would be mainly sustained by the light-gases in the plasma generation space 125*a* which would only have positive discharge and would be more stable than plasma generated by the mixture of electropositive and electronegative gases. At very low pressure, the separation between light-gas and heavy-gases may not be very apparent due to increased inter-diffusion. In this case, light-gases would still be highly concentrated near the top plasma generation region due to the gravity difference, and the light-gases would co-exist with the process gases of a reduced/diluted concentration. Depending on the balance situation between the electron attachment and the electron detachment, an easily ionized light-gas, such as $H_2$, or a "not easily ionized" light-gas, such as He or Ne, may be added to balance the electron attachment and electron detachment processes that can be originally broken by just using common process gases such as $Ar/O_2$ mixture as an example. At the substrate/wafer level, process gas ionization can be initiated at least partly by the plasma electrons generated at the top plasma. In such way, a two-zone plasma can be formed. The top electropositive plasma zone (plasma generation space 125*a*) can control the stability, and the bottom electronegative plasma zone (plasma processing space 125*b*) can control the wafer process (process chemistry). It is well known that $H_2$, He, and Ne have different ionization potentials that can be advantageously used during processing. Depending on process conditions and the process purposes, easily discharged $H_2$ or relatively difficult discharged He or Ne can be used and mixed during the process to stabilize the plasma and enable a wider process operating condition window. The flow rate ratio or partial pressure of light-gases to heavy-gases can be adjusted depending on process. When an $Ar/O_2$ mixture is used by itself, for example the $Ar/O_2$ mixture can cause a stability problem. Because Ar and $O_2$ have similar molecular weights, they would be mixed evenly in the first process chamber 110, as an example. In this case, there can be a high population electronegative gas near plasma generation region, and this can cause a stability problem. In addition, after plasma is generated, additional $O_2$ molecules can be dissociated into O atoms or radicals that would be lighter than Ar atoms, and the O atoms would diffuse up more easily to the plasma generation region and may cause a more serious stability problem.

In other examples, when a pure $O_2$ or $Ar/O_2$ mixture is used to create plasma in a SWP source, EM radiation may be a problem that may depend on the discharge conditions. When EM radiation becomes a problem, one or more "light-gases" such as $H_2$, He, or Ne gases can be added into the pure $O_2$ or $Ar/O_2$ mixture in the plasma in the SWP source if the plasma generation region (e.g., the plasma generation space 125*a*) is on the top. The "light gas" can be injected into the first process chamber 110 from the side, from the bottom, or from the top of first process chamber 110 using one or more of the gas supply elements (135, 145, 155, and 165). Alternatively, one or more of the gas supply elements (135, 145, 155, and 165) may not be required. These light-gases would be quickly separated from heavy-gases and be concentrated near the top of plasma generation region (e.g., the plasma generation space 125*a*). Therefore, plasma generation would be mainly sustained by the light-gases in the plasma generation space 125*a* which would only have positive discharge and would be more stable than plasma generated by the mixture of electropositive and electronegative gases. Because the plasma generation region (plasma generation space 125*a*) contains mainly positive discharged light-gases, such as He, $H_2$, Ne, the electron density near that region is much higher than the electron density established using only the $O_2$ or $Ar/O_2$ mixture as an example. As a result, EM radiation can be more easily blocked by plasma electrons near that region (plasma generation space 125a) giving a cleaner process space (plasma processing space 125b) for the substrate/wafer area. Experimental results attached to verify this procedure.

In still other examples, when a pure $O_2$ or $Ar/O_2$ mixture is used to create plasma in a SWP source, the size of the process window can present a problem. When the size of the process window becomes a problem, one or more "light-gases" such as $H_2$, He, or Ne gases can be added into the pure $O_2$ or $Ar/O_2$ mixture in the plasma in the SWP source if the plasma generation region (e.g., the plasma generation space 125a) is on the top. The "light gas" can be injected into the first process chamber 110 from the side, from the bottom, or from the top of first process chamber 110 using one or more of the gas supply elements (135, 145, and 155). Alternatively, one or more of the gas supply elements (135, 145, and 155) may not be required. These light-gases would be quickly separated from heavy-gases and be concentrated near the top of plasma generation region (e.g., the plasma generation space 125a). For example, when the "light-gases" are used to stabilize the plasma, more process conditions such as power and pressure can be used. In addition, by blocking EM radiation using the high electron density established in the local plasma created near the plasma generation region using the "light-gases", the under-dense plasma problem can be eliminated or reduced. Without EM blocking by light-gases, certain under-dense plasma conditions such as low power high pressure can put limits for the process window. However, with the blocking of EM radiation, such under-dense plasma conditions can be used without concern of EM radiation. In this manner, the power efficient can be increased for the SWP source.

In additional examples, when a pure $O_2$ or $Ar/O_2$ mixture is used to create plasma in a SWP source, the amount of contamination and/or erosion to the top dielectric plate and/or chamber wall can present a problem. When the amount of contamination and/or erosion to the top dielectric plate and/or chamber wall becomes a problem, one or more "light-gases" such as $H_2$, He, or Ne gases can be added into the pure $O_2$ or $Ar/O_2$ mixture in the plasma in the SWP source if the plasma generation region (e.g., the plasma generation space 125a) is on the top. The "light gas" can be injected into the first process chamber 110 from the side, from the bottom, or from the top of first process chamber 110 using one or more of the gas supply elements (135, 145, 155, and 165). Alternatively, one or more of the gas supply elements (135, 145, 155, and 165) may not be required. These light-gases would be quickly separated from heavy-gases and be concentrated near the top of plasma generation region (e.g., the plasma generation space 125a). For example, when the "light-gases" are concentrated near the top, both the chemical erosion and the physical sputtering to the dielectric plate would be dramatically reduced. The GIGDSC techniques can increase the lifetime of the dielectric plate, can reduce the contamination to the dielectric plate that will reduce the dielectric plate cleaning burden, and can reduce particle density in the plasma volume and on the substrate/wafer.

In some additional examples, when a pure $O_2$ or $Ar/O_2$ mixture is used to create plasma in a SWP source, the plasma uniformity can present a problem. When the plasma uniformity becomes a problem, one or more "light-gases" such as $H_2$, He, or Ne gases can be added into the pure $O_2$ or $Ar/O_2$ mixture in the plasma in the SWP source if the plasma generation region (e.g., the plasma generation space 125a) is on the top. The "light gas" can be injected into the first process chamber 110 from the side, from the bottom, or from the top of first process chamber 110 using one or more of the gas supply elements (135, 145, 155, and 165). Alternatively, one or more of the gas supply elements (135, 145, 155, and 165) may not be required. These light-gases would be quickly separated from heavy gases and be concentrated near the top of plasma generation region (e.g., the plasma generation space 125a). For example, when the "light-gases" are used in the plasma, the plasma uniformity can be improved because the substantially pure electropositive discharge gas can be concentrated near plasma generation space 125a in process chamber 110. This can simplify the dielectric plate design because the design and machining of the recesses (cavities) can become simpler. A simpler pattern of recesses (cavities) can be used to obtain a more uniform plasma because the problems associated with the electronegative gases can be reduced.

In some plasma uniformity control examples, one or more of the gas supply elements (135, 145, 155, and 165) can be used to pulse one or more of the "light-gases" to control the plasma uniformity. For example, "light-gases", such as He, can be injected at a first frequency that can vary from about 1 Hz to about 100 Hz, and the first frequency can be based on the gas diffusion rate for the given pressure, and a variable duty cycle (on/off) can be used to control the ionization and the plasma uniformity near the dielectric plate.

In some additional plasma uniformity control examples, one or more of the gas supply elements (135, 145, 155, and 165) can be configured at the top of the process chamber 110 and can be used to inject and/or pulse at least one of the "light-gases", such as He, to the outer region close to the bottom portion of the first plasma source 115, and this can be proximate to dielectric plate in the first plasma source 115. In this manner, the plasma uniformity can be controlled from the edge to the center.

In some other examples, one or more of the gas supply elements (135, 145, 155, and 165) can be configured at the top and/or the bottom of the process chamber 110, and one or more of the gas supply elements (135, 145, 155, and 165) can be used to pulse two or more "light-gases", such as He and $H_2$. For example, the duty cycle can be for the two different gases when one of the gasses has low ionization energy, such as $H_2$ at 13.6 eV, and the other gas has high ionization energy, such as He, at 24.6 eV. In addition, the injection can be maintained at a constant flow, but different duty cycles can be used for the different gases. The duration of each gas pulse can be calculated based on the gas diffusion rate at the given chamber pressure. For example, gas supply elements (135, 145, 155, and/or 165) can have different pulse rates, different flow rates, or different directions, or any combination thereof.

In still other examples for plasma uniformity control, two or more "light-gases", such as He and $H_2$ can be pulsed to control the plasma density at the top of the first process chamber 110. For example, gas supply elements (135, 145, and/or 155) can have different pulse rates, different flow rates, or different directions, or any combination thereof.

In some contamination examples, the first gas supply element 135 can be configured in the process chamber 110 and the first gas supply element 135 can be used to inject and/or pulse one or more low ionization energy light-gases, such as He and $H_2$, in a first (downward) direction 136 to create a protective wall of plasma near the outer regions of the first process chamber 110. For example, the protective wall of low ionization energy light-gas plasma can be used to reduce the amount of deposited contamination on the walls of the first process chamber 110 and reduce the cleaning time required to remove the contamination from the walls.

In some uniformity examples, the first gas supply element 135 and the second gas supply element 145 can be configured within the first process chamber 110 and the gas supply elements (135 and 145) can be used to pulse two or more "light-gases", such as He and $H_2$, to create a wall of highly ionized plasma near the outer regions of the first process chamber 110. For example, the gas supply elements (135 and/or 145) can be configured to introduce one or more of the "light-gases" in a first direction (136 and/or 146), and/or a second direction (137 and/or 147) to create the wall of highly ionized plasma to balance the plasma density in the center region outer region proximate the first substrate holder 120 for certain types of plasma chambers.

In another example, when the second process chamber 110 is configured to use the GIGDSC techniques, the electropositive discharged light gas will be concentrated near the plasma generation region (e.g., the plasma generation space 125a), and the heavy electronegative discharged gas would be more concentrated below the plasma generation region. Because electrons in the region where electronegative discharged gas is concentrated is much lower, more negative ions and more dissociated radicals can be produced than common plasma generation method.

In some alternate plasma control examples, the plasma source may include a capacitively-coupled plasma source or an inductively-coupled plasma source, or any other type plasma sources such as microwave ECR plasma source. The basic concept uses gravity-induced gas-diffusion separation techniques to control plasma generation, which are also applicable to these plasma sources. Plasma stability, plasma uniformity, plasma density, process window, contamination and erosion, EM radiation, gas plasma chemistry, and wafer plasma chemistry can be controlled using the methods and techniques described herein.

Figure 2:
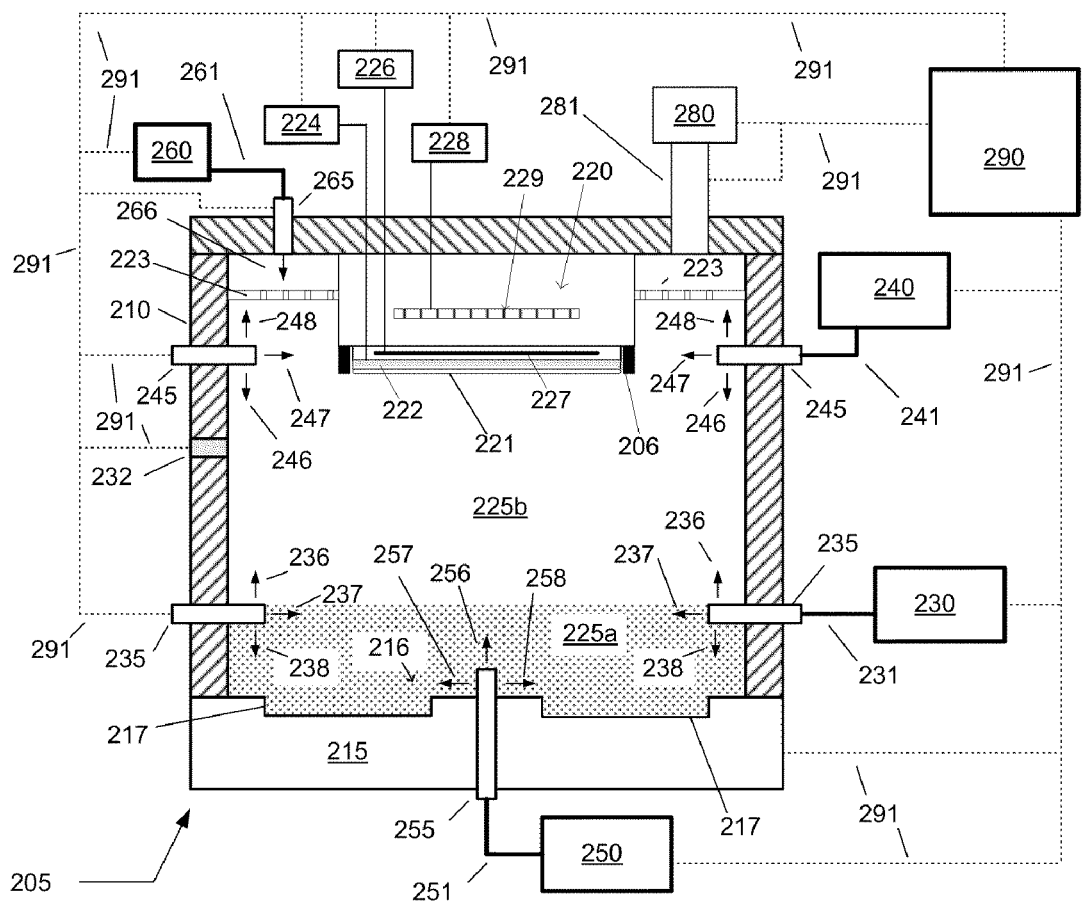
FIG. 2 illustrates a simplified schematic representation of another GIGDSC plasma processing system in accordance with embodiments of the invention.

FIG. 2 illustrates a simplified schematic representation of a second Gravity-Induced Gas-Diffusion (GIGDSC) plasma processing system in accordance with embodiments of the invention. The second GIGDSC plasma processing system 200 can comprise a dry plasma etching system or a plasma enhanced deposition system or any plasma processing systems. The second GIGDSC plasma system 200 can include a second GIGDSC plasma processing subsystem 205, a first gas supply system 230 coupled to the GIGDSC plasma processing subsystem 205, a second gas supply system 240 coupled to the second GIGDSC plasma processing subsystem 205, a third gas supply system 250 coupled to the second GIGDSC plasma processing subsystem 205, a fourth gas supply system 260 coupled to the second GIGDSC plasma processing subsystem 205, a second pumping system 280 coupled the second GIGDSC plasma processing subsystem 205, and a second controller 290 coupled to the second GIGDSC plasma processing subsystem 205, coupled to the first gas supply system 230, coupled to the second gas supply system 240, coupled to the third gas supply system 250, coupled to the fourth gas supply system 260, coupled to the second pumping system 280, and coupled to a second pressure control system 281. For example, second control bus 291 can be used to couple the second controller 290 to the required elements in the second GIGDSC plasma processing system 200 as shown in FIG. 2.

The second GIGDSC plasma processing subsystem 205 can include a second process chamber 210 configured to define a plurality of plasma/processing spaces (225a and 225b). The second process chamber 210 can include a second substrate holder 220 configured to support a second substrate 221. The second substrate 221 can be exposed to plasma or process chemistry in the plasma processing space 225b when the second process chamber 210 includes a plurality of plasma/processing spaces (225a and 225b). In addition, the second GIGDSC plasma processing subsystem 205 can include a second plasma source 215 that is coupled to the second process chamber 210, and is configured to form stabilization plasma in the plasma generation space 225a and/or form process plasma in the plasma processing space 225b. The second plasma source 215 can include a plasma-facing surface 216 having a plurality of recesses 217 therein. The second plasma source 225 can include a surface wave plasma (SWP) source that can include a radial line slotted antenna (RLSA), to be discussed below. In alternate embodiments, an ICP plasma source, a CCP plasma source, or any other plasma sources may be used.

In some embodiments, the second substrate holder 220 can be coupled to ground. Alternatively, the second substrate holder 220 can be isolated from ground. For example, when the second substrate 220 can be clamped to substrate holder 220, a ceramic electrostatic clamp (ESC) layer may insulate the second substrate 221 from the grounded substrate holder 220.

The second GIGDSC plasma processing subsystem 205 can include a substrate temperature control system 228 coupled to the temperature control elements 229 in the second substrate holder 220 and configured to adjust and control the temperature of second substrate 221. Alternatively, the second plasma processing subsystem 205 can include temperature control elements (not shown) in one or more of the walls of the second process chamber 210 and/or any other component within the second plasma processing subsystem 205.

In order to improve the thermal transfer between the second substrate 221 and second substrate holder 220, the second substrate holder 220 can include one or more thermal transfer elements 222 that can be coupled to a thermal control system 224. For example, the thermal transfer elements 222 can include an electrostatic clamping (ESC) electrode (not shown) that can be coupled to a clamping supply in the thermal control system 224 and that can be used to affix the second substrate 221 to an upper surface of second substrate holder 220. In some embodiments, one or more of the thermal transfer elements 222 can be used to isolate the second substrate 221 from the second substrate holder 220 when it is grounded. In addition, the thermal transfer elements 222 can include can further include backside gas elements (not shown) that can be coupled to a backside gas delivery system in the thermal control system 224. One or more of the thermal transfer elements 222 can be configured to introduce gas to the backside of the second substrate 221 in order to improve the gas-gap thermal conductance between the second substrate 221 and second substrate holder 220, and temperature control of the second substrate 221 is required at elevated or reduced temperatures. For example, the thermal transfer elements 222 can include two-zone (center/edge) backside gas elements, and the helium gas gap pressure can be independently varied between the center and the edge of the second substrate 221.

In some embodiments, the second substrate holder 220 can comprise an electrode 227 through which RF power is coupled to the processing plasma in plasma processing space 225b. For example, second substrate holder 220 can be electrically biased at a RF voltage via the transmission of RF power from a RF generator 226 to the electrode 227 in the second substrate holder 220. When the RF bias is used, the RF bias can serve to heat electrons to form and maintain the processing plasma in plasma processing space 225b. The operating frequency for the RF generator 226 can range from about 0.1 MHz to about 100 MHz. RF systems for plasma processing are well known to those skilled in the art. Alternatively, RF power may be applied to the substrate holder electrode at multiple frequencies or may not be required. In other embodiments, DC power can be provided to the electrode 227.

In addition, the second substrate holder 220 may be surrounded by a second baffle member 223 that extends beyond a peripheral edge of the second substrate holder 220. The baffle member 223 may serve to homogeneously distribute the pumping speed delivered by the pressure control system 281 to the interior of the second process chamber 210. The baffle member 223 may be fabricated from a dielectric material, such as quartz, or alumina. The baffle member 223 may provide a high RF impedance to ground for the plasma in the interior of the second process chamber 210.

In some embodiments, a second conductive focus ring 206 can be used, and the second conductive focus ring 206 can include a silicon-containing material and can be disposed on the top of the second substrate holder 220. In some examples, second conductive focus ring 206 can be configured to surround the electrode 227, the thermal transfer elements 222, and the second substrate 221 to improve uniformity at the edge of the substrate. In other examples, the conductive focus ring 206 can include a correction ring portion (not shown) that can be used to modify the edge temperature of the second substrate 221. Alternatively, a non-conductive focus ring may be used.

Furthermore, the second GIGDSC plasma processing subsystem 205 can include one or more second process sensors 232 coupled to the second process chamber 210. Alternatively, the number and position of the second process sensors 232 may be different. In various embodiments, the second process sensors 232 can include one or more optical devices for monitoring the light emitted from the plasma in the second process chamber 210. For example, one or more Optical Emission Spectroscopy (OES) sensors may be used, and the OES data can be used as ignition data, operational data, or endpoint data.

The second process sensors 232 can include gas sensing devices for monitoring and/or controlling input gasses, process gasses, and/or exhaust gasses. In addition, the second process sensors 232 can include pressure sensors, temperature sensors, current and/or voltage probes, power meters, spectrum analyzers, or an RF Impedance analyzer, or any combination thereof Furthermore, the second process sensors 232 can include sensors pertaining to the Helium backside gas pressure, the Helium backside flow, electrostatic clamping (ESC) voltage, ESC current, substrate holder temperature (or lower electrode (LEL) temperature), coolant temperature, DC conductive bias electrode temperature, forward RF power, reflected RF power, electrode DC bias, RF peak-to-peak voltage, chamber wall temperature, process gas flow rates, process gas partial pressures, matching network settings, a focus ring thickness, RF hours, focus ring RF hours, and any statistic thereof In addition, the second GIGDSC plasma processing subsystem 205 can include a second plasma source 215 that is coupled to the second process chamber 210, and is configured to form a stabilization plasma in the plasma generation space 225a and/or to form a process plasma in the plasma processing space 225b. The second plasma source 225 can include a surface wave plasma (SWP) source that can include a radial line slotted antenna (RLSA), as shown and described herein. Alternatively, the second plasma source 225 may include other plasma sources such as RF CCP, ICP, microwave ECR, etc.

In some embodiments, the second GIGDSC plasma processing subsystem 205 can include one or more first gas supply elements 235 that can be coupled to the first gas supply system 230 using at least one first gas supply lines 231. Alternatively, the first gas supply system 230, the first gas supply lines 231, and/or the first gas supply element 235 may be configured differently. The first gas supply element 235 can be coupled to the second process chamber 210 and can be configured to introduce a first process gas into the second process chamber 210 in a first direction 236, and/or in a second direction 237 and/or in a third direction 238, or in any combination thereof In addition, the first gas supply element 235 can be configured to introduce the first process gas to the plasma generation space 225a and/or to the plasma processing space 225b.

In other embodiments, the second GIGDSC plasma processing subsystem 205 can include one or more second gas supply elements 245 that can be coupled to the second gas supply system 240 using at least one second gas supply lines 241. Alternatively, the second gas supply system 240, the second gas supply lines 241, and/or the second gas supply element 245 may be configured differently. The second gas supply element 245 can be coupled to the second process chamber 210 and can be configured to introduce a second process gas into the second process chamber 210 in a first direction 246, and/or in a second direction 247 and/or in a third direction 248, or in any combination thereof In addition, the second gas supply element 245 can be configured to introduce the second process gas to plasma generation space 225a and/or to the plasma processing space 225b.

In additional embodiments, the second GIGDSC plasma processing subsystem 205 can include one or more third gas supply elements 255 that can be coupled to the third gas supply system 250 using at least one third gas supply lines 251. Alternatively, the third gas supply system 250, the third gas supply lines 251, and/or the third gas supply element 255 may be configured differently. The third gas supply element 255 can be coupled to the second process chamber 210 and can be configured to introduce a third process gas into the second process chamber 210 in a first direction 256, in a second direction 257, or in a third direction 258, or in any combination thereof In addition, the third gas supply element 255 can be configured to introduce the third process gas to the plasma generation space 225a and/or to the plasma processing space 225b.

In still additional embodiments, the second GIGDSC plasma processing subsystem 205 can include one or more fourth gas supply elements 265 that can be coupled to the fourth gas supply system 260 using at least one fourth gas supply lines 261. Alternatively, the fourth gas supply system 260, the fourth gas supply lines 261, and/or the fourth gas supply element 255 may be configured differently. The fourth gas supply element 265 can be coupled to the top of the second process chamber 210 and can be configured to introduce a fourth process gas into the second process chamber 210 in a first direction 266, or in any other direction. In addition, the fourth gas supply element 265 can be configured to introduce the fourth process gas to the plasma generation space 225a and/or to the plasma processing space 225b.

During plasma etching, the first and/or the second process gas may comprise an etchant, a passivant, or an inert gas, or a combination of two or more thereof For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CH_3F$, $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof During plasma enhanced deposition, the process gas may comprise a film forming precursor, a reduction gas, or an inert gas, or a combination of two or more thereof.

In addition, the second pressure control system 281 can be used to couple the second pumping system 280 to the second process chamber 210, and can be configured to evacuate the second process chamber 210, as well as control the pressure within the second process chamber 210. Furthermore, the second control system 290 can be coupled to the second process chamber 210, the second substrate holder 220, and the second plasma source 225. The second control system 290 can be configured to execute a process recipe for performing at least one of an etch process and a deposition process in the GIGDSC plasma processing system 200.

Referring still to FIG. 2, the second GIGDSC plasma processing system 200 may be configured to process 200 mm substrates, 300 mm substrates, or larger-sized substrates. In fact, it is contemplated that the GIGDSC plasma processing system may be configured to process substrates, wafers, solar panels, video screens, or LCDs regardless of their size, as would be appreciated by those skilled in the art. Therefore, while aspects of the invention will be described in connection with the processing of a semiconductor substrate, the invention is not limited solely thereto.

As described above, the second process chamber 210 can be configured to facilitate the generation of stabilization plasma in a plasma generation space 225a and to generate process chemistry plasma in the plasma processing space 225b adjacent a surface of the second substrate 221. For example, in an etch process, the process gas can include molecular constituents that when dissociated are reactive with the material being etched on the substrate surface. For example, when one or more plasmas are formed in one or more of the plasma/processing spaces (225a and/or 225b) heated electrons can collide with molecules in the plasma-forming gases causing dissociation and the formation of reactive radicals for performing an etch process.

While FIG. 2 shows the first gas supply element 235 at a first position in the lower portion of the second process chamber 210, the invention is not limited to this configuration. For example, the first gas supply element 235 can be located within 200 mm from the plasma-facing (outer) surface 216 of the second plasma source 215 and, desirably, the first gas supply element 235 can be positioned within a range of approximately 10 mm to approximately 150 mm from the plasma-facing (outer) surface 216 of the second plasma source 215.

While FIG. 2 shows the second gas supply element 245 at a second position in the upper portion of the second process chamber 210 within the plasma processing space 225b, the invention is not limited to this configuration. For example, the second gas supply element 245 can be located within 200 mm from the upper surface of the second substrate 220 and, desirably, the second gas supply element 245 can be positioned within a range of approximately 10 mm to approximately 150 mm from the upper surface of the second substrate 221.

When the second process chamber 210 is configured to perform the GIGDS-related procedures or techniques, separate plasma generation spaces 225a and plasma processing spaces 225b such as that shown in the second exemplary plasma processing system 200 of FIG. 2 can provide improved process control and improved stability control over conventional plasma processing systems. In some examples, one or more gas mixtures can be provided by one or more of the gas supply elements (235, 245, 255, and 265) to control the formation of a dense plasma with a high population of high energy electrons in the plasma generation space 225a, while producing a less dense, lower temperature plasma in the plasma processing space 225b. When the gas mixture includes at least one light-gas and at least one heavy-gas, the at least one light-gas will separate from the at least one heavy-gas due to the molecular weight or gravity differences. In other examples, separate injection schemes can also be used for light gas and the heavy-gas. The gas separation techniques, described herein, provide greater control over the process at both plasma generation region and the substrate surface region by concentrating gases of different gravities at different regions. By using this approach, plasma generation (including stability, uniformity, etc.), gas chemistry, and plasma chemistry at substrate surface can be controlled.

Additionally, the second exemplary GIGDSC plasma processing system 200 shown in FIG. 2 can reduce damage to chamber components such as the second substrate holder 220, by preventing high energy plasma species from passing through the plasma processing space (225b) when GIGDSC-related procedures are performed.

Still referring to FIG. 2, the plasma generation space 225a can be defined as a "heavy-gas" region that can include a high concentration of one or more "heavy-gases"; a first portion of the plasma process space 225b can be defined as a "mixed-gas" region that can include a combination of one or more "heavy-gases" and one or more "light-gases"; and a second portion of the plasma process space 225b can be defined as a "light-gas" region that can include a high concentration of one or more "light-gases".

When the second GIGDSC plasma processing system 200 is used, additional gravity-dependent procedures can be performed. When the plasma generation space 225a is below the plasma process space 225b (wafer process region) as shown in the second process chamber 210, heavy-gases, such as Xe, which is heavier than other process gases can be used. The second GIGDSC plasma processing system 200 can be used to solve the same problems that were described above with respect to the first GIGDSC plasma processing system 100.

In the second GIGDSC plasma processing system 200, the substrate/wafer process chemistry can be controlled during certain processes. When the second plasma processing system 200 is used, the light-gas will chemically react with the dissociated process gases near the wafer level. For example, when $H_2$ is used with HBr, the dissociated Br atom can combine with the H atom to reform HBr near wafer level.

When the second GIGDSC plasma processing system 200 is configured to use the GIGDS techniques and is configured to use a "heavy-gas", such as Xe, a wider process window (pressure and power range) that is also larger than Ar process window can be obtained by flowing the "heavy-gas" at the bottom portion of the second process chamber 210 near the outer surface of the second plasma source 225. For example, the process window difference can be because Xe has a lower ionization energy and a wider gas breakdown window than Ar, and a stable plasma can be created and/or operated over a large process window with Xe.

In a CVD example, when the plasma source 225 is controlled during GIGDS-related procedures and the processing is performed with the substrate/wafer upside down as shown in FIG. 2, the Xe gas can flow to the bottom of the chamber and can create a very stable plasma operating over a large process window for a CVD process, and the second gas supply element 245 is used to inject the material gas just below the substrate.

The second plasma source 225 can be used to create plasma, and the second plasma source 225 can include surface wave plasma sources, microwave ECR plasma sources, RF CCP sources, or ICP sources, or any other kind of plasma source. The technique can be applied to any processes using plasma.

In process, these light-gases or heavy-gases can be introduced into process chamber before or after other process gas and before or after plasma is ignited.

In the gravity-induced gas-diffusion separation controlled plasma generation systems (100, 200), the light-gases are not restricted to $H_2$, He, and Ne and the heavy-gases are not restricted to Kr, Xe. They can be all kinds of gases that can be injected into the plasma process chamber with differences in gaseous gravity (i.e., differences in their relative molecular weight) to facilitate the gas separation. That is, light and heavy is relative and it is the gravity difference that causes the gas-diffusion separation.

The processing systems controlled by gravity-induced gas-diffusion separation that have been addressed in the above are only examples to address the novelty and method of the invention. That means, the potential process systems are not restricted to the systems addressed above. Moreover, gravity-induced gas-diffusion separation is also a method and technique that can be used for controlling any kind of plasma generations, plasma sources, and plasma processes. That also means it is more than a process system.

The plasma generation controlled by gravity-induced gas-diffusion separation that has been described in FIG. 2 is a general method and concept that can be applied to any kind of plasma generation methods and any kinds of plasma sources and any kinds of plasma process including those used for semiconductor process such as RF CCP, ICP, microwave RLSA plasma, surface wave plasma, microwave ECR plasma, etc, as some examples. In the following, several exemplary resonant plate or dielectric plate configurations that can be used in surface wave plasma, particularly in microwave RLSA plasma, will be addressed. However, the invention should cover any kinds of plasma sources, plasma generation methods, and plasma processes using the method and concept addressed above. In addition, the resonant plate or dielectric plate configuration is not restricted to the following examples.

Figure 3:
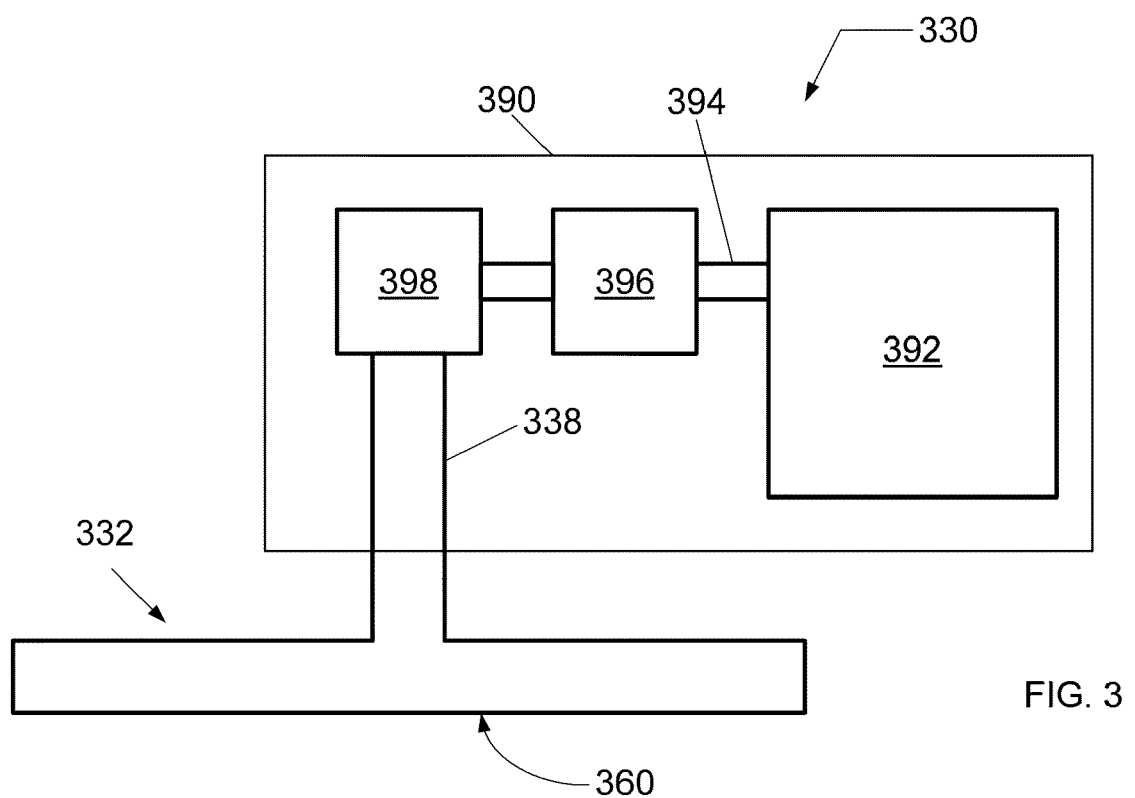
FIG. 3 illustrates a simplified schematic representation of a surface wave plasma (SWP) source that can be used in the GIGDSC plasma processing system in accordance with embodiments of the invention.

Referring now to FIG. 3, a schematic representation of a SWP source 330 is provided according to an embodiment. The SWP source 330 can comprise an electromagnetic (EM) wave launcher 332 configured to couple EM energy in a desired EM wave mode to a plasma by generating a surface wave on a plasma-facing surface 360 of the EM wave launcher 332 adjacent to the plasma. Furthermore, the SWP source 330 comprises a power coupling system 390 coupled to the EM wave launcher 332, and configured to provide the EM energy to the EM wave launcher 332 for forming the plasma.

The EM wave launcher 332 includes a microwave launcher configured to radiate microwave power into plasma generation space (125a, FIG. 1) or plasma generation space (225a, FIG. 2). The EM wave launcher 332 can be coupled to the power coupling system 390 via coaxial feed 338 through which microwave energy is transferred. Alternatively, a waveguide feed may be used. The power coupling system 390 can include a microwave source 392, such as a 2.45 GHz microwave power source. Microwave energy generated by the microwave source 392 can be guided through a waveguide 394 to an isolator 396 for absorbing microwave energy reflected back to the microwave source 392. Alternatively, a circulator may be used. For example, the microwave energy can be converted to a coaxial TEM (transverse electromagnetic) mode via a coaxial converter 398. Alternatively, a waveguide converter may be used. A tuner (not shown) may be employed for impedance matching, and improved power transfer. When the microwave energy is coupled to the EM wave launcher 332 via the coaxial feed 338, another mode change can occur from the TEM mode in the coaxial feed 338 to a TM (transverse magnetic) mode. Additional details regarding the design of the coaxial feed 338 and the EM wave launcher 332 can be found in U.S. Pat. No. 5,024,716, entitled "Plasma processing apparatus for etching, ashing, and film-formation"; the content of which is herein incorporated by reference in its entirety.

Figure 4:
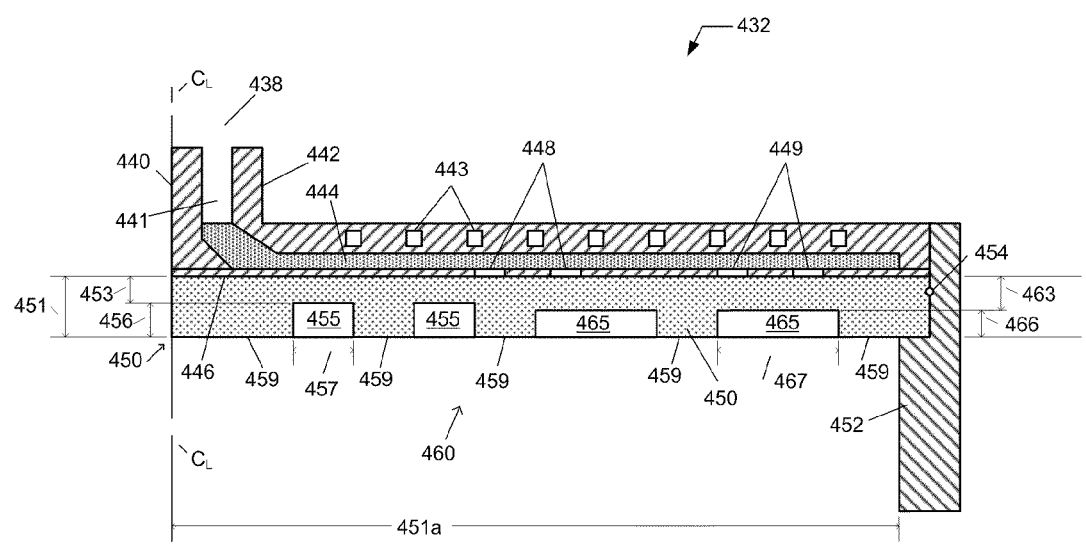
FIG. 4 illustrates a schematic cross-sectional view of an electromagnetic (EM) wave launcher in accordance with embodiments of the invention.

FIG. 4 illustrates a schematic cross-sectional view of EM wave launcher 432 in accordance with embodiments of the invention. The EM wave launcher 432 can comprise a coaxial feed 438 having an inner conductor 440, an outer conductor 442, and insulator 441, and a slotted antenna 446 having a plurality of slots (448 and 449) coupled between the inner conductor 440 and the outer conductor 442 as shown in FIG. 4. The plurality of slots (448 and 449) permits the coupling of EM energy from a first region above the slotted antenna 446 to a second region below the slotted antenna 446. The EM wave launcher 432 may further comprise a slow wave plate 444, and a resonator plate 450.

The number, geometry, size, and distribution of the slots (448 and 449) can contribute to the spatial uniformity and stability of the plasma formed in plasma generation space (125a, FIG. 1 and/or 225a, FIG. 2). Thus, the design of the slotted antenna 446 may be used to control the spatial uniformity and stability of the plasmas in the plasma/processing spaces (125a and/or 125b, FIG. 1) or in the plasma/processing spaces (225a and/or 225b, FIG. 2).

As shown in FIG. 4, the EM wave launcher 432 may comprise a fluid channel 443 that is configured to flow a temperature control fluid for temperature control of the EM wave launcher 432. Alternatively, the EM wave launcher 432 may further be configured to introduce a process gas through a plasma-facing surface 460 to the plasma.

Referring still to FIG. 4, the EM wave launcher 432 may be coupled to an upper chamber portion of a plasma processing system, wherein a vacuum seal can be formed between an upper chamber wall 452 and the EM wave launcher 432 using a sealing device 454. The sealing device 454 can include an elastomeric O-ring; however, other known sealing mechanisms may be used.

In general, the inner conductor 440 and the outer conductor 442 of the coaxial feed 438 can comprise a conductive material, such as a metal, while the slow wave plate 444 and the resonator plate 450 can comprise one or more dielectric materials. In some embodiments, the slow wave plate 444 and the resonator plate 450 can comprise the same material; however, different materials may be used. The material selected for fabrication of the slow wave plate 444 and the resonator plate 450 can be chosen to reduce the wavelength of the propagating electromagnetic (EM) wave relative to the corresponding free-space wavelength, and the dimensions of the slow wave plate 444 and the resonator plate 450 are chosen to ensure the formation of a standing wave effective for radiating EM energy into plasma generation space (125a, FIG. 1 and/or 225a, FIG. 2).

The slow wave plate 444 and the resonator plate 450 can be fabricated from silicon-containing materials such as quartz (silicon dioxide), or a high dielectric constant (high-k) materials. For example, the high-k material may possess a dielectric constant greater than a value of four. In particular, when the plasma processing system is utilized for etch process applications, quartz is often chosen for compatibility with the etch process.

For example, the high-k material can include intrinsic crystal silicon, alumina ceramic, aluminum nitride, and sapphire. However, other high-k materials may be used. Moreover, a particular high-k material may be selected in accordance with the parameters of a particular process. For example, when the resonator plate 450 is fabricated from intrinsic crystal silicon, the plasma frequency exceeds 2.45 GHz at a temperature of 45 degrees C. Therefore, intrinsic crystal silicon is appropriate for low temperature processes (i.e., less than 45 degrees C.). For higher temperature processes, the resonator plate 450 can be fabricated from alumina ($Al_2O_3$), or sapphire.

The inventors have observed that plasma uniformity and plasma stability remain as challenges for the practical implementation of a SWP source as described above. In the latter, the standing wave at the resonator plate-plasma interface, i.e., at the plasma-facing surface 460, may be prone to mode jumps as plasma parameters shift.

In various embodiments, the EM wave launcher 432 can be fabricated with a plurality of first recesses 455 configured in a first pattern formed in the plasma-facing surface 460 and a plurality of second recesses 465 configured in a second pattern formed in the plasma-facing surface 460.

Each of the first recesses 455 may comprise a unique indentation or dimple formed within the plasma-facing surface 460. For example, one or more of the first recesses 455 may comprise a cylindrical geometry, a spherical geometry, an aspherical geometry, a rectangular geometry, or any arbitrary shape. The first recesses 455 may include recesses characterized by a first size (e.g., latitudinal dimension (or width), and/or longitudinal dimension (or depth)).

Each of the second recesses 465 may also comprise a unique indentation or dimple formed within the plasma-facing surface 460. For example, one or more of the second recesses 465 may comprise a cylindrical geometry, a spherical geometry, an aspherical geometry, a rectangular geometry, or any arbitrary shape. The second recesses 465 may include recesses characterized by a second size (e.g., latitudinal dimension (or width), and/or longitudinal dimension (or depth)). The first size may or may not be the same as the second size. For instance, the second size may be smaller than the first size.

The number, geometry, size, and distribution of the recesses (455 and 465) can contribute to the spatial uniformity and stability of the plasma formed in plasma generation spaces (125a, FIG. 1 and/or 225a, FIG. 2). Thus, the design of the recesses (455 and 465) may be used to control the spatial uniformity and stability of the plasmas in the plasma/processing spaces (125a and/or 125b, FIG. 1) or in the plasma/processing spaces (225a and/or 225b, FIG. 2).

As shown in FIG. 4, the resonator plate 450 comprises a dielectric plate having a plate thickness 451 and a plate radius 451a. In addition, the plasma-facing surface 460 on resonator plate 450 can comprise a planar surface 459 within which the plurality of first recesses 455 and the plurality of second recesses 465 are formed. Alternatively, the resonator plate 450 may comprise an arbitrary geometry that may include concave, and/or convex surfaces.

The propagation of EM energy in the resonator plate 450 may be characterized by an effective wavelength ($\lambda$) for a given frequency of EM energy and dielectric constant for the resonator plate 450. The plate thickness may be an integer number of quarter wavelengths (n $\lambda/4$, where n is an integer greater than zero) or an integer number of half wavelengths (m $\lambda/2$, where m is an integer greater than zero). For instance, the plate thickness 451 may be about half the effective wavelength ($\lambda/2$) or greater than half the effective wavelength ($>\lambda/2$). Alternatively, the plate thickness 451 may range from about 25 mm (millimeters) to about 45 mm.

As an example, the first recesses 455 can comprise one or more cylindrical recesses, and each of the first recesses 455 can be characterized by a first depth 456 and a first diameter 457. As shown in FIG. 4, one or more of the second recesses 465 can be located near an inner region of the plasma-facing surface 460.

The first diameter 457 may be an integer number of quarter wavelengths (n$\lambda/4$, where n is an integer greater than zero) or an integer number of half wavelengths (m$\lambda/2$, where m is an integer greater than zero). Additionally, a first difference 453 between the plate thickness 451 and the first depth 456 may be an integer number of quarter wavelengths (n$\lambda/4$, where n is an integer greater than zero) or an integer number of half wavelengths (m$\lambda/2$, where m is an integer greater than zero). For instance, the first diameter 457 may be about half the effective wavelength ($\lambda/2$), and the first difference 453 between the plate thickness 451 and the first depth 456 may be about half the effective wavelength ($\lambda/2$) or about quarter the effective wavelength ($\lambda/4$). The plate thickness 451 may be about half the effective wavelength ($\lambda/2$) or greater than half the effective wavelength ($>\lambda/2$).

Alternatively, the first diameter 457 may range from about 25 mm to about 35 mm, and the first difference 453 between the plate thickness 451 and the first depth 456 may range from about 10 mm to about 35 mm. Alternatively yet, the first diameter 457 may range from about 30 mm to about 35 mm, and the first difference 453 may range from about 10 mm to about 20 mm.

In the first recesses 455, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 460. For example, the surface radius may range from about 1 mm to about 3 mm.

In addition, the second recesses 465 may comprise a second plurality of cylindrical recesses, each of the second plurality of cylindrical recesses being characterized by a second depth 466 and a second diameter 467. As shown in FIG. 4, one or more of the second recesses 465 can be located near an outer region of the plasma-facing surface 460.

The second diameter 467 may be an integer number of quarter wavelengths (n$\lambda/4$, where n is an integer greater than zero) or an integer number of half wavelengths (m$\lambda/2$, where m is an integer greater than zero). Additionally, a second difference 463 between the plate thickness 451 and the second depth 466 may be an integer number of quarter wavelengths (n$\lambda/4$, where n is an integer greater than zero) or an integer number of half wavelengths (m$\lambda/2$, where m is an integer greater than zero). For instance, the second diameter 467 may be about half the effective wavelength ($\lambda/2$) or quarter the effective wavelength ($\lambda/4$), and a second difference 463 between the plate thickness 451 and the second depth 466 may be about half the effective wavelength ($\lambda/2$) or about quarter the effective wavelength ($\lambda/4$).

Alternatively, the second diameter 467 may range from about 25 mm (millimeters) to about 35 mm, and the second difference 463 between the plate thickness and the second depth 466 may range from about 10 mm to about 35 mm. Alternatively yet, the second diameter 467 may range from about 30 mm to about 35 mm, and the second difference 463 may range from about 10 mm to about 20 mm.

In the second recesses 465, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 460. For example, the surface radius may range from about 1 mm to about 3 mm.

FIG. 5A illustrates a bottom view of an EM wave launcher in accordance with embodiments of the invention, and FIG. 5B illustrates a schematic cross-sectional view of a portion of the EM wave launcher depicted in FIG. 5A. FIG. 5A illustrates a bottom view of an exemplary EM wave launcher 532, and a plurality of slots (548 and 549) in the slotted antenna 546 are illustrated as if one can see through resonator plate 550 to the slotted antenna 546. As shown in FIG. 5A, the plurality of slots (548 and 549) can be arranged in pairs, and each of the pair of slots comprises a first slot oriented orthogonal to a second slot. However, the orientation of slots in the plurality of slots (548 and 549) can be arbitrary. For example, the orientation of slots in the plurality of slots (548 and 549) can be according to a pre-determined pattern for plasma uniformity and/or plasma stability.

On a planar surface 561 of resonator plate 550, first recesses 555 and second recesses 565 may be formed. In some embodiments, the first recesses 555 can be either aligned or partly aligned with the first slots 548 in the slotted antenna 546 or not aligned with the first slots 548 in the slotted antenna 546. For example, one or more of the first recesses 555 can be either aligned or partly aligned with a first slot 548 in the slotted antenna 546. In addition, one or more of the second recesses 565 can be aligned with one or more of second slots 549 in the slotted antenna 546.

The inventors have observed that when one or more of the first recesses 555 are not aligned with one or more of the first slots 548, the second recesses 565 can be used to control the plasma generation and plasma stability. For example, when optical monitoring is used, the plasma exhibits a relatively "full bright" glow across a range of power coupled to the EM wave launcher 532 and a range of pressure in the space where plasma is formed adjacent the plasma-facing surface 560. Further, the inventors have observed that the plurality of first recess 555 variably contribute to plasma generation and plasma stability, and exhibit a variation from a relatively "dim" glow to a "bright" glow depending on the power and/or pressure. The regions adjacent the planar surface 561 receive less power and remain relatively "dark" except at relatively high power.

Moreover, the inventors have observed that when one or more of the second recesses 565 are aligned with one or more of second slots 549 in the slotted antenna 546, stable plasma can be established at low power levels. Plasma is formed via ionization proximate these (larger) dimples, and flows from the second recesses 565 to the first recesses 555 (i.e., not aligned/partly aligned with the plurality of first slots 548). As a result, the plasma formed proximate these second recesses 565 is stable over a wide range of power and pressure, as the first recesses 555 receive an "overflow" of plasma from the second recesses 565 and compensate for fluctuations in the plasma generation proximate the second recesses 565.

For improved control of plasma uniformity, the inventors believe that the regions adjacent the planar surface 561 should remain relatively "dark" so that the risk for development of a mode-pattern is reduced. Therefore, as illustrated in FIG. 5A and FIG. 5B, the optimal placement of the first recesses 555 and the second recesses 565 may be such that a relatively large number of first recesses 555 are not aligned with the plurality of first slots 548 in slotted antenna 546, and a relatively large number of the second recesses 565 are aligned with the plurality of second slots 549. Although, the arrangement of recesses (555 and 565) may be chosen to achieve plasma uniformity, it may also be desirable to achieve a non-uniform plasma that cooperates with other process parameters to achieve a uniform process at a surface of a substrate being processed by the plasma.

Referring still to FIG. 5A and FIG. 5B, an exemplary EM wave launcher 532 is illustrated that can include a resonator plate 550 with plasma-facing surface 560. The EM wave launcher 532 further comprises a slotted antenna 546 having a plurality of first slots 548 and a plurality of second slots 549. The first slots 548 and the second slots 549 permit the coupling of EM energy from a first region above the slotted antenna 546 to a second region below the slotted antenna wherein the resonator plate 550 is located.

The number, geometry, size, and distribution of the first slots 548 and second slots 549 can be factors that can contribute to the spatial uniformity and stability of the plasma formed in plasma generation spaces (125a, FIG. 1 and/or 225a, FIG. 2). Thus, the design of the slotted antenna 546 may be used to control the spatial uniformity and stability of the plasmas in the plasma/processing spaces (125a and/or 125b, FIG. 1) or in the plasma/processing spaces (225a and/or 225b, FIG. 2).

In various embodiments, the first recesses 555 can comprise a unique indentation or dimple formed within the plasma-facing surface 560. For example, a first recess 555 can comprise a cylindrical geometry, a spherical geometry, an aspherical geometry, a rectangular geometry, or any arbitrary shape. The first recess 555 can be characterized by a first depth 556 and a first diameter 557.

In addition, each of the second recesses 565 can include a unique indentation or dimple formed within the plasma-facing surface 560. For example, a second recess 565 can comprise a cylindrical geometry, a spherical geometry, an aspherical geometry, a rectangular geometry, or any arbitrary shape. The second recess 565 can be characterized by a second depth 566 and a second diameter 567. The dimensions of the first recesses 555 may or may not be the same as the dimensions of the second recesses 565. For instance, the first recesses 555 can be smaller than the second recesses 565.

Still referring to FIG. 5A and FIG. 5B, the resonator plate 550 comprises a dielectric plate having a plate thickness 551 and a plate diameter 552. For example, the plasma-facing surface 560 on resonator plate 550 can comprise a planar surface 561 within which the first recesses 555 and the second recesses 565 can be formed. Alternatively, the resonator plate 550 may comprise an arbitrary geometry that can include concave, and/or convex surfaces.

The propagation of EM energy in the resonator plate 550 may be characterized by an effective wavelength ($\lambda$) for a given frequency of EM energy and dielectric constant for the resonator plate 550. The plate thickness 551 may be an integer number of quarter wavelengths ($n\lambda/4$, where n is an integer greater than zero) or an integer number of half wavelengths ($m\lambda/2$, where m is an integer greater than zero). For instance, the plate thickness 551 may be about a half wavelength thick ($\lambda/2$) or greater than about half the effective wavelength ($>\lambda/2$). Alternatively, the plate thickness 551 may range from about 25 mm (millimeters) to about 45 mm.

As an example, the first recesses 555 can be configured as cylindrical recesses, with first depths 556 and first diameters 557, and the first recesses can be located near an inner region of the plasma-facing surface 560.

The first diameter 567 may be an integer number of quarter wavelengths ($n\lambda/4$, where n is an integer greater than zero) or an integer number of half wavelengths ($m\lambda/2$, where m is an integer greater than zero). Additionally, a first difference 553 between the plate thickness 551 and the first depth 556 may be an integer number of quarter wavelengths ($n\lambda/4$, where n is an integer greater than zero) or an integer number of half wavelengths ($m\lambda/2$, where m is an integer greater than zero). For instance, the first diameter 557 may be about half the effective wavelength ($\lambda/2$), and a first difference 553 between the plate thickness 551 and the first depth 556 may be about half the effective wavelength ($\lambda/2$) or about quarter the effective wavelength ($\lambda/4$). The plate thickness 551 may be about half the effective wavelength ($\lambda/2$) or greater than half the effective wavelength ($>\lambda/2$).

Alternatively, the first diameter 557 may range from about 25 mm to about 35 mm, and the first difference 553 between the plate thickness 551 and the first depth 556 may range from about 10 mm to about 35 mm. Alternatively yet, the first diameter may range from about 30 mm to about 35 mm, and the first difference may range from about 10 mm to about 20 mm.

In the first recesses 555, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 360. For example, the surface radius may range from about 1 mm to about 3 mm.

In addition, the second recesses 565 can also be configured as cylindrical recesses with a second depth 566 and a second diameter 567, and the second recesses can be located near an outer region of the plasma-facing surface 560.

The second diameter 567 may be an integer number of quarter wavelengths ($n\lambda/4$, where n is an integer greater than zero) or an integer number of half wavelengths ($m\lambda/2$, where m is an integer greater than zero). Additionally, a second difference 563 between the plate thickness 551 and the second depth 566 may be an integer number of quarter wavelengths ($n\lambda/4$, where n is an integer greater than zero) or an integer number of half wavelengths ($m\lambda/2$, where m is an integer greater than zero). For instance, the second diameter 567 may be about half the effective wavelength ($\lambda/2$), and a second difference 563 between the plate thickness 551 and the second depth 566 may be about half the effective wavelength ($\lambda/2$) or about quarter the effective wavelength ($\lambda/4$).

Alternatively, the second diameter 567 may range from about 25 mm (millimeters) to about 35 mm, and the second difference 563 between the plate thickness 551 and the second depth 566 may range from about 10 mm to about 35 mm. Alternatively yet, the second diameter may range from about 30 mm to about 35 mm, and the second difference may range from about 10 mm to about 20 mm.

In the second recesses 565, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 560. For example, the surface radius may range from about 1 mm to about 3 mm.

FIG. 6A illustrates a bottom view of an EM wave launcher in accordance with embodiments of the invention, and FIG. 6B illustrates a schematic cross-sectional view of a portion of the EM wave launcher depicted in FIG. 6A. FIG. 6A illustrates a bottom view of an exemplary EM wave launcher 632, and a plurality of slots (648 and 649) in the slotted antenna 646 are illustrated as if one can see through resonator plate 650 to the slotted antenna 646. As shown in FIG. 6A, the plurality of slots (648 and 649) can be arranged in pairs, and each of the pair of slots comprises a first slot oriented orthogonal to a second slot. However, the orientation of slots in the plurality of slots (648 and 649) can be arbitrary. For example, the orientation of slots in the plurality of slots (648 and 649) can be according to a pre-determined pattern for plasma uniformity and/or plasma stability.

In some embodiments, a plurality of first recesses 655 can be configured in the resonator plate 650 and one or more of the first recesses 655 are not aligned with one or more of the first slots 648 in the slotted antenna 646. Alternatively, one or more of the first recesses 655 may not be aligned with the first slots 648 in the slotted antenna 646. In addition, a shelf recess 665 can be configured in the resonator plate 650, and the shelf recess 665 can comprise an arbitrary geometry including, for example, a cylindrical geometry, a spherical geometry, an aspherical geometry, a rectangular geometry, or any arbitrary shape. The shelf recess 665 can include a shelf depth 666 and a shelf width 667.

Referring still to FIG. 6A and FIG. 6B, an exemplary EM wave launcher 632 is illustrated that can include a resonator plate 650 with plasma-facing surface 660. The EM wave launcher 632 further comprises a slotted antenna 646 having a plurality of first slots 648 and a plurality of second slots 649. The first slots 648 and the second slots 649 permit the coupling of EM energy from a first region above the slotted antenna 646 to a second region below the slotted antenna wherein the resonator plate 650 is located.

The number, geometry, size, and distribution of the first slots 648 and second slots 649 can be factors that can contribute to the spatial uniformity and stability of the plasma formed in plasma generation space (125a, FIG. 1) or plasma generation space (225a, FIG. 2). Thus, the design of the slotted antenna 646 may be used to control the spatial uniformity and stability of the plasmas in the plasma/processing spaces (125a and/or 125b, FIG. 1) or in the plasma/processing spaces (225a and/or 225b, FIG. 2).

In various embodiments, the first recesses 655 can comprise a unique indentation or dimple formed within the plasma-facing surface 660. For example, a first recess 655 can comprise a cylindrical geometry, a spherical geometry, an aspherical geometry, a rectangular geometry, or any arbitrary shape. The first recess 655 can be characterized by a first depth 656 and a first diameter 657.

In addition, the shelf recess 665 can include a unique indentation or dimple formed within the plasma-facing surface 660. For example, a shelf recess 665 can comprise a cylindrical geometry, a spherical geometry, an aspherical geometry, a rectangular geometry, or any arbitrary shape.

Still referring to FIG. 6A and FIG. 6B, the resonator plate 650 comprises a dielectric plate having a plate thickness 651 and a plate diameter 652. For example, the plasma-facing surface 660 on resonator plate 650 can comprise a planar surface 661 within which the first recesses 655 and the shelf recess 665 can be formed. Alternatively, the resonator plate 650 may comprise an arbitrary geometry that can include concave, and/or convex surfaces.

The propagation of EM energy in the resonator plate 650 may be characterized by an effective wavelength (λ) for a given frequency of EM energy and dielectric constant for the resonator plate 650. The plate thickness 651 may be an integer number of quarter wavelengths (n λ/4), where n is an integer greater than zero) or an integer number of half wavelengths (m λ/2), where m is an integer greater than zero). For instance, the plate thickness 651 may be about a half wavelength thick (λ/2) or greater than about half the effective wavelength (>λ/2). Alternatively, the plate thickness 651 may range from about 25 mm (millimeters) to about 45 mm.

As an example, the first recesses 655 can be configured as cylindrical recesses, with first depths 656 and first diameters 657, and the first recesses can be located near an inner region of the plasma-facing surface 660.

The first diameter 657 may be an integer number of quarter wavelengths (nλ/4, where n is an integer greater than zero) or an integer number of half wavelengths (mλ/2, where m is an integer greater than zero). Additionally, a first difference 653 between the plate thickness 651 and the first depth 656 may be an integer number of quarter wavelengths (nλ/4, where n is an integer greater than zero) or an integer number of half wavelengths (mλ/2, where m is an integer greater than zero). For instance, the first diameter 657 may be about half the effective wavelength (λ/2), and a first difference 653 between the plate thickness 651 and the first depth 656 may be about half the effective wavelength (λ/2) or about quarter the effective wavelength (λ/4). The plate thickness 651 may be about half the effective wavelength (λ/2) or greater than half the effective wavelength (>λ/2).

Alternatively, the first diameter 657 may range from about 25 mm to about 35 mm, and the first difference 653 between the plate thickness 651 and the first depth 656 may range from about 10 mm to about 35 mm. Alternatively yet, the first diameter may range from about 30 mm to about 35 mm, and the first difference may range from about 10 mm to about 20 mm.

In the first recesses 655, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 360. For example, the surface radius may range from about 1 mm to about 3 mm.

In addition, the shelf recess 665 can be configured as cylindrical ring with a shelf depth 666 and a shelf width 667, and the shelf recess can be located near an outer region of the plasma-facing surface 660.

The shelf width 667 may be an integer number of quarter wavelengths (nλ/4, where n is an integer greater than zero) or an integer number of half wavelengths (mλ/2, where m is an integer greater than zero). Additionally, a second difference 663 between the plate thickness 651 and the shelf depth 666 may be an integer number of quarter wavelengths (nλ/4, where n is an integer greater than zero) or an integer number of half wavelengths (mλ/2, where m is an integer greater than zero). For instance, the shelf width 667 may be about half the effective wavelength (λ/2), and a second difference 663 between the plate thickness 651 and the shelf depth 666 may be about half the effective wavelength (λ/2) or about quarter the effective wavelength (λ/4).

Alternatively, the shelf width 667 may range from about 25 mm (millimeters) to about 35 mm, and the second difference 663 between the plate thickness 651 and the shelf depth 666 may range from about 10 mm to about 35 mm. Alternatively yet, the shelf width may range from about 30 mm to about 35 mm, and the second difference may range from about 10 mm to about 20 mm.

In the shelf recess 665, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 660. For example, the surface radius may range from about 1 mm to about 3 mm.

Figures 7A, 7B:
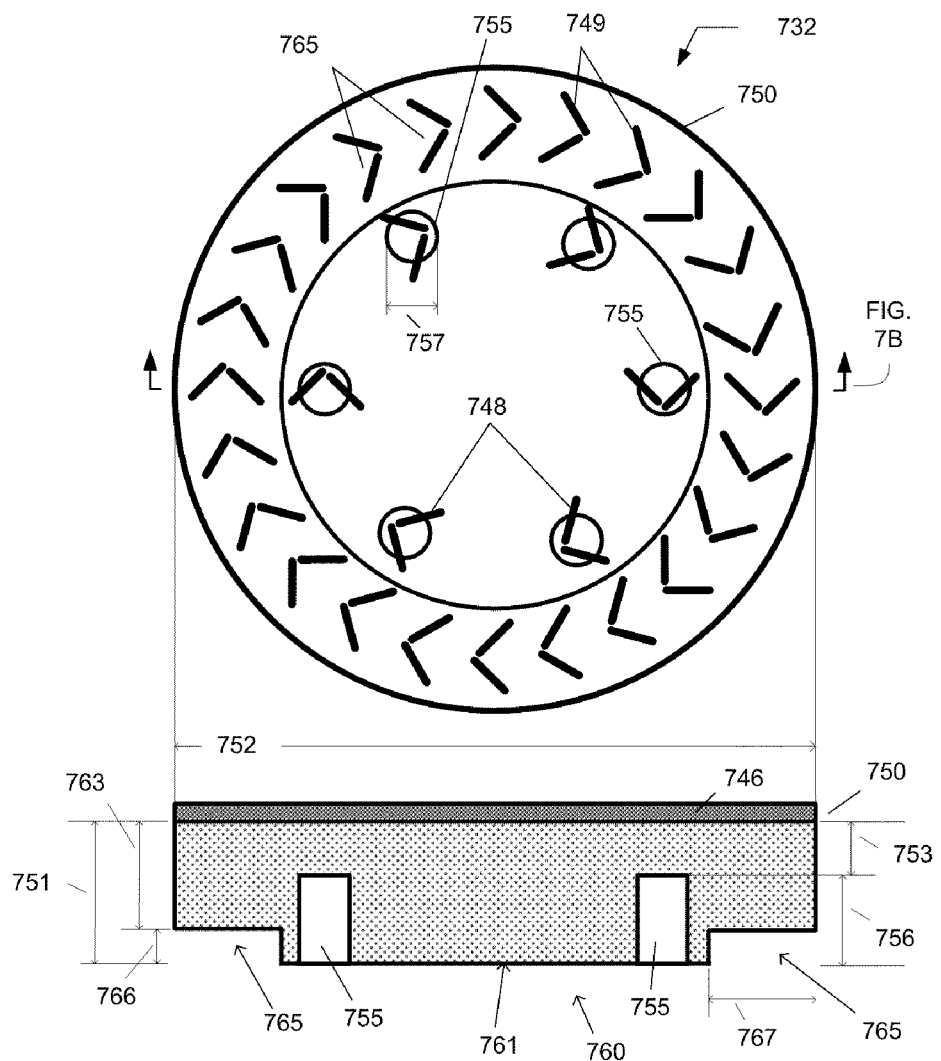
FIG. 7A illustrates a bottom view of an EM wave launcher in accordance with embodiments of the invention.
FIG. 7B illustrates a schematic cross-sectional view of a portion of the EM wave launcher depicted in FIG. 7A.

FIG. 7A illustrates a bottom view of an EM wave launcher in accordance with embodiments of the invention, and FIG. 7B illustrates a schematic cross-sectional view of a portion of the EM wave launcher depicted in FIG. 7A. FIG. 7A illustrates a bottom view of an exemplary EM wave launcher 732, and a plurality of slots (748 and 749) in the slotted antenna 746 are illustrated as if one can see through resonator plate 750 to the slotted antenna 746. As shown in FIG. 7A, the plurality of slots (748 and 749) can be arranged in pairs, and each of the pair of slots comprises a first slot oriented orthogonal to a second slot. However, the orientation of slots in the plurality of slots (748 and 749) can be arbitrary. For example, the orientation of slots in the plurality of slots (748 and 749) can be according to a pre-determined pattern for plasma uniformity and/or plasma stability.

In some embodiments, a plurality of first recesses 755 can be configured in the resonator plate 750 and one or more of the first recesses 755 can be substantially aligned with the first slots 748 in the slotted antenna 746. Alternatively, one or more of the first recesses 755 may not be aligned with one or more of the first slots 748 in the slotted antenna 746. In addition, a shelf recess 765 can be configured in the resonator plate 750, and the shelf recess 765 can comprise an arbitrary geometry including, for example, a cylindrical geometry, a spherical geometry, an aspherical geometry, a rectangular geometry, or any arbitrary shape. The shelf recess 765 can include a shelf depth 766 and a shelf width 767. For example, the shelf recess 765 can be substantially aligned with the plurality of second 749. Alternatively, the shelf recess 765 may be aligned, partly aligned, or not aligned with the plurality of second slots 749.

Referring still to FIG. 7A and FIG. 7B, an exemplary EM wave launcher 732 is illustrated that can include a resonator plate 750 with plasma-facing surface 760. The EM wave launcher 732 further comprises a slotted antenna 746 having a plurality of first slots 748 and a plurality of second slots 749. The first slots 748 and the second slots 749 permit the coupling of EM energy from a first region above the slotted antenna 746 to a second region below the slotted antenna wherein the resonator plate 750 is located.

The number, geometry, size, and distribution of the first slots 748 and second slots 749 can be factors that can contribute to the spatial uniformity and stability of the plasma formed in plasma generation space (125a, FIG. 1) or plasma generation space (225a, FIG. 2). Thus, the design of the slotted antenna 746 may be used to control the spatial uniformity and stability of the plasmas in the plasma/processing spaces (125a and/or 125b, FIG. 1) or in the plasma/processing spaces (225a and/or 225b, FIG. 2).

In various embodiments, the first recesses 755 can comprise a unique indentation or dimple formed within the plasma-facing surface 760. For example, a first recess 755 can comprise a cylindrical geometry, a spherical geometry, an aspherical geometry, a rectangular geometry, or any arbitrary shape. The first recess 755 can be characterized by a first depth 756 and a first diameter 757.

In addition, the shelf recess 765 can include a unique indentation or dimple formed within the plasma-facing surface 760. For example, a shelf recess 765 can comprise a cylindrical geometry, a spherical geometry, an aspherical geometry, a rectangular geometry, or any arbitrary shape.

Still referring to FIG. 7A and FIG. 7B, the resonator plate 750 comprises a dielectric plate having a plate thickness 751 and a plate diameter 752. For example, the plasma-facing surface 760 on resonator plate 750 can comprise a planar surface 761 within which the first recesses 755 and the shelf recess 765 can be formed. Alternatively, the resonator plate 750 may comprise an arbitrary geometry that can include concave, and/or convex surfaces.

The propagation of EM energy in the resonator plate 750 may be characterized by an effective wavelength ($\lambda$) for a given frequency of EM energy and dielectric constant for the resonator plate 750. The plate thickness 751 may be an integer number of quarter wavelengths (n $\lambda$/4, where n is an integer greater than zero) or an integer number of half wavelengths (m $\lambda$/2, where m is an integer greater than zero). For instance, the plate thickness 751 may be about a half wavelength thick ($\lambda$/2) or greater than about half the effective wavelength (>$\lambda$/2). Alternatively, the plate thickness 751 may range from about 25 mm (millimeters) to about 45 mm.

As an example, the first recesses 755 can be configured as cylindrical recesses, with first depths 756 and first diameters 757, and the first recesses can be located near an inner region of the plasma-facing surface 760.

The first diameter 757 may be an integer number of quarter wavelengths (n $\lambda$/4, where n is an integer greater than zero) or an integer number of half wavelengths (m $\lambda$/2, where m is an integer greater than zero). Additionally, a first difference 753 between the plate thickness 751 and the first depth 756 may be an integer number of quarter wavelengths (n $\lambda$/4, where n is an integer greater than zero) or an integer number of half wavelengths (m $\lambda$/2, where m is an integer greater than zero). For instance, the first diameter 757 may be about half the effective wavelength ($\lambda$/2), and a first difference 753 between the plate thickness 751 and the first depth 756 may be about half the effective wavelength ($\lambda$/2) or about quarter the effective wavelength ($\lambda$/4). The plate thickness 751 may be about half the effective wavelength ($\lambda$/2) or greater than half the effective wavelength (>$\lambda$/2).

Alternatively, the first diameter 757 may range from about 25 mm to about 35 mm, and the first difference 753 between the plate thickness 751 and the first depth 756 may range from about 10 mm to about 35 mm. Alternatively yet, the first diameter may range from about 30 mm to about 35 mm, and the first difference may range from about 10 mm to about 20 mm.

In the first recesses 755, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 360. For example, the surface radius may range from about 1 mm to about 3 mm.

In addition, the shelf recess 765 can be configured as cylindrical ring with a shelf depth 766 and a shelf width 767, and the shelf recess can be located near an outer region of the plasma-facing surface 760.

The shelf width 767 may be an integer number of quarter wavelengths (n$\lambda$/4, where n is an integer greater than zero) or an integer number of half wavelengths (m$\lambda$2, where m is an integer greater than zero). Additionally, a second difference 763 between the plate thickness 751 and the shelf depth 766 may be an integer number of quarter wavelengths (n$\lambda$/4, where n is an integer greater than zero) or an integer number of half wavelengths (m$\lambda$/2, where m is an integer greater than zero). For instance, the shelf width 767 may be about half the effective wavelength ($\lambda$/2), and a second difference 763 between the plate thickness 751 and the shelf depth 766 may be about half the effective wavelength ($\lambda$/2) or about quarter the effective wavelength ($\lambda$/4).

Alternatively, the shelf width 767 may range from about 25 mm (millimeters) to about 35 mm, and the second difference 763 between the plate thickness 751 and the shelf depth 766 may range from about 10 mm to about 35 mm. Alternatively yet, the shelf width may range from about 30 mm to about 35 mm, and the second difference may range from about 10 mm to about 20 mm.

In the shelf recess 765, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 760. For example, the surface radius may range from about 1 mm to about 3 mm.

FIG. 8A illustrates a bottom view of an EM wave launcher in accordance with embodiments of the invention, and FIG. 8B illustrates a schematic cross-sectional view of a portion of the EM wave launcher depicted in FIG. 8A. FIG. 8A illustrates a bottom view of an exemplary EM wave launcher 832, and a plurality of slots (848 and 849) in the slotted antenna 846 are illustrated as if one can see through resonator plate 850 to the slotted antenna 846. As shown in FIG. 8A, the plurality of slots (848 and 849) can be arranged in pairs, and each of the pair of slots comprises a first slot oriented orthogonal to a second slot. However, the orientation of slots in the plurality of slots (848 and 849) can be arbitrary. For example, the orientation of slots in the plurality of slots (848 and 849) can be according to a pre-determined pattern for plasma uniformity and/or plasma stability.

In some embodiments, a plurality of first recesses 855 can be configured in the resonator plate 850 and one or more of the first recesses 855 can be substantially non-aligned with the first slots 848 in the slotted antenna 846. Alternatively, one or more of the first recesses 855 may be aligned or partially aligned with one or more of the first slots 848 in the slotted antenna 846. In addition, a slot recess 865 can be configured in the resonator plate 850, and the slot recess 865 can comprise an arbitrary geometry including, for example, a cylindrical geometry, a spherical geometry, an aspherical geometry, a rectangular geometry, or any arbitrary shape. The slot recess 865 can include a slot depth 866 and a slot width 867. For example, the slot recess 865 can be substantially aligned with the plurality of second slots 849. Alternatively, the slot recess 865 may be either aligned, partly aligned, or not aligned with the plurality of second slots 849.

Referring still to FIG. 8A and FIG. 8B, an exemplary EM wave launcher 832 is illustrated that can include a resonator plate 850 with plasma-facing surface 860. The EM wave launcher 832 further comprises a slotted antenna 846 having a plurality of first slots 848 and a plurality of second slots 849. The first slots 848 and the second slots 849 permit the coupling of EM energy from a first region above the slotted antenna 846 to a second region below the slotted antenna wherein the resonator plate 850 is located.

The number, geometry, size, and distribution of the first slots 848 and second slots 849 can be factors that can contribute to the spatial uniformity and stability of the plasma formed in plasma generation space (125a, FIG. 1) or plasma generation space (225a, FIG. 2). Thus, the design of the slotted antenna 846 may be used to control the spatial uniformity and stability of the plasmas in the plasma/processing spaces (125a and/or 125b, FIG. 1) or in the plasma/processing spaces (225a and/or 225b, FIG. 2).

In various embodiments, the first recesses 855 can comprise a unique indentation or dimple formed within the plasma-facing surface 860. For example, a first recess 855 can comprise a cylindrical geometry, a spherical geometry, an aspherical geometry, a rectangular geometry, or any arbitrary shape. The first recess 855 can be characterized by a first depth 856 and a first diameter 857.

In addition, the slot recess 865 can include a unique indentation or dimple formed within the plasma-facing surface 860. For example, a slot recess 865 can comprise a cylindrical geometry, a spherical geometry, an aspherical geometry, a rectangular geometry, or any arbitrary shape.

Still referring to FIG. 8A and FIG. 8B, the resonator plate 850 comprises a dielectric plate having a plate thickness 851 and a plate diameter 852. For example, the plasma-facing surface 860 on resonator plate 850 can comprise a planar surface 861 within which the first recesses 855 and the slot recess 865 can be formed. Alternatively, the resonator plate 850 may comprise an arbitrary geometry that can include concave, and/or convex surfaces.

The propagation of EM energy in the resonator plate 850 may be characterized by an effective wavelength ($\lambda$) for a given frequency of EM energy and dielectric constant for the resonator plate 850. The plate thickness 851 may be an integer number of quarter wavelengths (n $\lambda/4$, where n is an integer greater than zero) or an integer number of half wavelengths (m $\lambda/2$, where m is an integer greater than zero). For instance, the plate thickness 851 may be about a half wavelength thick ($\lambda/2$) or greater than about half the effective wavelength (>$\lambda/2$). Alternatively, the plate thickness 851 may range from about 25 mm (millimeters) to about 45 mm.

As an example, the first recesses 855 can be configured as cylindrical recesses, with first depths 856 and first diameters 857, and the first recesses can be located near an inner region of the plasma-facing surface 860.

The first diameter 857 may be an integer number of quarter wavelengths (n $\lambda/4$, where n is an integer greater than zero) or an integer number of half wavelengths (m $\lambda/2$, where m is an integer greater than zero). Additionally, a first difference 853 between the plate thickness 851 and the first depth 856 may be an integer number of quarter wavelengths (n $\lambda/4$, where n is an integer greater than zero) or an integer number of half wavelengths (m $\lambda/2$, where m is an integer greater than zero). For instance, the first diameter 857 may be about half the effective wavelength ($\lambda/2$), and a first difference 853 between the plate thickness 851 and the first depth 856 may be about half the effective wavelength ($\lambda/2$) or about quarter the effective wavelength ($\lambda/4$). The plate thickness 851 may be about half the effective wavelength ($\lambda/2$) or greater than half the effective wavelength (>$\lambda/2$).

Alternatively, the first diameter 857 may range from about 25 mm to about 35 mm, and the first difference 853 between the plate thickness 851 and the first depth 856 may range from about 10 mm to about 35 mm. Alternatively yet, the first diameter may range from about 30 mm to about 35 mm, and the first difference may range from about 10 mm to about 20 mm.

In the first recesses 855, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 360. For example, the surface radius may range from about 1 mm to about 3 mm.

In addition, the slot recess 865 can be configured as cylindrical ring with a slot depth 866 and a slot width 867, and the slot recess can be located near an outer region of the plasma-facing surface 860.

The slot width 867 may be an integer number of quarter wavelengths (n $\lambda/4$, where n is an integer greater than zero) or an integer number of half wavelengths (m $\lambda/2$, where m is an integer greater than zero). Additionally, a second difference 863 between the plate thickness 851 and the slot depth 866 may be an integer number of quarter wavelengths (n $\lambda/4$, where n is an integer greater than zero) or an integer number of half wavelengths (m $\lambda/2$, where m is an integer greater than zero). For instance, the slot width 867 may be about half the effective wavelength ($\lambda/2$), and a second difference 863 between the plate thickness 851 and the slot depth 866 may be about half the effective wavelength ($\lambda/2$) or about quarter the effective wavelength ($\lambda/4$).

Alternatively, the slot width 867 may range from about 25 mm (millimeters) to about 35 mm, and the second difference 863 between the plate thickness 851 and the slot depth 866 may range from about 10 mm to about 35 mm. Alternatively yet, the slot width may range from about 30 mm to about 35 mm, and the second difference may range from about 10 mm to about 20 mm.

In the slot recess 865, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 860. For example, the surface radius may range from about 1 mm to about 3 mm.

Figures 9A, 9B:
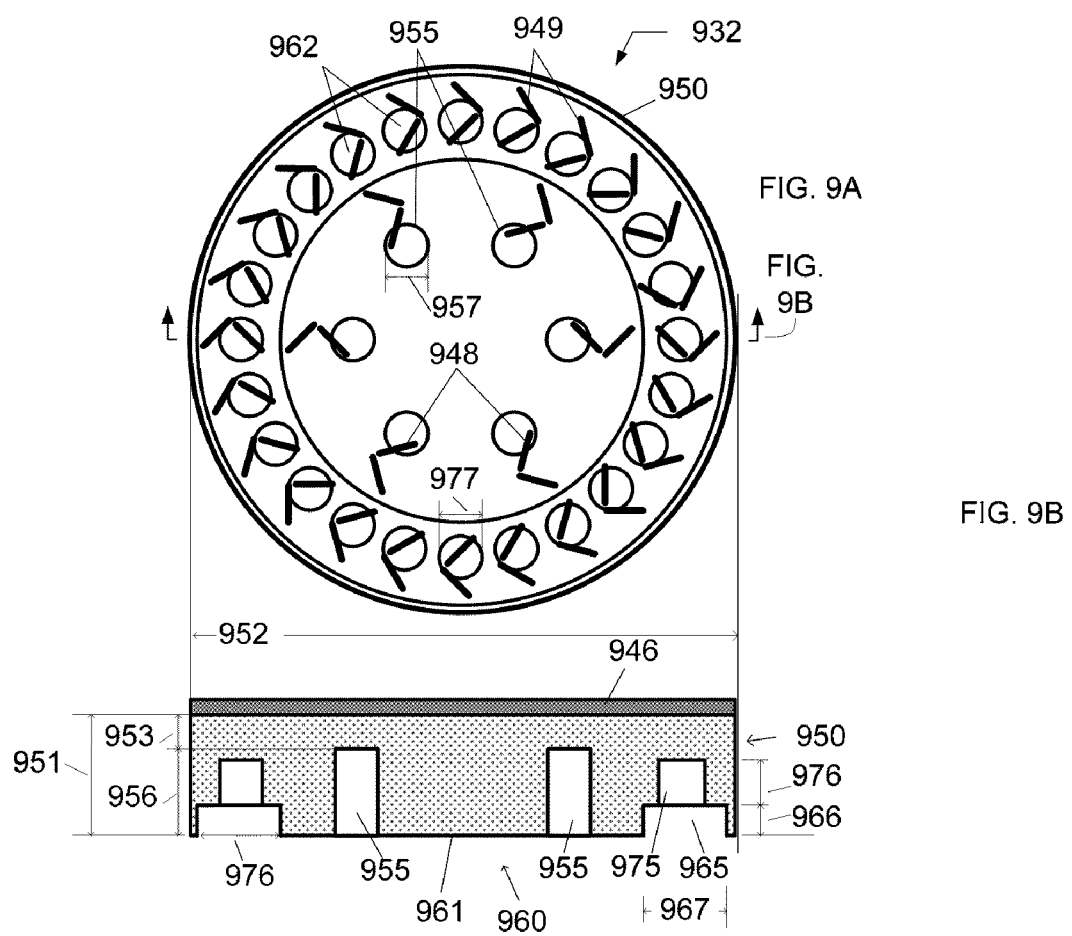
FIG. 9A illustrates a bottom view of an EM wave launcher in accordance with embodiments of the invention.
FIG. 9B illustrates a schematic cross-sectional view of a portion of the EM wave launcher depicted in FIG. 9A.

FIG. 9A illustrates a bottom view of an EM wave launcher in accordance with embodiments of the invention, and FIG. 9B illustrates a schematic cross-sectional view of a portion of the EM wave launcher depicted in FIG. 9A. FIG. 9A illustrates a bottom view of an exemplary EM wave launcher 932, and a plurality of slots (948 and 949) in the slotted antenna 946 are illustrated as if one can see through resonator plate 950 to the slotted antenna 946. As shown in FIG. 9A, the plurality of slots (948 and 949) can be arranged in pairs, and each of the pair of slots comprises a first slot oriented orthogonal to a second slot. However, the orientation of slots in the plurality of slots (948 and 949) can be arbitrary. For example, the orientation of slots in the plurality of slots (948 and 949) can be according to a pre-determined pattern for plasma uniformity and/or plasma stability.

In some embodiments, a plurality of first recesses 955 can be configured in the resonator plate 950 and one or more of the first recesses 955 can be substantially non-aligned with the first slots 948 in the slotted antenna 946. Alternatively, one or more of the first recesses 955 may be aligned or partially aligned with one or more of the first slots 948 in the slotted antenna 946. In addition, a slot recess 965 can be configured in the resonator plate 950, and the slot recess 965 can comprise an arbitrary geometry including, for example, a cylindrical geometry, a spherical geometry, an aspherical geometry, a rectangular geometry, or any arbitrary shape. The slot recess 965 can include a slot depth 966 and a slot width 967. For example, the slot recess 965 can be substantially aligned with the plurality of second slots 949. Alternatively, the slot recess 965 may be either aligned, partly aligned, or not aligned with the plurality of second slots 949. Furthermore, a plurality of second recesses 975 can be configured in the slot recess 965, and the second recesses 975 can comprise an arbitrary geometry including, for example, a cylindrical geometry, a spherical geometry, an aspherical geometry, a rectangular geometry, or any arbitrary shape. The second recesses 975 can include a second depths 976 and second widths 977. For example, the second recesses 975 can be substantially aligned with the plurality of second slots 949. Alternatively, the second recesses 975 may be either aligned, partly aligned, or not aligned with the plurality of second slots 949.

Referring still to FIG. 9A and FIG. 9B, an exemplary EM wave launcher 932 is illustrated that can include a resonator plate 950 with plasma-facing surface 960. The EM wave launcher 932 further comprises a slotted antenna 946 having a plurality of first slots 948 and a plurality of second slots 949. The first slots 948 and the second slots 949 permit the coupling of EM energy from a first region above the slotted antenna 946 to a second region below the slotted antenna wherein the resonator plate 950 is located.

The number, geometry, size, and distribution of the first slots 948 and second slots 949 can be factors that can contribute to the spatial uniformity and stability of the plasma formed in plasma generation space (125a, FIG. 1) or plasma generation space (225a, FIG. 2). Thus, the design of the slotted antenna 946 may be used to control the spatial uniformity and stability of the plasmas in the plasma/processing spaces (125a and/or 125b, FIG. 1) or in the plasma/processing spaces (225a and/or 225b, FIG. 2).

In various embodiments, the first recesses 955 and the second recesses 975 can comprise a unique indentation or dimple formed within the plasma-facing surface 960. For example, a first recess 955 or a second recess 975 can comprise a cylindrical geometry, a spherical geometry, an aspherical geometry, a rectangular geometry, or any arbitrary shape. The first recess 955 can be characterized by a first depth 956 and a first diameter 957. The second recess 975 can be characterized by a second depth 976 and a second diameter 977.

In addition, the slot recess 965 can include a unique indentation or dimple formed within the plasma-facing surface 960. For example, a slot recess 965 can comprise a cylindrical geometry, a spherical geometry, an aspherical geometry, a rectangular geometry, or any arbitrary shape.

Still referring to FIG. 9A and FIG. 9B, the resonator plate 950 comprises a dielectric plate having a plate thickness 951 and a plate diameter 952. For example, the plasma-facing surface 960 on resonator plate 950 can comprise a planar surface 961 within which the first recesses 955 and the slot recess 965 can be formed. Alternatively, the resonator plate 950 may comprise an arbitrary geometry that can include concave, and/or convex surfaces.

The propagation of EM energy in the resonator plate 950 may be characterized by an effective wavelength ($\lambda$) for a given frequency of EM energy and dielectric constant for the resonator plate 950. The plate thickness 951 may be an integer number of quarter wavelengths (n $\lambda$/4), where n is an integer greater than zero) or an integer number of half wavelengths (m $\lambda$/2), where m is an integer greater than zero). For instance, the plate thickness 951 may be about a half wavelength thick ($\lambda$/2) or greater than about half the effective wavelength (>$\lambda$/2). Alternatively, the plate thickness 951 may range from about 25 mm (millimeters) to about 45 mm.

As an example, the first recesses 955 can be configured as cylindrical recesses, with first depths 956 and first diameters 957, and the first recesses can be located near an inner region of the plasma-facing surface 960. In addition, the second recesses 975 can be configured as cylindrical recesses, with second depths 976 and second diameters 977, and the second recesses 975 can be located near an outer region of the plasma-facing surface 960.

The first diameter 957 and the second diameter 977 can be an integer number of quarter wavelengths (n $\lambda$/4), where n is an integer greater than zero) or an integer number of half wavelengths (m $\lambda$/2), where m is an integer greater than zero). Additionally, a first difference 953 between the plate thickness 951 and the first depth 956 may be an integer number of quarter wavelengths (n $\lambda$/4), where n is an integer greater than zero) or an integer number of half wavelengths (m $\lambda$/2), where m is an integer greater than zero). For instance, the first diameter 957 and the second diameter 977 can be about one half the effective wavelength ($\lambda$/2), and a first difference 953 between the plate thickness 951 and the first depth 956 may be about half the effective wavelength ($\lambda$/2) or about quarter the effective wavelength ($\lambda$/4). The plate thickness 951 may be about half the effective wavelength ($\lambda$/2) or greater than half the effective wavelength (>$\lambda$/2).

Alternatively, the first diameter 957 may range from about 25 mm to about 35 mm, and the first difference 953 between the plate thickness 951 and the first depth 956 may range from about 10 mm to about 35 mm. Alternatively yet, the first diameter may range from about 30 mm to about 35 mm, and the first difference may range from about 10 mm to about 20 mm.

In the first recesses 955 and the second recesses 975, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 360. For example, the surface radius may range from about 1 mm to about 3 mm.

In addition, the slot recess 965 can be configured as cylindrical ring with a slot depth 966 and a slot width 967, and the slot recess can be located near an outer region of the plasma-facing surface 960.

The slot width 967 may be an integer number of quarter wavelengths (n $\lambda$/4), where n is an integer greater than zero) or an integer number of half wavelengths (m $\lambda$/2), where m is an integer greater than zero). Additionally, a second difference 963 between the plate thickness 951 and the slot depth 966 may be an integer number of quarter wavelengths (n $\lambda$/4), where n is an integer greater than zero) or an integer number of half wavelengths (m $\lambda$/2), where m is an integer greater than zero). For instance, the slot width 967 may be about half the effective wavelength ($\lambda$/2), and a second difference 963 between the plate thickness 951 and the slot depth 966 may be about half the effective wavelength ($\lambda$/2) or about quarter the effective wavelength ($\lambda$/4).

Alternatively, the slot width 967 may range from about 25 mm (millimeters) to about 35 mm, and the second difference 963 between the plate thickness 951 and the slot depth 966 may range from about 10 mm to about 35 mm. Alternatively yet, the slot width may range from about 30 mm to about 35 mm, and the second difference may range from about 10 mm to about 20 mm.

In the slot recess 965, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 960. For example, the surface radius may range from about 1 mm to about 3 mm.

FIG. 10A illustrates a bottom view of an EM wave launcher in accordance with embodiments of the invention, and FIG. 10B illustrates a schematic cross-sectional view of a portion of the EM wave launcher depicted in FIG. 10A. FIG. 10A illustrates a bottom view of an exemplary EM wave launcher 1032, and a plurality of slots (1048 and 1049) in the slotted antenna 1046 are illustrated as if one can see through resonator plate 1050 to the slotted antenna 1046. As shown in FIG. 10A, the plurality of slots (1048 and 1049) can be arranged in pairs, and each of the pair of slots comprises a first slot oriented orthogonal to a second slot. However, the orientation of slots in the plurality of slots (1048 and 1049) can be arbitrary. For example, the orientation of slots in the plurality of slots (1048 and 1049) can be according to a pre-determined pattern for plasma uniformity and/or plasma stability.

In some embodiments, a plurality of first recesses 1055 can be configured in the resonator plate 1050 and one or more of the first recesses 1055 can be substantially non-aligned with the first slots 1048 in the slotted antenna 1046. Alternatively, one or more of the first recesses 1055 may be aligned or partially aligned with one or more of the first slots 1048 in the slotted antenna 1046. In addition, a channel recess 1065 can be configured in the resonator plate 1050, and the channel recess 1065 can comprise an arbitrary geometry including, for example, a cylindrical geometry, a spherical geometry, an aspherical geometry, a rectangular geometry, or any arbitrary shape. The channel recess 1065 can include a channel depth 1066 and a channel width 1067. For example, the channel recess 1065 can be substantially aligned with the plurality of second slots 1049. Alternatively, the channel recess 1065 may be either aligned, partly aligned, or not aligned with the plurality of second slots 1049.

In some embodiments, opening 1090 can include an opening depth 1091 and an opening width 1092, and the gas passage 1095 can include a passage length 1096 and a passage width 1097. For example, the opening 1090 and the gas passage 1095 can be substantially aligned with the center of the resonator plate 1050. Alternatively, the opening 1090 and the gas passage 1095 may be aligned differently.

Referring still to FIG. 10A and FIG. 10B, an exemplary EM wave launcher 1032 is illustrated that can include a resonator plate 1050 with plasma-facing surface 1060. The EM wave launcher 1032 further comprises a slotted antenna 1046 having a plurality of first slots 1048 and a plurality of second slots 1049. The first slots 1048 and the second slots 1049 permit the coupling of EM energy from a first region above the slotted antenna 1046 to a second region below the slotted antenna wherein the resonator plate 1050 is located.

The number, geometry, size, and distribution of the first slots 1048 and second slots 1049 can be factors that can contribute to the spatial uniformity and stability of the plasma formed in plasma generation space (125a, FIG. 1) or plasma generation space (225a, FIG. 2). Thus, the design of the slotted antenna 1046 may be used to control the spatial uniformity and stability of the plasmas in the plasma/processing spaces (125a and/or 125b, FIG. 1) or in the plasma/processing spaces (225a and/or 225b, FIG. 2).

In various embodiments, the first recesses 1055 and the second recesses 1065 can comprise a unique indentation or dimple formed within the plasma-facing surface 1060. For example, a first recess 1055 can comprise a cylindrical geometry, a spherical geometry, an aspherical geometry, a rectangular geometry, or any arbitrary shape. The first recess 1055 can be characterized by a first depth 1056 and a first diameter 1057.

In addition, the second recess 1065 can comprise a channel having a trapezoidal or frusto-triangular cross-section. However, the channel in the second recess 1065 may comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The second recess 1065 may comprise a channel depth 1066, a first channel width 1066, and a second channel width 1068.

Still referring to FIG. 10A and FIG. 10B, the resonator plate 1050 comprises a dielectric plate having a plate thickness 1051 and a plate diameter 1052. For example, the plasma-facing surface 1060 on resonator plate 1050 can comprise a planar surface 1061 within which the first recesses 1055 and the channel recess 1065 can be formed. Alternatively, the resonator plate 1050 may comprise an arbitrary geometry that can include concave, and/or convex surfaces.

The propagation of EM energy in the resonator plate 1050 may be characterized by an effective wavelength ($\lambda$) for a given frequency of EM energy and dielectric constant for the resonator plate 1050. The plate thickness 1051 may be an integer number of quarter wavelengths (n $\lambda/4$), where n is an integer greater than zero) or an integer number of half wavelengths (m $\lambda/2$), where m is an integer greater than zero). For instance, the plate thickness 1051 may be about a half wavelength thick ($\lambda/2$) or greater than about half the effective wavelength (>$\lambda/2$). Alternatively, the plate thickness 1051 may range from about 25 mm (millimeters) to about 45 mm.

As an example, the first recesses 1055 can be located near an inner region of the plasma-facing surface 1060. In addition, the channel recesses 1065 can be located near an outer region of the plasma-facing surface 1060.

The first diameter 1057, the first channel width 1067, the second channel width 1068, the opening width 1092, and the passage width 1097 can be an integer number of quarter wavelengths (n $\lambda/4$), where n is an integer greater than zero) or an integer number of half wavelengths (m $\lambda/2$), where m is an integer greater than zero). Additionally, a first difference 1053 between the plate thickness 1051 and the first depth 1056 may be an integer number of quarter wavelengths (n $\lambda/4$), where n is an integer greater than zero) or an integer number of half wavelengths (m $\lambda/2$, where m is an integer greater than zero). For instance, the first diameter 1057, the first channel width 1067, the second channel width 1068, and the opening width 1092, and the passage width 1097 can be about one half the effective wavelength ($\lambda/2$), and a first difference 1053 between the plate thickness 1051 and the first depth 1056 may be about half the effective wavelength ($\lambda/2$) or about quarter the effective wavelength ($\lambda/4$). The plate thickness 1051 may be about half the effective wavelength ($\lambda/2$) or greater than half the effective wavelength (>$\lambda/2$).

Alternatively, the first diameter 1057, the first channel width 1067, the second channel width 1068, the opening width 1092, and the passage width 1097 may range from about 10 mm to about 35 mm, and the first difference 1053 between the plate thickness 1051 and the depths (1056, 1066, 1091, and 1096) may range from about 10 mm to about 35 mm.

In the first recesses 1055, the channels recesses 1065, the openings 1090, and/or the gas passages 1095, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 1060. For example, the surface radius may range from about 1 mm to about 3 mm.

In addition, as shown in FIG. 10, the EM wave launcher 1032 can be fabricated with a mating element 1062 having a first mating length 1062a and a first mating width. The mating element 1062 may comprise an edge wall extension located at or near a periphery of the resonator plate 1150 and can be configured to couple with the process chamber wall.

Furthermore, the EM wave launcher may comprise an opening 1090 and a gas passage 1095. The opening 1090 may be configured to receive fastening devices for securing a gas line through the inner portion of the antenna 1046 to the gas passage 1095 in resonator plate 1050.

Although only one gas passage is shown, additional gas passages may be fabricated in the resonator plate 1050. Moreover, although the shape of the gas passage is straight having a cylindrical cross-section, it may be arbitrary, e.g., helical having an arbitrary cross-section. Any one or more of these features described in FIG. 10 may be implemented in any one of the embodiments described in FIGS. 3 through 9.

The channel widths (1067 and 1068) can be an integer number of quarter wavelengths (n $\lambda$/4), where n is an integer greater than zero) or an integer number of half wavelengths (m $\lambda$/2), where m is an integer greater than zero). Additionally, a second difference 1063 between the plate thickness 1051 and the channel depth 1066 may be an integer number of quarter wavelengths (n $\lambda$/4), where n is an integer greater than zero) or an integer number of half wavelengths (m $\lambda$/2), where m is an integer greater than zero). For instance, the channel widths (1067 and 1068) may be about half the effective wavelength ($\lambda$/2), and a second difference 1063 between the plate thickness 1051 and the channel depth 1066 may be about half the effective wavelength ($\lambda$/2) or about quarter the effective wavelength ($\lambda$/4).

Alternatively, the channel widths (1067 and 1068) may range from about 25 mm (millimeters) to about 35 mm, and the second difference 1063 between the plate thickness 1051 and the channel depth 1066 may range from about 10 mm to about 35 mm. Alternatively yet, the channel widths (1067 and 1068) may range from about 30 mm to about 35 mm, and the second difference may range from about 10 mm to about 20 mm.

In the channel recess 1065, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 1060. For example, the surface radius may range from about 1 mm to about 3 mm.

FIG. 11A illustrates a bottom view of an EM wave launcher in accordance with embodiments of the invention, and FIG. 11B illustrates a schematic cross-sectional view of a portion of the EM wave launcher depicted in FIG. 11A. FIG. 11A illustrates a bottom view of an exemplary EM wave launcher 1132, and a plurality of slots (1148 and 1149) in the slotted antenna 1146 are illustrated as if one can see through resonator plate 1150 to the slotted antenna 1146. As shown in FIG. 11A, the plurality of slots (1148 and 1149) can be arranged in pairs, and each of the pair of slots comprises a first slot oriented orthogonal to a second slot. However, the orientation of slots in the plurality of slots (1148 and 1149) can be arbitrary. For example, the orientation of slots in the plurality of slots (1148 and 1149) can be according to a pre-determined pattern for plasma uniformity and/or plasma stability.

In some embodiments, a first recess 1155 can be configured in the resonator plate 1150, and the outer edge of the first recess 1155 can be substantially aligned with the second slots 1149 in the slotted antenna 1146. Alternatively, the first recess 1155 may be smaller and may be aligned or partially aligned with one or more of the first slots 1148 in the slotted antenna 1146. In addition, the first recess 1155 can have a trapezoidal or frusto-triangular cross-section. However, the first recess 1155 may comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The first recess 1155 may comprise a recess depth 1156, a first recess width 1157, and a second recess width 1158.

In addition, as shown in FIG. 11B, the EM wave launcher 1132 can be fabricated with a mating element 1162 having a first mating length 1062a and a first mating width. The mating element 1162 may comprise an edge wall extension located at or near a periphery of the resonator plate 1150 and can be configured to couple with the process chamber wall. Furthermore, the EM wave launcher may comprise an opening 1190 and a gas passage 1195. The opening 1190 may be configured to receive fastening devices for securing a gas line through the inner portion of the antenna 1146 to the gas passage 1195 in resonator plate 1150.

Although only one gas passage is shown, additional gas passages may be fabricated in the resonator plate 1150. Moreover, although the shape of the gas passage is straight having a cylindrical cross-section, it may be arbitrary, e.g., helical having an arbitrary cross-section. Any one or more of these features described in FIGS. 11A and 11B may be implemented in any one of the embodiments described in FIGS. 3 through 9.

In some embodiments, opening 1190 can include an opening depth 1191 and an opening width 1192, and the gas passage 1195 can include a passage length 1196 and passage width 1197. For example, the opening 1190 and the gas passage 1195 can be substantially aligned with the center of the resonator plate 1150. Alternatively, the opening 1190 and the gas passage 1195 may be aligned differently.

Referring still to FIG. 11A and FIG. 11B, an exemplary EM wave launcher 1132 is illustrated that can include a resonator plate 1150 with plasma-facing surface 1160. The EM wave launcher 1132 further comprises a slotted antenna 1146 having a plurality of first slots 1148 and a plurality of second slots 1149. The first slots 1148 and the second slots 1149 permit the coupling of EM energy from a first region above the slotted antenna 1146 to a second region below the slotted antenna wherein the resonator plate 1150 is located.

The number, geometry, size, and distribution of the first slots 1148 and second slots 1149 can be factors that can contribute to the spatial uniformity and stability of the plasma formed in plasma generation space (125a, FIG. 1) or plasma generation space (225a, FIG. 2). Thus, the design of the slotted antenna 1146 may be used to control the spatial uniformity and stability of the plasmas in the plasma/processing spaces (125a and/or 125b, FIG. 1) or in the plasma/processing spaces (225a and/or 225b, FIG. 2).

Still referring to FIG. 11A and FIG. 11B, the resonator plate 1150 comprises a dielectric plate having a plate thickness 1151 and a plate diameter 1152. For example, the plasma-facing surface 1160 on resonator plate 1150 can comprise a planar surface 1161 within which the first recess 1155 can be formed. Alternatively, the resonator plate 1150 may comprise an arbitrary geometry that can include concave, and/or convex surfaces.

The propagation of EM energy in the resonator plate 1150 may be characterized by an effective wavelength ($\lambda$) for a given frequency of EM energy and dielectric constant for the resonator plate 1150. The plate thickness 1151 may be an integer number of quarter wavelengths (n $\lambda$/4), where n is an integer greater than zero) or an integer number of half wavelengths (m $\lambda$/2), where m is an integer greater than zero). For instance, the plate thickness 1151 may be about a half wavelength thick ($\lambda$/2) or greater than about half the effective wavelength (>$\lambda$/2). Alternatively, the plate thickness 1151 may range from about 25 mm (millimeters) to about 45 mm.

The first recess width 1157, the second recess width 1168, the opening width 1192, and the gas passage width 1197 can be an integer number of quarter wavelengths (n $\lambda$/4), where n is an integer greater than zero) or an integer number of half wavelengths (m $\lambda$/2), where m is an integer greater than zero). Additionally, a first difference 1153 between the plate thickness 1151 and the first depth 1156 may be an integer number of quarter wavelengths (n $\lambda$/4), where n is an integer greater than zero) or an integer number of half wavelengths (m $\lambda$/2), where m is an integer greater than zero). For instance, the first recess width 1157, the second recess width 1168, the opening width 1192, and the gas passage width 1197 can be about one half the effective wavelength ($\lambda$/2), and a first difference 1153 between the plate thickness 1151 and the first depth 1156 may be about half the effective wavelength ($\lambda$/2) or about quarter the effective wavelength ($\lambda$/4). The plate thickness 1151 may be about half the effective wavelength ($\lambda$/2) or greater than half the effective wavelength (>$\lambda$/2).

Alternatively, the first recess width 1157, the second recess width 1168, the opening width 1192, and the gas passage width 1197 may range from about 2 mm to about 35 mm, and the first difference 1153 between the plate thickness 1151 and the depths (1156, 1166, and 1196) may range from about 2 mm to about 35 mm.

In the first recess 1155, the opening 1190, and/or the gas passage 1195, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 1160. For example, the surface radius may range from about 1 mm to about 3 mm.

Figures 12A, 12B:
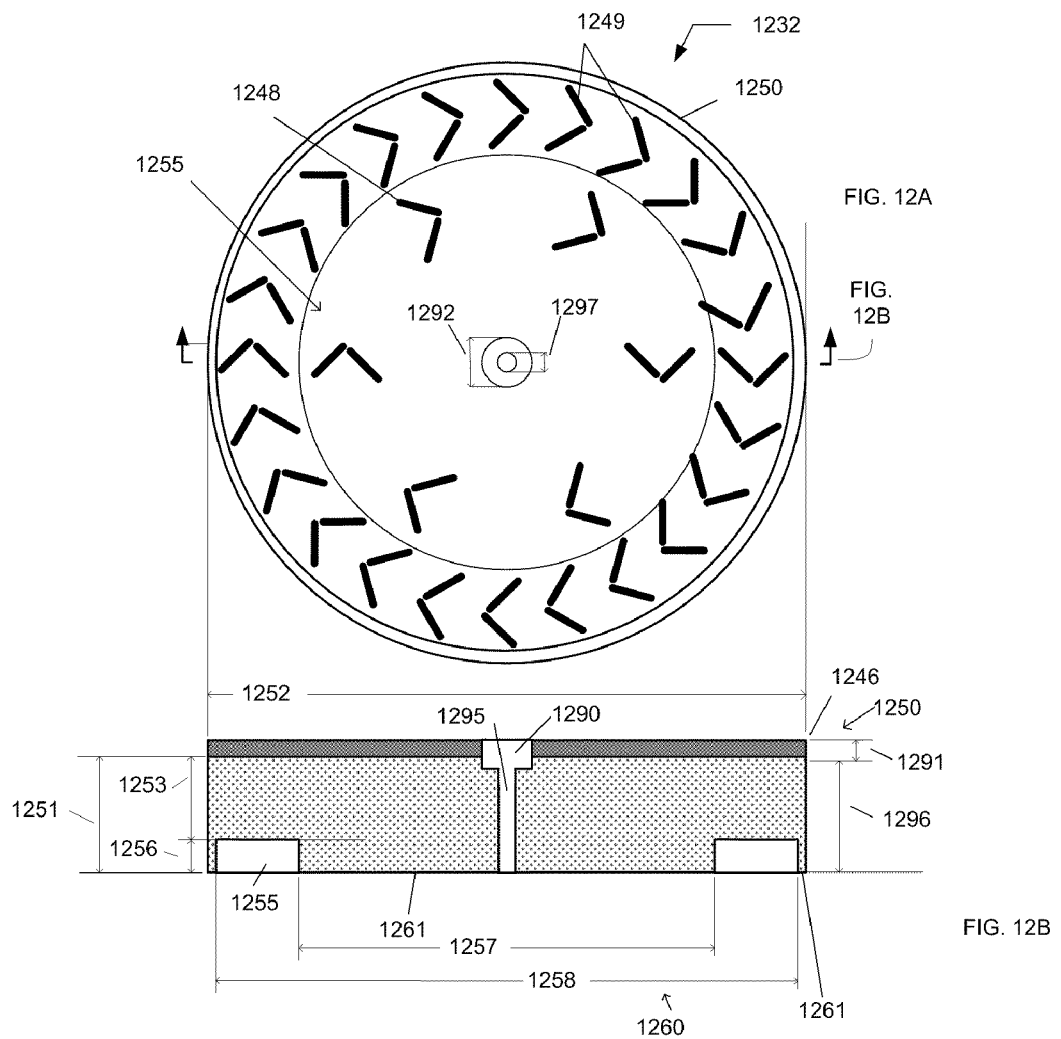
FIG. 12A illustrates a bottom view of an EM wave launcher in accordance with additional embodiments of the invention.
FIG. 12B illustrates a schematic cross-sectional view of a portion of the EM wave launcher depicted in FIG. 11A.

FIG. 12A illustrates a bottom view of an EM wave launcher in accordance with embodiments of the invention, and FIG. 12B illustrates a schematic cross-sectional view of a portion of the EM wave launcher depicted in FIG. 12A. FIG. 12A illustrates a bottom view of an exemplary EM wave launcher 1232, and a plurality of slots (1248 and 1249) in the slotted antenna 1246 are illustrated as if one can see through resonator plate 1250 to the slotted antenna 1246. As shown in FIG. 12A, the plurality of slots (1248 and 1249) can be arranged in pairs, and each of the pair of slots comprises a first slot oriented orthogonal to a second slot. However, the orientation of slots in the plurality of slots (1248 and 1249) can be arbitrary. For example, the orientation of slots in the plurality of slots (1248 and 1249) can be according to a pre-determined pattern for plasma uniformity and/or plasma stability.

In some embodiments, a channel recess 1255 can be configured in the resonator plate 1250, and the channel recess 1255 can be substantially aligned with the second slots 1249 in the slotted antenna 1246. Alternatively, the channel recess 1255 may be smaller and may be aligned or partially aligned with one or more of the first slots 1248 in the slotted antenna 1246. In addition, the channel recess 1255 can comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The channel recess 1255 may comprise a channel depth 1256, a first channel width 1257, and a second channel width 1258.

In addition, as shown in FIG. 12B, the EM wave launcher 1232 can be fabricated with an opening 1290 and a gas passage 1295. The opening 1290 may be configured to receive fastening devices for securing a gas line through the inner portion of the antenna 1246 to the gas passage 1295 in resonator plate 1250.

Although only one gas passage is shown, additional gas passages may be fabricated in the resonator plate 1250. Moreover, although the shape of the gas passage is straight having a cylindrical cross-section, it may be arbitrary, e.g., helical having an arbitrary cross-section. Any one or more of these features described in FIGS. 12A and 12B may be implemented in any one of the embodiments described in FIGS. 3 through 9.

In some embodiments, opening 1290 can include an opening depth 1291 and an opening width 1292, and the gas passage 1295 can include a passage length 1296 and passage width 1297. For example, the opening 1290 and the gas passage 1295 can be substantially aligned with the center of the resonator plate 1250. Alternatively, the opening 1290 and the gas passage 1295 may be aligned differently.

Referring still to FIG. 12A and FIG. 12B, an exemplary EM wave launcher 1232 is illustrated that can include a resonator plate 1250 with plasma-facing surface 1260. The EM wave launcher 1232 further comprises a slotted antenna 1246 having a plurality of first slots 1248 and a plurality of second slots 1249. The first slots 1248 and the second slots 1249 permit the coupling of EM energy from a first region above the slotted antenna 1246 to a second region below the slotted antenna wherein the resonator plate 1250 is located.

The number, geometry, size, and distribution of the first slots 1248 and second slots 1249 can be factors that can contribute to the spatial uniformity and stability of the plasma formed in plasma generation space (125a, FIG. 1) or plasma generation space (225a, FIG. 2). Thus, the design of the slotted antenna 1246 may be used to control the spatial uniformity and stability of the plasmas in the plasma/processing spaces (125a and/or 125b, FIG. 1) or in the plasma/processing spaces (225a and/or 225b, FIG. 2).

Still referring to FIG. 12A and FIG. 12B, the resonator plate 1250 comprises a dielectric plate having a plate thickness 1251 and a plate diameter 1252. For example, the plasma-facing surface 1260 on resonator plate 1250 can comprise a planar surface 1261 within which the channel recess 1255 can be formed. Alternatively, the resonator plate 1250 may comprise an arbitrary geometry that can include concave, and/or convex surfaces.

The propagation of EM energy in the resonator plate 1250 may be characterized by an effective wavelength ($\lambda$) for a given frequency of EM energy and dielectric constant for the resonator plate 1250. The plate thickness 1251 may be an integer number of quarter wavelengths (n λ/4), where n is an integer greater than zero) or an integer number of half wavelengths (m λ/2), where m is an integer greater than zero). For instance, the plate thickness 1251 may be about a half wavelength thick (λ/2) or greater than about half the effective wavelength (>λ/2). Alternatively, the plate thickness 1251 may range from about 25 mm (millimeters) to about 45 mm.

The first channel width 1257, the second channel width 1258, the opening width 1292, and the gas passage width 1297 can be an integer number of quarter wavelengths (n λ/4), where n is an integer greater than zero) or an integer number of half wavelengths (m λ/2), where m is an integer greater than zero). Additionally, a first difference 1253 between the plate thickness 1251 and the first depth 1256 may be an integer number of quarter wavelengths (n λ/4), where n is an integer greater than zero) or an integer number of half wavelengths (m λ/2), where m is an integer greater than zero). For instance, the channel width, the opening width 1292, and the gas passage width 1297 can be about one half the effective wavelength (λ/2). Alternatively, the opening width 1292, and the gas passage width 1297 may range from about 2 mm to about 15 mm, and the first difference 1253 between the plate thickness 1251 and the depths (1256, 1291, and 1296) may range from about 1 mm to about 35 mm.

In the channel recess 1255, the opening 1290, and/or the gas passage 1295, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 1160. For example, the surface radius may range from about 1 mm to about 3 mm.

Although not shown in any one of the embodiments provided in FIGS. 3 through 12, one or more recesses may be interconnected. Additionally, one or more recesses of one recess configuration may be interconnected with one or more recesses of another recess configuration. For example, one or more recesses may be interconnected or linked by a groove or channel.

Regarding the data shown in FIGS. 13A, 13B, 14A, 14B, 15A, 15B, 16A, 16B, 17A, 17B, 18A, 18B, 19A, 19B, and 20A, 20B, the following generalized conditions were used in these experiments. The microwave surface wave plasma was generated using a radial-line-slot-antenna (RLSA). The total plasma chamber pressure is about 150 mT (mTorr, milli-Torr). The microwave power used for plasma generation was about 2500 W (Watts). The exemplary label shows: He/Ar/O$_2$: 100/100/600 which corresponds to gas flow rate in sccm (standard cubic centimeters per minute) for the He, Ar, and O$_2$ gases that were injected into the plasma chamber (100 sccm He, 100 sccm Ar, and 600 sccm O$_2$). In addition, in these experiments, the gases were pre-mixed before injecting into the plasma chamber, and the gases were injected from two injectors located at the bottom of plasma chamber. In addition, 0.02 mW/cm$^2$ (milli-Watts per square centimeter) is the EM radiation intensity measured at the plasma chamber bottom. Furthermore, "not tuned" means that the impedance matcher was continuously moving.

FIG. 13A illustrates exemplary process data in accordance with embodiments of the invention, and FIG. 13B illustrates a set of process conditions and process results associated with FIG. 13A. For example, when experiments were performed at (150 mT and 2500 W), the process results show that helium can be added to tune and stabilize the plasma. In addition, the EM radiation at the bottom of the chamber decreases when helium is added to an Ar/O$_2$ mixture.

FIG. 14A illustrates exemplary flicker suppression data in accordance with embodiments of the invention, and FIG. 14B illustrates a set of process conditions and process results associated with FIG. 14A. For example, when experiments were performed at (80 mT and 2500 W), the process results show that helium can added to suppress the plasma flickering and make the plasma more symmetrical.

FIG. 15A illustrates exemplary stabilization data in accordance with embodiments of the invention, and FIG. 15B illustrates a set of process conditions and process results associated with FIG. 15A. For example, when experiments were performed at (20 mT and 3500 W), the process results show that helium can be added to suppress the plasma flickering at low pressure and high power.

FIG. 16A illustrates additional exemplary stabilization data in accordance with embodiments of the invention, and FIG. 16B illustrates a set of process conditions and process results associated with FIG. 16A. For example, when experiments were performed at (20 mT and 2000 W), the process results show that helium can be added to suppress the plasma flickering at low pressure and middle power.

FIG. 17A illustrates additional exemplary stabilization data in accordance with embodiments of the invention, and FIG. 17B illustrates a set of process conditions and process results associated with FIG. 17A. For example, when experiments were performed at (20 mT and 1500 W), the process results show that helium can be added to suppress the plasma flickering at low pressure and low power.

FIG. 18A illustrates additional exemplary flicker suppression data in accordance with embodiments of the invention, and FIG. 18B illustrates a set of process conditions and process results associated with FIG. 18A. For example, when experiments were performed at (10 mT and 2500 W), the process results show that helium can be added to suppress the plasma flickering at very low pressure and middle power.

FIG. 19A illustrates exemplary EM blocking data in accordance with embodiments of the invention, and FIG. 19B illustrates a set of process conditions and process results associated with FIG. 19A. For example, when experiments were performed at (150 mT and 1000 W), the process results show that the EM radiation at the bottom of the chamber decreases when helium is added to an Ar/O$_2$ mixture.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

FIG. 20A illustrates additional exemplary process data in accordance with embodiments of the invention and FIG. 20B illustrates a set of process conditions and process results associated with FIG. 20A.

During various GIGDSC procedures, the plasma sources (115, FIGS. 1, and 215, FIG. 2) can comprise an electromagnetic (EM) wave launcher (332, FIG. 3), or the EM wave launcher (432, FIG. 4), or the EM wave launcher (532, FIG. 5), or the EM wave launcher (632, FIG. 6), or the EM wave launcher (732, FIG. 7), or the EM wave launcher (832, FIG. 8), or the EM wave launcher (932, FIG. 9), or the EM wave launcher 1032, FIG. 10), or the EM wave launcher (1132, FIG. 11), or the EM wave launcher (1232, FIG. 12), or any combination thereof In addition, the plasma-facing surfaces (116, FIGS. 1 and 216, FIG. 2) of the plasma sources (115, FIGS. 1, and 215, FIG. 2) can comprise plasma-facing surface (360, FIG. 3), or the plasma-facing surface (460, FIG. 4), or the plasma-facing surface (560, FIG. 5), or the plasma-facing surface (660, FIG. 6), or the plasma-facing surface (760, FIG. 7), or the plasma-facing surface (860, FIG. 8), or the plasma-facing surface (960, FIG. 9), or the plasma-facing surface (1060, FIG. 10), or the plasma-facing surface (1160, FIG. 11), or the plasma-facing surface (1260, FIG. 12), or any combination thereof Furthermore, the recesses (117, FIGS. 1 and 217, FIG. 2) in the plasma-facing surfaces (116, FIGS. 1, and 216, FIG. 2) can comprise the recesses (455 and/or 465, FIG. 4), or the recesses (555 and/or 565, FIG. 5), or the recesses (655 and/or 665, FIG. 6), or the recesses (755 and/or 765, FIG. 7), or the recesses (855 and/or 865, FIG. 8), or the recesses (955 and/or 965, FIG. 9), or the recesses (1055 and/or 1065, FIG. 10), or the recesses (1155 and/or 1165, FIG. 11), or the recesses (1255 and/or 1265, FIG. 12), or any combination thereof.

Figure 21:
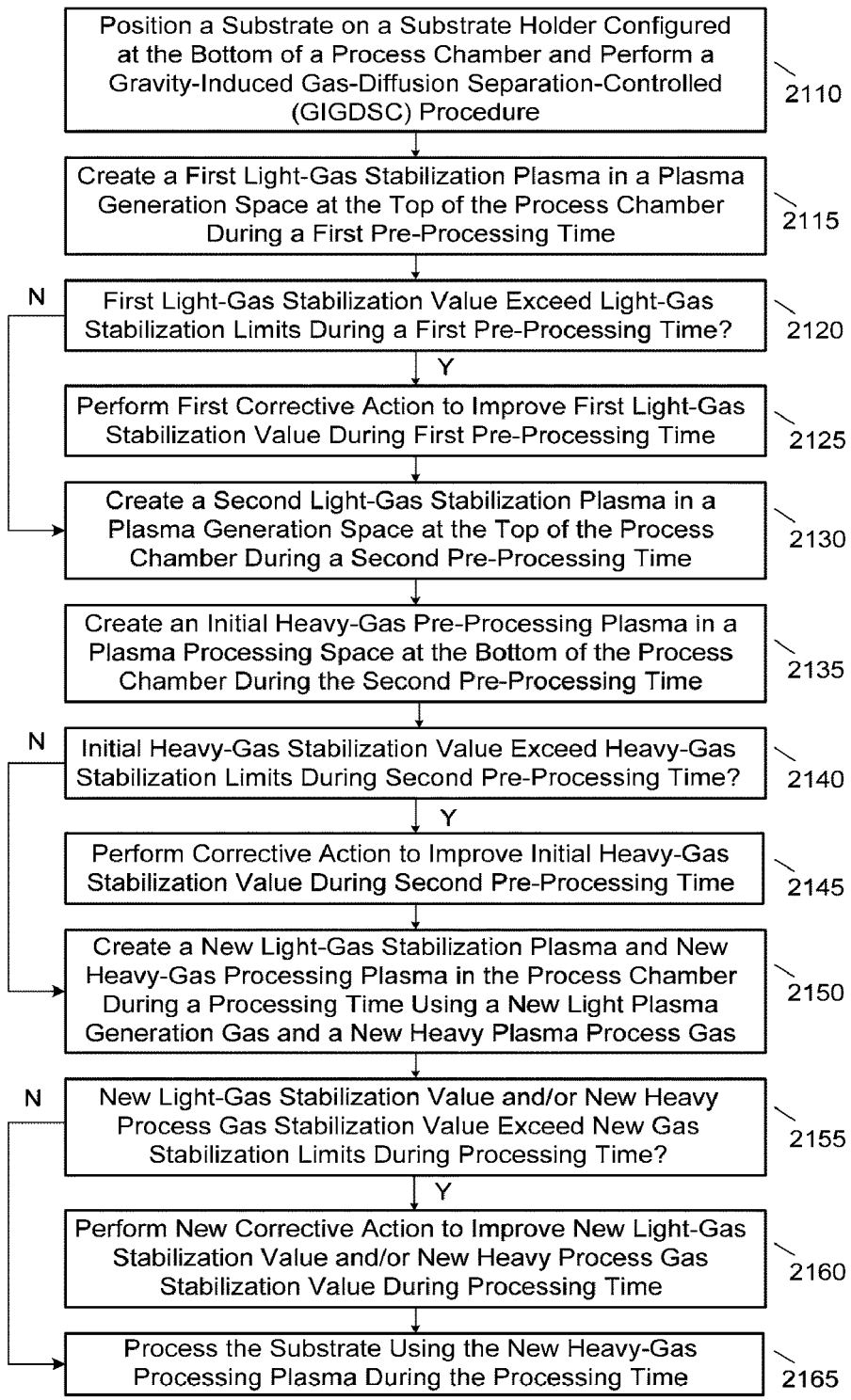
FIG. 21 illustrates an exemplary flow diagram of a method for processing a wafer using a GIGDSC plasma processing system in accordance with embodiments of the invention.

FIG. 21 illustrates an exemplary flow diagram of a method for processing a wafer using a GIGDSC plasma processing system in accordance with embodiments of the invention. FIG. 21 illustrates a procedure 2100 for processing a substrate using a GIGDSC plasma processing subsystem (105, FIG. 1). Procedure 2100 can include a number of processing steps. During some GIGDSC procedures, different chamber pressures can be established using the first pumping system (180, FIG. 1) and the first pressure control system (181, FIG. 1). For example, the chamber pressures can vary from about 1 mTorr to about 1000 mTorr. In addition, different substrate temperatures can be established using the substrate temperature control system (128, FIG. 1) and the temperature control elements (129, FIG. 1). For example, the substrate temperatures can vary from about –10° C. to about 250° C.

In 2110, a substrate (121, FIG. 1) can be positioned on a substrate holder (120, FIG. 1) in a process chamber (110, FIG. 1) that is configured to create a GIGDSC plasma during a GIGDS procedure, and the processing time for the GIGDSC procedure can vary from about 2 seconds to about 2 minutes. A plasma source (115, FIG. 1) can be coupled to the top of the process chamber (110, FIG. 1), and the plasma source (115, FIG. 1) can comprise a plasma-facing surface (116, FIG. 1) having a plurality of recesses (117, FIG. 1) that forms the top wall of the process chamber (110, FIG. 1).

In 2115, first "light-gas" stabilization plasma can be created during a first pre-processing time associated with the GIGDSC procedure. In some embodiments, a first gas mixture can be provided to the top portion and/or the bottom portion of the process chamber (110, FIG. 1) during the first pre-processing time associated with the GIGDSC procedure, and the first gas mixture can include a light plasma generation gas and a heavy process gas. A gravity separation effect can be used to allow the light plasma generation gas to move (diffuse) into a plasma generation space (125a, FIG. 1) at the top of the process chamber (110, FIG. 1) during the first pre-processing time. In addition, one or more gas supply elements (135, 145, 155, and/or 165, FIG. 1) can be coupled to the process chamber (110, FIG. 1), and one or more of the gas supply elements (135, 145, 155, and/or 165, FIG. 1) can be configured to provide the first gas mixture, can be configured to control the first gas mixture components, the first gas mixture flow rates and the first gas mixture flow directions.

In other embodiments, light plasma generation gas can flow into a plasma generation space (125a, FIG. 1) at the top of the process chamber (110, FIG. 1) during the first pre-processing time associated with the GIGDSC procedure. For example, one or more gas supply elements (135 and/or 155, FIG. 1) can be coupled to the process chamber (110, FIG. 1) proximate to the top portion of the process chamber, and one or more of the gas supply elements (135 and/or 155, FIG. 1) can be configured to provide the light plasma generation gas to a plasma generation space (125a, FIG. 1) proximate to the plasma-facing surface (116, FIG. 1) during the first pre-processing time.

In addition, the plasma source (115, FIG. 1) can be configured to provide a first pre-processing power through the plasma-facing surface (116, FIG. 1) to the light plasma generation gas during the first pre-processing time, thereby creating the first "light-gas" stabilization plasma in the plasma generation space proximate to the plasma-facing surface (116, FIG. 1) during the first pre-processing time. In various embodiments, the first pre-processing power can be provided by a surface wave plasma (SWP) source, a microwave source, and/or a radio frequency (RF) source, and the first pre-processing power can vary from about 100 watts to about 10000 watts.

In 2120, a first "light-gas" stabilization value can be determined for the first "light-gas" stabilization plasma and can be compared to first "light-gas" stabilization limits during a first pre-processing time. A first query can be performed to determine if the first "light-gas" stabilization value exceeds the first "light-gas" stabilization limits. When the first "light-gas" stabilization value exceeds one or more of the first "light-gas" stabilization limits, procedure 2100 can branch to 2125 and continue as shown in FIG. 21. When the first "light-gas" stabilization value does not exceed at least one of the first "light-gas" stabilization limits, procedure 2100 can branch to 2130 and continue as shown in FIG. 21. One or more of the process sensors coupled to the process chamber can be used to determine the first "light-gas" stabilization values. The intensity and intermittency of light intensity emanating from the plasma may be used to evaluate the stability of the plasma. For example, an unstable plasma can create intermittent optical signals.

In 2125, at least one corrective action can be performed to improve the first "light-gas" stabilization value. For example, the first gas mixture components, the first gas mixture flow rates, the first gas mixture directions, the number of light-gases, the light-gas flow rate, the light-gas flow direction, the chamber pressure, the chamber temperature, the pre-processing power, or the substrate temperature, or any combination thereof can be updated during corrective action.

In 2130, second "light-gas" stabilization plasma can be created during a second pre-processing time associated with the GIGDSC procedure. In some embodiments, the first gas mixture can be provided to the top portion and/or the bottom portion of the process chamber (110, FIG. 1) during the second pre-processing time, and the gravity separation effect can be used to allow the light plasma generation gas to move (diffuse) into a plasma generation space (125a, FIG. 1) at the top of the process chamber (110, FIG. 1) during the second pre-processing time.

In other embodiments, the light plasma generation gas can continue to flow and diffuse into the first plasma-generation space (125a, FIG. 1) located at the top portion of the process chamber (110, FIG. 1) during a second pre-processing time associated with the GIGDSC procedure. For example, the light plasma generation gas can diffuse into at least one of the recesses (117, FIG. 1) in the plasma-facing surface (116, FIG. 1) at the top of the process chamber (110, FIG. 1) during a second pre-processing time.

In addition, the plasma source (115, FIG. 1) can be configured to provide a second pre-processing power through the plasma-facing surface (116, FIG. 1) to the light plasma generation gas proximate to the plasma-facing surface (116, FIG. 1) during the second pre-processing time, thereby creating the second "light-gas" stabilization plasma in the plasma generation space proximate to the plasma-facing surface during the second pre-processing time. In other embodiments, the second pre-processing power may not be provided during the second pre-processing time. For example, the second pre-processing times for these GIGDSC plasma processes can vary from about one millisecond to about 10 seconds. In various embodiments, the second pre-processing power can be provided by a surface wave plasma (SWP) source, a microwave source, and/or a radio frequency (RF) source, and the second pre-processing power can vary from about 100 watts to about 10000 watts.

In 2135, initial "heavy process gas" pre-processing plasma can be created during the second pre-processing time associated with the GIGDSC procedure. In some embodiments, a second gas mixture can be provided to the top portion and/or the bottom portion of the process chamber (110, FIG. 1) during the second pre-processing time, and the second gas mixture can include a second light plasma generation gas and a heavy process gas. For example, the gravity separation effect can be used to allow the heavy process gas to move (diffuse) into a plasma processing space (125b, FIG. 1) at the bottom of the process chamber (110, FIG. 1) during the second pre-processing time.

In other embodiments, a heavy process gas can flow and/or diffuse into at least one portion of the plasma processing space (125b, FIG. 1) at the bottom of the process chamber (110, FIG. 1) during the second pre-processing time of the GIGDSC procedure. For example, one or more additional gas supply elements (145 and/or 165, FIG. 1) can be coupled to the process chamber (110, FIG. 1) proximate to the lower portion of the process chamber, and one or more of the additional gas supply elements (145 and/or 165, FIG. 1) can be configured to provide the heavy process gas to at least one portion of the plasma processing space (125b, FIG. 1) during the second pre-processing time.

In addition, the plasma source (115, FIG. 1) can be configured to provide additional pre-processing power to the heavy process gas as it flows and/or diffuses into the plasma processing space (125b, FIG. 1) during the second pre-processing time, thereby creating the initial "heavy-gas" pre-processing plasma in the plasma processing space (125b, FIG. 1) proximate to the substrate (121, FIG. 1) during the second pre-processing time. In other embodiments, the second pre-processing power may not be provided during the second pre-processing time. In various embodiments, the additional pre-processing power can be provided by a surface wave plasma (SWP) source, a microwave source, and/or a radio frequency (RF) source, and the additional pre-processing power can vary from about 100 watts to about 10000 watts.

In 2140, an initial "heavy process gas" stabilization value can be determined for the first "heavy process gas" pre-processing plasma and can be compared to initial "heavy process gas" limits during a second pre-processing time. A second query can be performed to determine if the initial "heavy process gas" stabilization value exceeds the initial "heavy process gas" stabilization limits during a second pre-processing time. When the initial "heavy process gas" stabilization value exceeds the initial "heavy process gas" stabilization limits, procedure 2100 can branch to 2145 and continue as shown in FIG. 21. When the initial "heavy process gas" stabilization value does not exceed the initial "heavy process gas" stabilization limits, procedure 2100 can branch to 2150 and continue as shown in FIG. 21. For example, one or more of the process sensors can be used to determine the first "heavy process gas" stabilization values. The intensity and intermittency of light intensity emanating from the plasma may be used to evaluate the stability of the plasma. For example, an unstable plasma can create intermittent optical signals.

In other GIGDSC procedures, a second "light-gas" stabilization value can be determined for the second "light-gas" stabilization plasma and can be compared to second "light-gas" stabilization limits during the second pre-processing time. An additional query can be performed to determine if the second "light-gas" stabilization value exceeds the second "light-gas" stabilization limits. When the second "light-gas" stabilization value exceeds one or more of the second "light-gas" stabilization limits, procedure 2100 can branch to 2145 and continue as shown in FIG. 21. When the second "light-gas" stabilization value does not exceed at least one of the second "light-gas" stabilization limits, procedure 2100 can branch to 2150 and continue as shown in FIG. 21. One or more of the process sensors coupled to the process chamber can be used to determine the second "light-gas" stabilization values. The intensity and intermittency of light intensity emanating from the plasma may be used to evaluate the stability of the plasma. For example, an unstable plasma can create intermittent optical signals.

In 2145, at least one corrective action can be performed to improve the initial "heavy process gas" stabilization values and/or the second "light-gas" stabilization values during the second pre-processing time. For example, the first gas mixture components, the first gas mixture flow rates, the first gas mixture directions, the number of "heavy process gas" gases, the "heavy process gas" flow rates, the "heavy process gas" flow directions, the number of light-gases, the light-gas flow rate, the light-gas flow direction, the chamber pressure, the chamber temperature, the first and/or second pre-processing power, or the substrate temperature, or any combination thereof can be updated during the corrective actions.

In 2150, new "light-gas" stabilization plasma and new heavy-gas processing plasma can be created during the processing time associated with the GIGDSC procedure.

In some embodiments, a new gas mixture can be provided to the top portion and/or the bottom portion of the process chamber (110, FIG. 1) during the processing time and the new gas mixture can include new light plasma generation gas and new heavy process gas. For example, the gravity separation effect can be used to allow the new light plasma generation gas to move (diffuse) into the plasma generation space (125a, FIG. 1) at the top of the process chamber (110, FIG. 1) during the processing time. In addition, the gravity separation effect can be used to allow the new heavy process gas to move (diffuse) into the plasma processing space (125b, FIG. 1) at the bottom of the process chamber (110, FIG. 1) during the processing time.

In other embodiments, the new light plasma generation gas can be provided to the top portion of the process chamber (110, FIG. 1), and the new heavy process gas can be provided to the bottom portion of the process chamber (110, FIG. 1) during the processing time. For example, the gravity separation effect can be used to allow the new light plasma generation gas to move in and/or near the plasma generation space (125a, FIG. 1) at the top of the process chamber (110, FIG. 1) during the processing time. In addition, the gravity separation effect can be used to allow the new heavy process gas to move in and/or near the plasma processing space (125b, FIG. 1) at the bottom of the process chamber (110, FIG. 1) during the processing time.

In some embodiments, first processing power can be applied to the new light plasma generation gas as it flows into the plasma generation space (125a, FIG. 1) thereby creating a new light-gas stabilization plasma in the plasma generation space (125*a*, FIG. 1) during the processing times associated with the GIGDSC procedure being performed. In various embodiments, the first processing power can be provided by a surface wave plasma (SWP) source, a microwave source, and/or a radio frequency (RF) source, and the first processing power can vary from about 100 watts to about 10000 watts. For example, the first processing power can be applied through the plasma-facing surface (116, FIG. 1) to create new light-gas stabilization plasma in at least one of the recesses (117, FIG. 1) and/or the plasma generation space (125*a*, FIG. 1) during the processing time. In addition, high-energy electrons and/or ions can generated and transferred from the plasma generation space (125*a*, FIG. 1) to the plasma processing space (125*b*, FIG. 1) during the processing time.

The new heavy plasma process gas can be flowed into at least one portion of the plasma processing space (125*b*, FIG. 1) in the process chamber (110, FIG. 1) during the processing time. For example, one or more additional gas supply elements (145 and/or 165, FIG. 1) can be coupled to the process chamber (110, FIG. 1) proximate to the lower portion of the process chamber, and one or more of the additional gas supply elements (145 and/or 165, FIG. 1) can be configured to provide the heavy plasma process gas to at least one portion of the plasma processing space (125*b*, FIG. 1) during the processing time associated with the GIGDSC procedure being performed.

For example, the new heavy-gas processing plasma can be created in at least one portion of the plasma processing space (125*b*, FIG. 1) using the applied microwave power and/or high energy electrons generated in the plasma generation space (125*a*, FIG. 1) and the heavy process gas during the processing time. In addition, the plasma source (115, FIG. 1) can be configured to provide additional processing power to the heavy process gas as flows and/or diffuses into the plasma processing space (125*b*, FIG. 1) during the processing time, thereby creating the new heavy-gas processing plasma in the plasma processing space (125*b*, FIG. 1) proximate to the substrate (121, FIG. 1) during the processing time. In various embodiments, the additional processing power can be provided by a surface wave plasma (SWP) source, a microwave source, and/or a radio frequency (RF) source, and the additional processing power can vary from about 100 watts to about 10000 watts.

In 2155, a new "light-gas" stabilization value can be determined for the new light-gas stabilization plasma and can be compared to new "light-gas" stabilization limits during the processing time. A new query can be performed to determine if the new "light-gas" stabilization value exceeds the new "light-gas" stabilization limits. When the new "light-gas" stabilization value exceeds one or more of the new "light-gas" stabilization limits, procedure 2100 can branch to 2160 and continue as shown in FIG. 21. When the new "light-gas" stabilization value does not exceed at least one of the new "light-gas" stabilization limits, procedure 2100 can branch to 2165 and continue as shown in FIG. 21. One or more of the process sensors coupled to the process chamber can be used to determine the new "light-gas" stabilization values. The intensity and intermittency of light intensity emanating from the plasma may be used to evaluate the stability of the plasma. For example, an unstable plasma can create intermittent optical signals.

In addition, new "heavy process gas" stabilization values can be determined for the heavy-gas processing plasma and can be compared to new "heavy process gas" limits during the processing time. A new additional query can be performed to determine if the new "heavy process gas" stabilization value exceeds the new "heavy process gas" stabilization limits during the processing time. When the new "heavy process gas" stabilization value exceeds the new "heavy process gas" stabilization limits, procedure 2100 can branch to 2160 and continue as shown in FIG. 21. When the new "heavy process gas" stabilization value does not exceed the new "heavy process gas" stabilization limits, procedure 2100 can branch to 2165 and continue as shown in FIG. 21. For example, one or more of the process sensors can be used to determine the first "heavy process gas" stabilization values, and unstable plasma can create intermittent optical signals.

In 2160, at least one new corrective action can be performed to improve the new "heavy process gas" stabilization values and/or the new "light-gas" stabilization values. For example, the new gas mixture components, the new gas mixture flow rates, the new gas mixture flow directions, the number of new "heavy process gas" gases, the new "heavy process gas" flow rates, the new "heavy process gas" flow directions, the number of new light-gases, the new light-gas flow rate, the new light-gas flow direction, the chamber pressure, the chamber temperature, the processing power, the additional processing power, or the substrate temperature, or any combination thereof can be updated during new corrective actions.

In 2165, the substrate (121, FIG. 1) can be processed during the processing time using the heavy-gas processing plasma.

Figure 22:
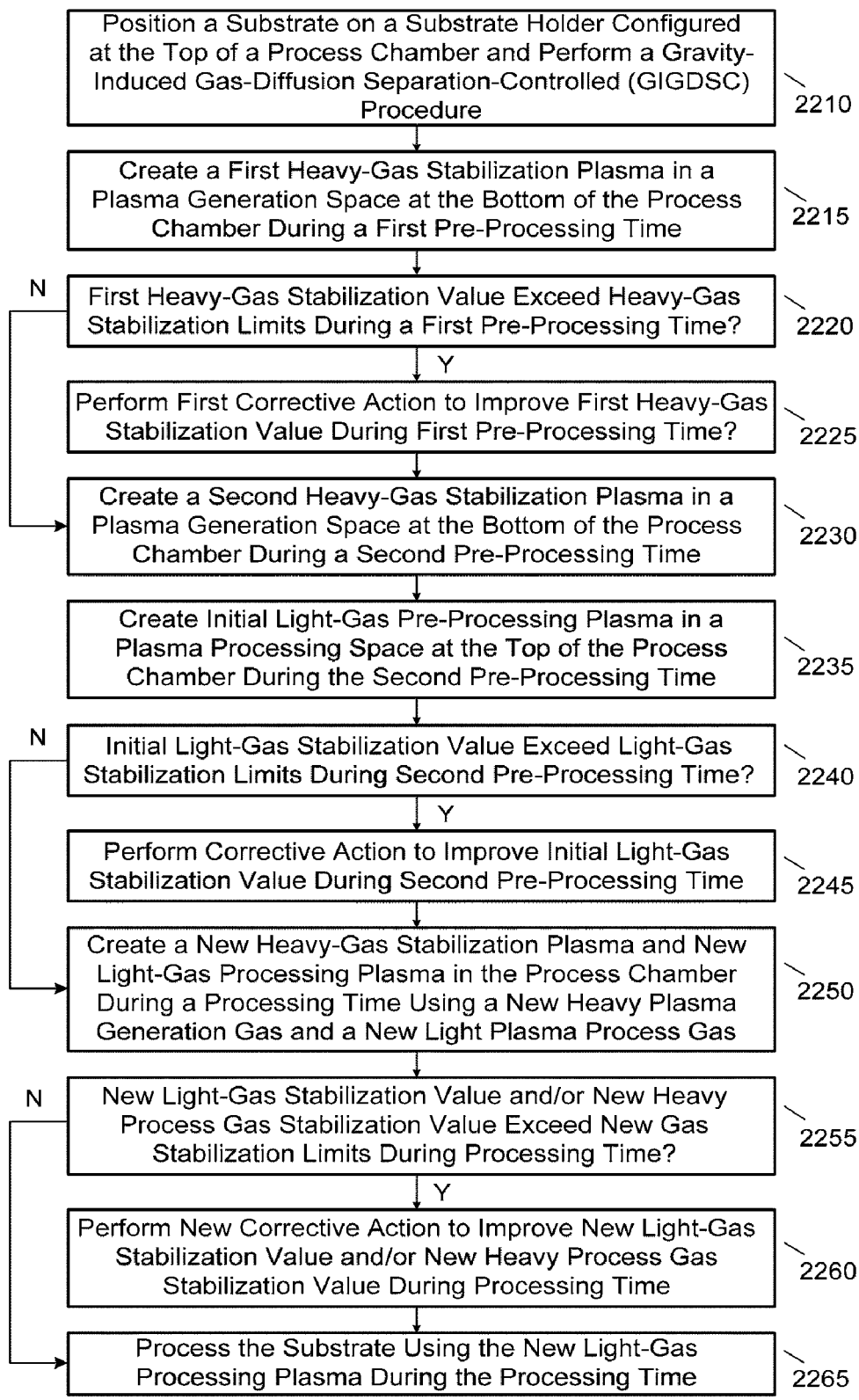
FIG. 22 illustrates another exemplary flow diagram of a method for processing a wafer using a GIGDSC plasma processing system in accordance with embodiments of the invention.

FIG. 22 illustrates an exemplary flow diagram of a method for processing a wafer using a GIGDSC plasma processing system in accordance with embodiments of the invention. FIG. 22 illustrates a procedure 2200 for processing a substrate using a GIGDSC plasma processing subsystem (205, FIG. 2). Procedure 2200 can include a number of processing steps. During some GIGDSC procedures, different chamber pressures can be established using the second pumping system (280, FIG. 2) and the second pressure control system (281, FIG. 2). For example, the chamber pressures can vary from about one mTorr to about 1000 mTorr. In addition, different substrate temperatures can be established using the second substrate temperature control system (228, FIG. 2) and the second temperature control elements (229, FIG. 2). For example, the substrate temperatures can vary from about −10° C. to about 250° C.

In 2210, a second substrate (221, FIG. 2) can be positioned on a second substrate holder (220, FIG. 2) at the top of the second process chamber (210, FIG. 2) that is configured to create a second GIGDSC plasma during a second GIGDSC procedure (2200), and the processing time for the second GIGDSC procedure (2200) can vary from about 2 seconds to about 2 minutes. A second plasma source (215, FIG. 2) can be coupled to the bottom of the second process chamber (210, FIG. 2), and the plasma source (215, FIG. 2) can comprise a plasma-facing surface (216, FIG. 2) having a plurality of recesses (217, FIG. 2) that forms the top wall of the process chamber (210, FIG. 2).

In 2215, first "heavy-gas" stabilization plasma can be created during a first pre-processing time associated with the second GIGDSC procedure (2200). In some embodiments, a first gas mixture can be provided to the top portion and/or the bottom portion of the process chamber (210, FIG. 2) during the first pre-processing time associated with the GIGDSC procedure, and the first gas mixture can include a heavy plasma generation gas and a light process gas. A gravity separation effect can be used to allow the heavy plasma generation gas to move (diffuse) into a plasma generation space (225*a*, FIG. 2) at the bottom of the process chamber (210, FIG. 2) during the first pre-processing time. In addition, one or more gas supply elements (235, 245, 255, and/or 265, FIG. 2) can be coupled to the process chamber (210, FIG. 2), and one or more of the gas supply elements (235, 245, 255, and/or 265, FIG. 2) can be configured to provide the first gas mixture, can be configured to control the first gas mixture components, the first gas mixture flow rates and the first gas mixture flow directions In other embodiments, heavy plasma stabilization gas can flow into a plasma generation space (225a, FIG. 2) at the bottom of the process chamber (210, FIG. 2) during the first pre-processing time associated with the second GIGDSC procedure. For example, one or more gas supply elements (235 and/or 255, FIG. 2) can be coupled to the process chamber (210, FIG. 2) proximate to the bottom portion of the process chamber, and one or more of the gas supply elements (235 and/or 255, FIG. 2) can be configured to provide the heavy plasma stabilization gas to a plasma generation space (225a, FIG. 2) proximate to the plasma-facing surface (216, FIG. 2) during the first pre-processing time.

In some embodiments, the plasma source (215, FIG. 2) can be configured to provide a first pre-processing power through the plasma-facing surface (216, FIG. 2) to the heavy plasma stabilization gas during the first pre-processing time, thereby creating the first "heavy-gas" stabilization plasma in the plasma generation space proximate to the plasma-facing surface (216, FIG. 2) during the first pre-processing time. In various embodiments, the first pre-processing power can be provided by a surface wave plasma (SWP) source, a microwave source, and/or a radio frequency (RF) source, and the first pre-processing power can vary from about 100 watts to about 10000 watts.

In 2220, a first "heavy-gas" stabilization value can be determined for the first "heavy-gas" stabilization plasma and can be compared to first "heavy-gas" stabilization limits during a first pre-processing time. A first query can be performed to determine if the first "heavy-gas" stabilization value exceeds the first "heavy-gas" stabilization limits. When the first "heavy-gas" stabilization value exceeds one or more of the first "heavy-gas" stabilization limits, procedure 2200 can branch to 2225 and continue as shown in FIG. 22. When the first "heavy-gas" stabilization value does not exceed at least one of the first "heavy-gas" stabilization limits, procedure 2200 can branch to 2230 and continue as shown in FIG. 22. One or more of the process sensors coupled to the process chamber can be used to determine the first "heavy-gas" stabilization values, and unstable plasma can create intermittent optical signals.

In 2225, at least one corrective action can be performed to improve the first "heavy-gas" stabilization value. For example, the first gas mixture components, the first gas mixture flow rates, the first gas mixture flow directions, the number of heavy-gases, the heavy-gas flow rate, the heavy-gas flow direction, the chamber pressure, the chamber temperature, the pre-processing power, or the substrate temperature, or any combination thereof can be updated during corrective action.

In 2230, second "heavy-gas" pre-processing plasma can be created during a second pre-processing time associated with the second GIGDSC procedure (2200). In some embodiments, a second gas mixture can be provided to the top portion and/or the bottom portion of the process chamber (210, FIG. 2) during the second pre-processing time, and the gravity separation effect can be used to allow the heavy plasma generation gas to move (diffuse) into a plasma generation space (225a, FIG. 2) at the bottom of the process chamber (210, FIG. 2) during the second pre-processing time. In addition, one or more gas supply elements (235, 245, 255, and/or 265, FIG. 2) can be coupled to the process chamber (210, FIG. 2), and one or more of the gas supply elements (235, 245, 255, and/or 265, FIG. 2) can be configured to provide the second gas mixture, can be configured to control the second gas mixture components, the second gas mixture flow rates and the second gas mixture flow directions In other embodiments, the heavy plasma generation gas can continue to flow and diffuse into the plasma-generation space (225a, FIG. 2) located at the top portion of the process chamber (210, FIG. 2) during a second pre-processing time associated with the GIGDSC procedure.

In some examples, the heavy plasma generation gas can diffuse into at least one of the recesses (217, FIG. 2) in the plasma-facing surface (216, FIG. 2) at the top of the process chamber (210, FIG. 2) during a second pre-processing time. In addition, the plasma source (215, FIG. 2) can be configured to provide a second pre-processing power through the plasma-facing surface (216, FIG. 2) to the heavy plasma generation gas proximate to the plasma-facing surface (216, FIG. 2) during the second pre-processing time, thereby creating the second "heavy-gas" pre-processing plasma in the plasma generation space proximate to the plasma-facing surface during the second pre-processing time. In other examples, the second pre-processing power may not be provided during the second pre-processing time. For example, the second pre-processing times for the GIGDSC plasma processes can vary from about one millisecond to about 10 seconds. In various embodiments, the second pre-processing power can be provided by a surface wave plasma (SWP) source, a microwave source, and/or a radio frequency (RF) source, and the second pre-processing power can vary from about 100 watts to about 10000 watts.

In 2235, initial "light process gas" pre-processing plasma can be created during the second pre-processing time associated with the GIGDSC procedure (2200). In some embodiments, a light process gas can flow and/or diffuse into at least one portion of the plasma processing space (225b, FIG. 2) at the top of the process chamber (210, FIG. 2) during the second pre-processing time. For example, one or more additional gas supply elements (245 and/or 265, FIG. 2) can be coupled to the process chamber (210, FIG. 2) proximate to the upper portion of the process chamber, and one or more of the additional gas supply elements (245 and/or 265, FIG. 2) can be configured to provide the light process gas to at least one portion of the plasma processing space (225b, FIG. 2) during the second pre-processing time.

In addition, the plasma source (215, FIG. 2) can be configured to provide additional pre-processing power to the light process gas as it flows and/or diffuses into the plasma processing space (225b, FIG. 2) during the second pre-processing time, thereby creating the initial "light-gas" pre-processing plasma in the plasma processing space (225b, FIG. 2) proximate to the substrate (221, FIG. 2) during the second pre-processing time. In other embodiments, the second pre-processing power may not be provided during the second pre-processing time. In various embodiments, the additional pre-processing power can be provided by a surface wave plasma (SWP) source, a microwave source, and/or a radio frequency (RF) source, and the additional pre-processing power can vary from about 100 watts to about 10000 watts.

In 2240, an initial "light process gas" stabilization value can be determined for the initial "light process gas" pre-processing plasma and can be compared to initial "light process gas" limits during a second pre-processing time. A second query can be performed to determine if the initial "light process gas" stabilization value exceeds the initial "light process gas" stabilization limits during a second pre-processing time. When the initial "light process gas" stabilization value exceeds the initial "light process gas" stabilization limits, procedure 2200 can branch to 2245 and continue as shown in FIG. 22. When the initial "light process gas" stabilization value does not exceed the initial "light process gas" stabilization limits, procedure 2200 can branch to 2250 and continue as shown in FIG. 22. For example, one or more of the process sensors can be used to determine the first "light process gas" stabilization values.

In other GIGDSC procedures, a second "heavy-gas" stabilization value can be determined for the second "heavy-gas" stabilization plasma and can be compared to second "heavy-gas" stabilization limits during the second pre-processing time. An additional query can be performed to determine if the second "heavy-gas" stabilization value exceeds the second "heavy-gas" stabilization limits. When the second "heavy-gas" stabilization value exceeds one or more of the second "heavy-gas" stabilization limits, procedure 2200 can branch to 2245 and continue as shown in FIG. 22. When the second "heavy-gas" stabilization value does not exceed at least one of the second "heavy-gas" stabilization limits, procedure 2200 can branch to 2250 and continue as shown in FIG. 22. One or more of the process sensors coupled to the process chamber can be used to determine the second "heavy-gas" stabilization values.

In 2245, at least one corrective action can be performed to improve the first "heavy process gas" stabilization values and/or the second "light-gas" stabilization values. For example, the first gas mixture components, the first gas mixture flow rates, the first gas mixture flow directions, the number of "heavy process gas" gases, the "heavy process gas" flow rates, the "heavy process gas" flow directions, the number of light-gases, the light-gas flow rate, the light-gas flow direction, the chamber pressure, the chamber temperature, the pre-processing power, or the substrate temperature, or any combination thereof can be updated during corrective action.

In 2250, new "heavy-gas" stabilization plasma and new light-gas processing plasma can be created during the processing time associated with the GIGDSC procedure.

In some embodiments, a new gas mixture can be provided to the top portion and/or the bottom portion of the process chamber (210, FIG. 2) during the processing time, and the new gas mixture can include a new heavy plasma generation gas and a new light process gas. For example, the gravity separation effect can be used to allow the new heavy plasma generation gas to move (diffuse) into the plasma generation space (225a, FIG. 2) at the bottom of the process chamber (210, FIG. 2) during the processing time. In addition, the gravity separation effect can be used to allow the new light process gas to move (diffuse) into the plasma processing space (225b, FIG. 2) at the top of the process chamber (210, FIG. 2) during the processing time. In addition, one or more gas supply elements (235, 245, 255, and/or 265, FIG. 2) can be coupled to the process chamber (210, FIG. 2), and one or more of the gas supply elements (235, 245, 255, and/or 265, FIG. 2) can be configured to provide the new gas mixture, can be configured to control the new gas mixture components, the new gas mixture flow rates and the new gas mixture flow directions.

In other embodiments, the heavy plasma generation gas can be provided to the bottom portion of the process chamber (210, FIG. 2), and the light process gas can be provided to the top portion of the process chamber (210, FIG. 2) during the processing time. For example, the gravity separation effect can be used to allow the heavy plasma generation gas to move in and/or near the plasma generation space (225a, FIG. 2) at the bottom of the process chamber (210, FIG. 2) during the processing time. In addition, the gravity separation effect can be used to allow the light process gas to move in and/or near the plasma processing space (225b, FIG. 2) at the top of the process chamber (110, FIG. 1) during the processing time.

In 2250, new light-gas process plasma can be created in at least one portion of the plasma processing space (225b, FIG. 2) using the applied microwave power and/or high energy electrons generated in the plasma generation space (225a, FIG. 2) and the light process gas during the processing time associated with the GIGDSC procedure being performed.

In some embodiments, first processing power can be applied to the heavy plasma generation gas as it flows into the plasma generation space (225a, FIG. 2) thereby creating new heavy-gas stabilization plasma in the plasma generation space (225a, FIG. 2) during the processing times associated with the GIGDSC procedure being performed. In various embodiments, the first processing power can be provided by a surface wave plasma (SWP) source, a microwave source, and/or a radio frequency (RF) source, and the first processing power can vary from about 100 watts to about 10000 watts. For example, the first processing power can be applied through the plasma-facing surface (216, FIG. 2) to create new light-gas stabilization plasma in at least one of the recesses (217, FIG. 2) and/or the plasma generation space (225a, FIG. 2) during the processing time. In addition, high-energy electrons and/or ions can generated and transferred from the plasma generation space (225a, FIG. 2) to the plasma processing space (225b, FIG. 2) during the processing time.

The light plasma process gas can be flowed into at least one portion of the plasma processing space (225b, FIG. 2) in the process chamber (210, FIG. 2) during the processing time. For example, one or more additional gas supply elements (245 and/or 265, FIG. 2) can be coupled to the process chamber (210, FIG. 2) proximate to the upper portion of the process chamber, and one or more of the additional gas supply elements (245 and/or 265, FIG. 2) can be configured to provide the heavy plasma process gas to at least one portion of the plasma processing space (225b, FIG. 2) during the processing time associated with the GIGDSC procedure being performed.

For example, the new light-gas processing plasma can be created in at least one portion of the plasma processing space (225b, FIG. 2) using the applied microwave power and/or high energy electrons generated in the plasma generation space (225a, FIG. 2) and the light process gas during the processing time. In addition, the plasma source (215, FIG. 2) can be configured to provide additional processing power to the heavy process gas as flows and/or diffuses into the plasma processing space (225b, FIG. 2) during the processing time, thereby creating the heavy-gas processing plasma in the plasma processing space (225b, FIG. 2) proximate to the substrate (221, FIG. 2) during the processing time. In various embodiments, the additional processing power can be provided by a surface wave plasma (SWP) source, a microwave source, and/or a radio frequency (RF) source, and the additional processing power can vary from about 100 watts to about 10000 watts.

In 2255, a new "heavy-gas" stabilization value can be determined for the new heavy-gas stabilization plasma and can be compared to new "heavy-gas" stabilization limits during the processing time. A new query can be performed to determine if the new "heavy-gas" stabilization value exceeds the new "heavy-gas" stabilization limits. When the new "heavy-gas" stabilization value exceeds one or more of the new "heavy-gas" stabilization limits, procedure 2200 can branch to 2260 and continue as shown in FIG. 22. When the new "heavy-gas" stabilization value does not exceed at least one of the new "heavy-gas" stabilization limits, procedure 2200 can branch to 2265 and continue as shown in FIG. 22.

One or more of the process sensors coupled to the process chamber can be used to determine the new "heavy-gas" stabilization values.

In addition, new "light process gas" stabilization values can be determined for the new light-gas processing plasma and can be compared to new "light process gas" limits during the processing time. A new additional query can be performed to determine if the new "light process gas" stabilization value exceeds the new "light process gas" stabilization limits during the processing time. When the new "light process gas" stabilization value exceeds the new "light process gas" stabilization limits, procedure 2200 can branch to 2260 and continue as shown in FIG. 22. When the new "light process gas" stabilization value does not exceed the new "light process gas" stabilization limits, procedure 2200 can branch to 2265 and continue as shown in FIG. 22. For example, one or more of the process sensors can be used to determine the first "light process gas" stabilization values.

In 2260, at least one new corrective action can be performed to improve the new "light process gas" stabilization values and/or the new "heavy-gas" stabilization values. For example, the new gas mixture components, the new gas mixture flow rates, the new gas mixture flow directions, the number of new "light process gas" gases, the new "light process gas" flow rates, the new "light process gas" flow directions, the number of new heavy-gases, the new heavy-gas flow rate, the new heavy-gas flow direction, the chamber pressure, the chamber temperature, the pre-processing power, or the substrate temperature, or any combination thereof can be updated during corrective action.

In 2265, the substrate (221, FIG. 2) can be processed during the processing time using the light-gas processing plasma.

Figure 23:
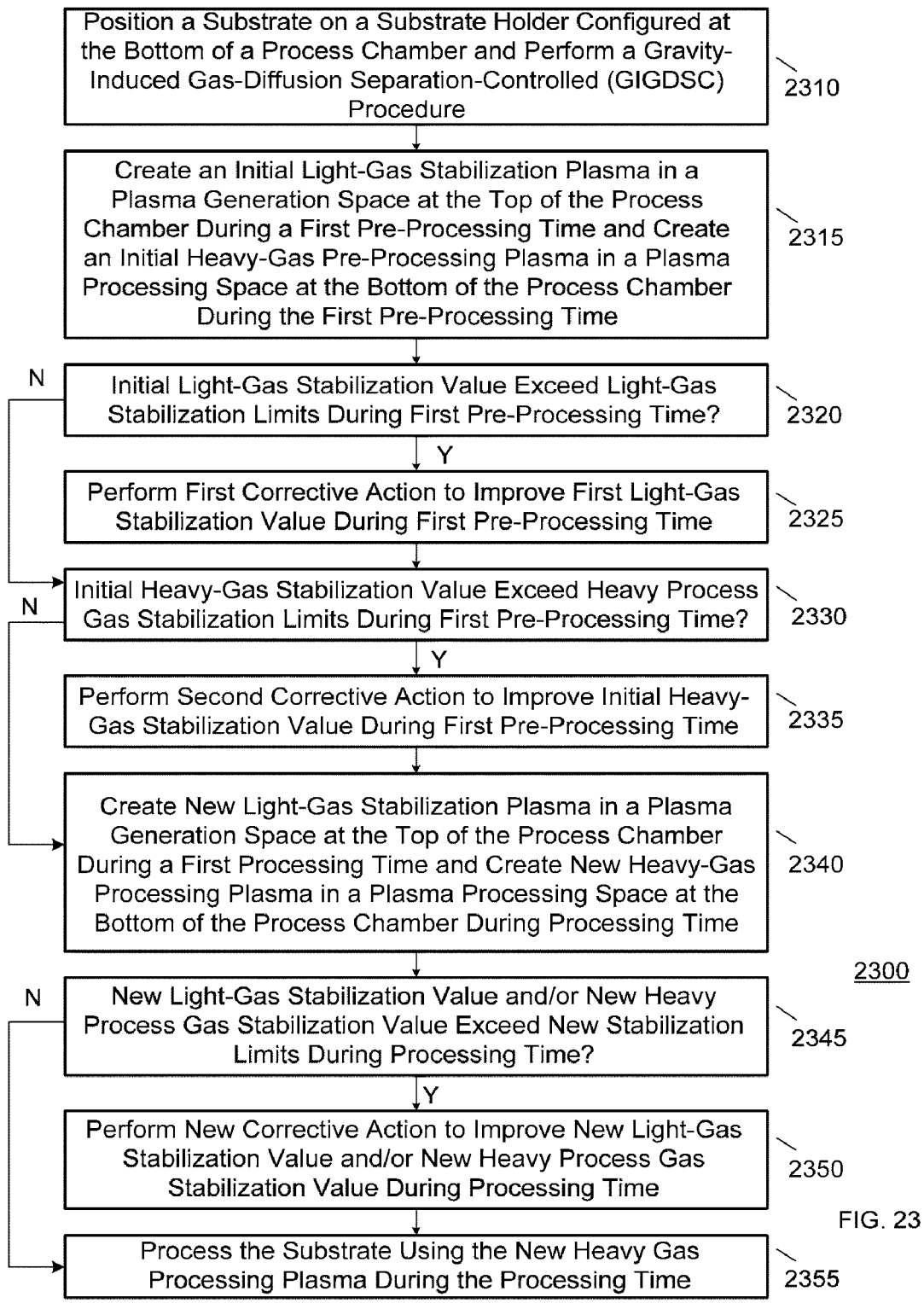
FIG. 23 illustrates another exemplary flow diagram of a method for processing a wafer using a GIGDSC plasma processing system in accordance with embodiments of the invention.

FIG. 23 illustrates an exemplary flow diagram of a method for processing a wafer using a GIGDSC plasma processing system in accordance with embodiments of the invention. FIG. 23 illustrates a procedure 2300 for processing a substrate using a GIGDSC plasma processing subsystem (105, FIG. 1). Procedure 2300 can include a number of processing steps. During some GIGDSC procedures, different chamber pressures can be established using the first pumping system (180, FIG. 1) and the first pressure control system (181, FIG. 1). For example, the chamber pressures can vary from about one mTorr to about one Torr. In addition, different substrate temperatures can be established using the substrate temperature control system (128, FIG. 1) and the temperature control elements (129, FIG. 1). For example, the substrate temperatures can vary from about −10° C. to about 250° C.

In 2310, a substrate (121, FIG. 1) can be positioned on a substrate holder (120, FIG. 1) in a process chamber (110, FIG. 1) that is configured to create a GIGDSC plasma during a GIGDSC procedure (2300), and the processing time for the GIGDSC procedure can vary from about 2 seconds to about 2 minutes. A plasma source (115, FIG. 1) can be coupled to the top of the process chamber (110, FIG. 1), and the plasma source (115, FIG. 1) can comprise a plasma-facing surface (116, FIG. 1) having a plurality of recesses (117, FIG. 1) that forms the top wall of the process chamber (110, FIG. 1).

In 2315, an initial "light-gas" stabilization plasma and an initial "heavy-gas" pre-processing plasma can be created during a first pre-processing time associated with the GIGDSC procedure. In some embodiments, a first gas mixture can be provided to the top portion and/or the bottom portion of the process chamber (110, FIG. 1) during the first pre-processing time associated with the GIGDSC procedure, and the first gas mixture can include a light plasma generation gas and a heavy process gas. A gravity separation effect can be used to allow the light plasma generation gas to move (diffuse) into a plasma generation space (125a, FIG. 1) at the top of the process chamber (110, FIG. 1) during the first pre-processing time. In addition, one or more gas supply elements (135, 145, 155, and/or 165, FIG. 1) can be coupled to the process chamber (110, FIG. 1), and one or more of the gas supply elements (135, 145, 155, and/or 165, FIG. 1) can be configured to provide the first gas mixture, can be configured to control the first gas mixture components, the first gas mixture flow rates and the first gas mixture flow directions.

In other embodiments, one or more light plasma generation gas can flow and/or diffuse into a plasma generation space (125a, FIG. 1) at the top of the process chamber (110, FIG. 1) and one or more heavy process gases can flow and/or diffuse into a plasma processing space (125b, FIG. 1) at the bottom of the process chamber (110, FIG. 1) during the first pre-processing time associated with the GIGDSC procedure. For example, one or more gas supply elements (135 and/or 155, FIG. 1) can be coupled to the process chamber (110, FIG. 1) proximate to the top portion of the process chamber, and one or more of the gas supply elements (135 and/or 155, FIG. 1) can be configured to provide the light plasma generation gas to a plasma generation space (125a, FIG. 1) proximate to the plasma-facing surface (116, FIG. 1) during the first pre-processing time. One or more additional gas supply elements (145 and/or 165, FIG. 1) can be coupled to the process chamber (110, FIG. 1) proximate to the bottom portion of the process chamber, and one or more of the additional gas supply elements (145 and/or 165, FIG. 1) can be configured to provide the heavy plasma process gas to a plasma processing space (125b, FIG. 1) proximate to the surface of the substrate (121, FIG. 1) during the first pre-processing time.

During some GIGDSC procedures, the plasma source (115, FIG. 1) can be configured to provide a first pre-processing power through the plasma-facing surface (116, FIG. 1) to the light plasma generation gas during the first pre-processing time, thereby creating the initial "light-gas" stabilization plasma in the plasma generation space proximate to the plasma-facing surface (116, FIG. 1) during the first pre-processing time. In various embodiments, the first pre-processing power can be provided by a surface wave plasma (SWP) source, a microwave source, and/or a radio frequency (RF) source, and the first pre-processing power can vary from about 100 watts to about 10000 watts.

In addition, the plasma source (115, FIG. 1) can be configured to provide additional pre-processing power to the heavy process gas as it flows and/or diffuses into the plasma processing space (125b, FIG. 1) during the first pre-processing time, thereby creating the initial "heavy-gas" pre-processing plasma in the plasma processing space (125b, FIG. 1) proximate to the substrate (121, FIG. 1) during the first pre-processing time. In other embodiments, the additional pre-processing power may not be provided during the first pre-processing time. In various embodiments, the additional pre-processing power can be provided by a surface wave plasma (SWP) source, a microwave source, and/or a radio frequency (RF) source, and the additional pre-processing power can vary from about 100 watts to about 10000 watts.

In 2320, an initial "light-gas" stabilization value can be determined for the initial "light-gas" stabilization plasma and can be compared to initial "light-gas" stabilization limits during a first pre-processing time. A first query can be performed to determine if the initial "light-gas" stabilization value exceeds the initial "light-gas" stabilization limits. When the initial "light-gas" stabilization value exceeds one or more of the initial "light-gas" stabilization limits, procedure 2300 can branch to 2325 and continue as shown in FIG. 23. When the initial "light-gas" stabilization value does not exceed at least one of the initial "light-gas" stabilization limits, procedure 2300 can branch to 2330 and continue as shown in FIG. 23. One or more of the process sensors coupled to the process chamber can be used to determine the first "light-gas" stabilization values.

In 2325, at least one first corrective action can be performed to improve the initial "light-gas" stabilization value. For example, the first gas mixture components, the first gas mixture flow rates, the first gas mixture flow directions, the number of light-gases, the light-gas flow rate, the light-gas flow direction, the chamber pressure, the chamber temperature, the pre-processing power, or the substrate temperature, or any combination thereof can be updated during first corrective actions.

In 2330, an initial "heavy process gas" stabilization value can be determined for the initial "heavy process gas" pre-processing plasma and can be compared to initial "heavy process gas" limits during the first pre-processing time. A second query can be performed to determine if the initial "heavy process gas" stabilization value exceeds the initial "heavy process gas" stabilization limits during the first pre-processing time. When the initial "heavy process gas" stabilization value exceeds the initial "heavy process gas" stabilization limits, procedure 2300 can branch to 2335 and continue as shown in FIG. 23. When the initial "heavy process gas" stabilization value does not exceed the initial "heavy process gas" stabilization limits, procedure 2300 can branch to 2340 and continue as shown in FIG. 23. For example, one or more of the process sensors can be used to determine the initial "heavy process gas" stabilization values.

In 2335, at least one second corrective action can be performed to improve the initial "heavy process gas" stabilization values. For example, the first gas mixture components, the first gas mixture flow rates, the first gas mixture flow directions, the number of "heavy process gas" gases, the "heavy process gas" flow rates, the "heavy process gas" flow directions, the chamber pressure, the chamber temperature, the pre-processing power, or the substrate temperature, or any combination thereof can be updated during the second corrective actions.

In 2340, new "light-gas" stabilization plasma and new heavy-gas processing plasma can be created during the processing time associated with the GIGDSC procedure.

In some embodiments, a new gas mixture can be provided to the top portion and/or the bottom portion of the process chamber (110, FIG. 1) during the processing time, and the new gas mixture can include new light plasma generation gas and new heavy process gas. In addition, one or more gas supply elements (135, 145, 155, and/or 165, FIG. 1) can be coupled to the process chamber (110, FIG. 1), and one or more of the gas supply elements (135, 145, 155, and/or 165, FIG. 1) can be configured to provide the first gas mixture, can be configured to control the first gas mixture components, the first gas mixture flow rates and the first gas mixture flow directions. For example, the gravity separation effect can be used to allow the new light plasma generation gas to move (diffuse) into the plasma generation space (125*a*, FIG. 1) at the top of the process chamber (110, FIG. 1) during the processing time. In addition, the gravity separation effect can be used to allow the new heavy process gas to move (diffuse) into the plasma processing space (125*b*, FIG. 1) at the bottom of the process chamber (110, FIG. 1) during the processing time.

In other embodiments, the new light plasma generation gas can be provided to the top portion of the process chamber (110, FIG. 1), and the new heavy process gas can be provided to the bottom portion of the process chamber (110, FIG. 1) during the processing time. One or more gas supply elements (135 and/or 155, FIG. 1) can be coupled to the process chamber (110, FIG. 1) proximate to the top portion of the process chamber, and one or more of the gas supply elements (135 and/or 155, FIG. 1) can be configured to provide the light plasma generation gas to a plasma generation space (125*a*, FIG. 1) proximate to the plasma-facing surface (116, FIG. 1) during the first processing time. For example, the gravity separation effect can be used to allow the new light plasma generation gas to remain in and/or near the plasma generation space (125*a*, FIG. 1) at the top of the process chamber (110, FIG. 1) during the processing time. One or more additional gas supply elements (145 and/or 165, FIG. 1) can be coupled to the process chamber (110, FIG. 1) proximate to the bottom portion of the process chamber, and one or more of the additional gas supply elements (145 and/or 165, FIG. 1) can be configured to provide the heavy plasma process gas to a plasma processing space (125*b*, FIG. 1) proximate to the surface of the substrate (121, FIG. 1) during the first processing time. In addition, the gravity separation effect can be used to allow the new heavy process gas to move in and/or near the plasma processing space (125*b*, FIG. 1) at the bottom of the process chamber (110, FIG. 1) during the processing time.

During some GIGDSC procedures, the plasma source (115, FIG. 1) can be configured to provide new processing power through the plasma-facing surface (116, FIG. 1) to the light plasma generation gas during the first processing time, thereby creating the new "light-gas" stabilization plasma in the plasma generation space proximate to the plasma-facing surface (116, FIG. 1) during the first processing time. In various embodiments, the new processing power can be provided by a surface wave plasma (SWP) source, a microwave source, and/or a radio frequency (RF) source, and the new processing power can vary from about 100 watts to about 10000 watts.

In addition, the plasma source (115, FIG. 1) can be configured to provide new processing power to the heavy process gas as it flows and/or diffuses into the plasma processing space (125*b*, FIG. 1) during the first processing time, thereby creating the new "heavy-gas" processing plasma in the plasma processing space (125*b*, FIG. 1) proximate to the substrate (121, FIG. 1) during the first processing time. In various embodiments, the new processing power can be provided by a surface wave plasma (SWP) source, a microwave source, and/or a radio frequency (RF) source, and the new processing power can vary from about 100 watts to about 10000 watts.

When the new "light-gas" stabilization plasma is created, high-energy electrons and/or ions can be created in the plasma generation space (125*a*, FIG. 1) and can be transferred to the new "heavy-gas" processing plasma in the plasma processing space (125*b*, FIG. 1) during the processing time. For example, the flow rates for the "light-gas" can vary from about zero sccm to about 400 sccm, and the flow rates for the "heavy process gas" can vary from about 0 sccm to about 400 sccm during the pre-processing time and/or the processing time.

In 2345, a new "light-gas" stabilization value can be determined for the new light-gas stabilization plasma and can be compared to new "light-gas" stabilization limits during the processing time. A new query can be performed to determine if the new "light-gas" stabilization value exceeds the new "light-gas" stabilization limits. When the new "light-gas" stabilization value exceeds one or more of the new "light-gas" stabilization limits, procedure 2300 can branch to 2350 and continue as shown in FIG. 23. When the new "light-gas" stabilization value does not exceed at least one of the new "light-gas" stabilization limits, procedure 2300 can branch to 2355 and continue as shown in FIG. 23. One or more of the process sensors coupled to the process chamber can be used to determine the new "light-gas" stabilization values.

In addition, new "heavy process gas" stabilization values can be determined for the heavy-gas processing plasma and can be compared to new "heavy process gas" limits during the processing time. A new additional query can be performed to determine if the new "heavy process gas" stabilization value exceeds the new "heavy process gas" stabilization limits during the processing time. When the new "heavy process gas" stabilization value exceeds the new "heavy process gas" stabilization limits, procedure 2300 can branch to 2350 and continue as shown in FIG. 23. When the new "heavy process gas" stabilization value does not exceed the new "heavy process gas" stabilization limits, procedure 2300 can branch to 2355 and continue as shown in FIG. 23. For example, one or more of the process sensors can be used to determine the first "heavy process gas" stabilization values.

In 2350, at least one new corrective action can be performed to improve the new "heavy process gas" stabilization values and/or the new "light-gas" stabilization values during the processing time. For example, the new gas mixture components, the new gas mixture flow rates, the new gas mixture flow directions, the number of new "heavy process gas" gases, the new "heavy process gas" flow rates, the new "heavy process gas" flow directions, the number of new light-gases, the new light-gas flow rate, the new light-gas flow direction, the chamber pressure, the chamber temperature, the pre-processing power, or the substrate temperature, or any combination thereof can be updated during the new corrective actions.

In 2355, the substrate can be processed using the first "heavy-gas" processing plasma during the processing times associated with the GIGDSC procedure being performed.

Figure 24:
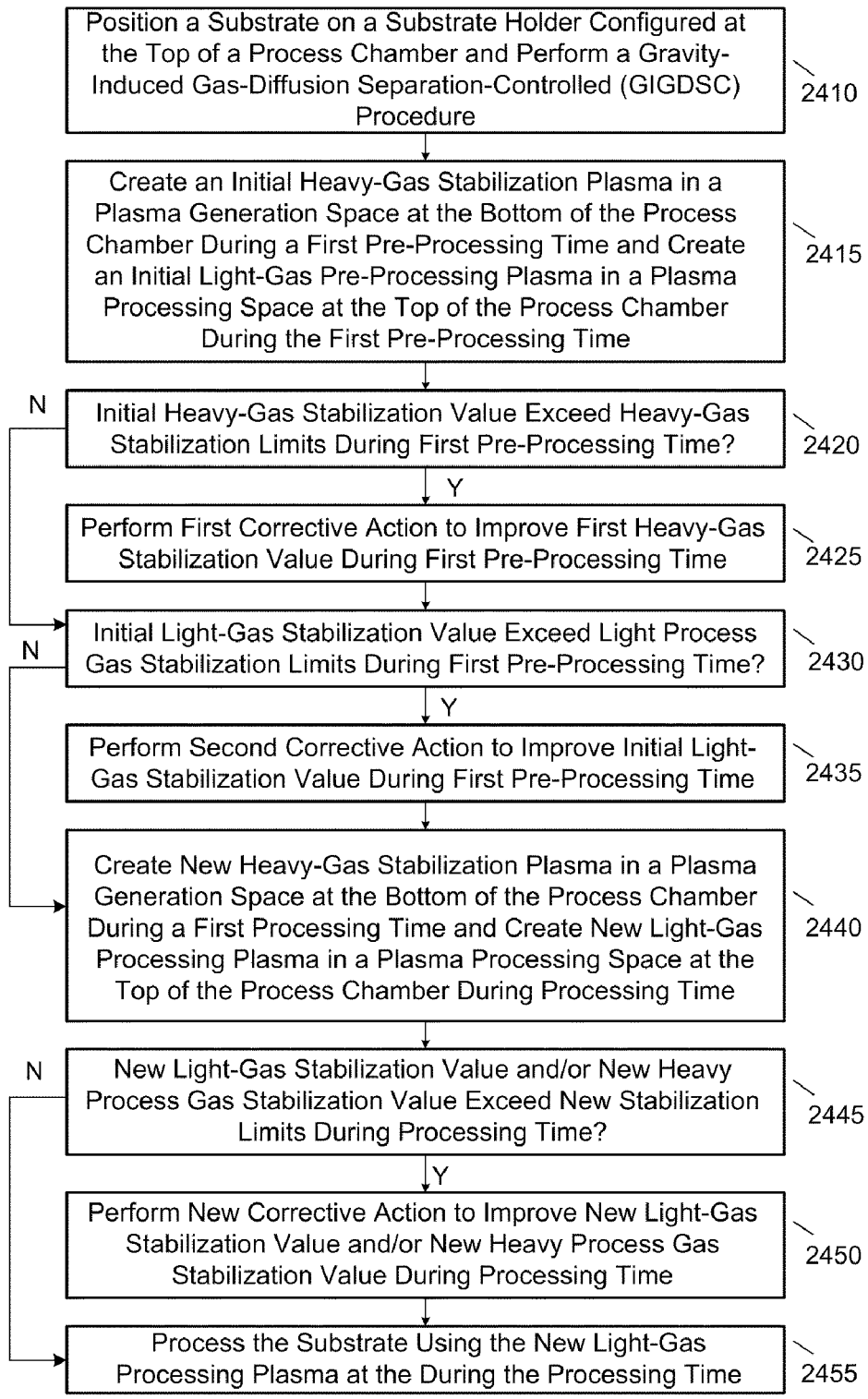
FIG. 24 illustrates another exemplary flow diagram of a method for processing a wafer using a GIGDSC plasma processing system in accordance with embodiments of the invention.

FIG. 24 illustrates an exemplary flow diagram of a method for processing a wafer using a GIGDSC plasma processing system in accordance with embodiments of the invention. FIG. 24 illustrates a procedure 2400 for processing a substrate using a GIGDSC plasma processing subsystem (205, FIG. 2). Procedure 2400 can include a number of processing steps. During some GIGDSC procedures, different chamber pressures can be established using the second pumping system (280, FIG. 2) and the second pressure control system (281, FIG. 2). For example, the chamber pressures can vary from about one mTorr to about one Torr. In addition, different substrate temperatures can be established using the second substrate temperature control system (228, FIG. 2) and the second temperature control elements (229, FIG. 2). For example, the substrate temperatures can vary from about −10° C. to about ° C.

In 2410, a second substrate (221, FIG. 2) can be positioned on a second substrate holder (220, FIG. 2) in a second process chamber (210, FIG. 2) that is configured to create a second GIGDSC plasma during a GIGDSC procedure (2400), and the processing time for the GIGDSC procedure can vary from about 2 seconds to about 2 minutes. A second plasma source (215, FIG. 2) can be coupled to the top of the second process chamber (210, FIG. 2), and the second plasma source (215, FIG. 2) can comprise a plasma-facing surface (216, FIG. 2) having a plurality of recesses (217, FIG. 2) that forms the top wall of the second process chamber (210, FIG. 2).

In 2415, an initial "heavy-gas" stabilization plasma and an initial "light-gas" pre-processing plasma can be created during a first pre-processing time associated with the GIGDSC procedure. In some embodiments, a first gas mixture can be provided to the top portion and/or the bottom portion of the process chamber (210, FIG. 2) during the first pre-processing time associated with the GIGDSC procedure, and the first gas mixture can include a heavy plasma generation gas and a light process gas. A gravity separation effect can be used to allow the heavy plasma generation gas to move (diffuse) into a plasma generation space (225a, FIG. 2) at the bottom of the process chamber (210, FIG. 2) during the first pre-processing time. In addition, one or more gas supply elements (235, 245, 255, and/or 265, FIG. 2) can be coupled to the process chamber (210, FIG. 2), and one or more of the gas supply elements (235, 245, 255, and/or 265, FIG. 2) can be configured to provide the first gas mixture, can be configured to control the first gas mixture components, the first gas mixture flow rates and the first gas mixture flow directions.

In other embodiments, one or more heavy plasma generation gases can flow and/or diffuse into a plasma generation space (225a, FIG. 2) at the bottom of the process chamber (210, FIG. 2) and one or more light process gases can flow and/or diffuse into a plasma processing space (225b, FIG. 2) at the top of the process chamber (210, FIG. 2) during the first pre-processing time associated with the GIGDSC procedure. For example, one or more gas supply elements (235 and/or 255, FIG. 2) can be coupled to the process chamber (210, FIG. 2) proximate to the bottom portion of the process chamber, and one or more of the gas supply elements (235 and/or 255, FIG. 2) can be configured to provide the heavy plasma generation gas to a plasma generation space (225a, FIG. 2) proximate to the plasma-facing surface (216, FIG. 2) during the first pre-processing time. One or more additional gas supply elements (245 and/or 265, FIG. 2) can be coupled to the process chamber (210, FIG. 2) proximate to the top portion of the process chamber, and one or more of the additional gas supply elements (245 and/or 265, FIG. 2) can be configured to provide the light plasma process gas to a plasma processing space (225b, FIG. 2) proximate to the surface of the substrate (221, FIG. 2) during the first pre-processing time.

During some GIGDSC procedures, the plasma source (215, FIG. 2) can be configured to provide a first pre-processing power through the plasma-facing surface (216, FIG. 2) to the heavy plasma generation gas during the first pre-processing time, thereby creating the initial "heavy-gas" stabilization plasma in the plasma generation space proximate to the plasma-facing surface (216, FIG. 2) during the first pre-processing time. In various embodiments, the first pre-processing power can be provided by a surface wave plasma (SWP) source, a microwave source, and/or a radio frequency (RF) source, and the first pre-processing power can vary from about 100 watts to about 10000 watts.

In addition, the plasma source (215, FIG. 2) can be configured to provide additional pre-processing power to the light process gas as it flows and/or diffuses into the plasma processing space (225b, FIG. 2) during the first pre-processing time, thereby creating the initial "light-gas" pre-processing plasma in the plasma processing space (225b, FIG. 2) proximate to the substrate (221, FIG. 2) during the first pre-processing time. In other embodiments, the additional pre-processing power may not be provided during the first pre-processing time. In various embodiments, the additional pre-processing power can be provided by a surface wave plasma (SWP) source, a microwave source, and/or a radio frequency (RF) source, and the additional pre-processing power can vary from about 100 watts to about 10000 watts.

In 2420, an initial "heavy-gas" stabilization value can be determined for the initial "heavy-gas" stabilization plasma and can be compared to initial "heavy-gas" stabilization limits during a first pre-processing time. A first query can be performed to determine if the initial "heavy-gas" stabilization value exceeds the initial "heavy-gas" stabilization limits.

When the initial "heavy-gas" stabilization value exceeds one or more of the initial "heavy-gas" stabilization limits, procedure 2400 can branch to 2425 and continue as shown in FIG. 24. When the initial "heavy-gas" stabilization value does not exceed at least one of the initial "heavy-gas" stabilization limits, procedure 2400 can branch to 2430 and continue as shown in FIG. 24. One or more of the process sensors coupled to the process chamber can be used to determine the first "heavy-gas" stabilization values.

In 2425, at least one first corrective action can be performed to improve the initial "heavy-gas" stabilization value. For example, the first gas mixture components, the first gas mixture flow rates, the first gas mixture flow directions, the number of heavy-gases, the heavy-gas flow rate, the heavy-gas flow direction, the chamber pressure, the chamber temperature, the pre-processing power, or the substrate temperature, or any combination thereof can be updated during corrective action.

In 2430, an initial "light process gas" stabilization value can be determined for the initial "light process gas" pre-processing plasma and can be compared to initial "light process gas" limits during the first pre-processing time. A second query can be performed to determine if the initial "light process gas" stabilization value exceeds the initial "light process gas" stabilization limits during the first pre-processing time. When the initial "light process gas" stabilization value exceeds the initial "light process gas" stabilization limits, procedure 2400 can branch to 2435 and continue as shown in FIG. 24. When the initial "light process gas" stabilization value does not exceed the initial "light process gas" stabilization limits, procedure 2400 can branch to 2440 and continue as shown in FIG. 24. For example, one or more of the process sensors can be used to determine the initial "light process gas" stabilization values.

In 2435, at least one second corrective action can be performed to improve the initial "light process gas" stabilization values. For example, the first gas mixture components, the first gas mixture flow rates, the first gas mixture flow directions, the number of "light process gas" gases, the "light process gas" flow rates, the "light process gas" flow directions, the chamber pressure, the chamber temperature, the pre-processing power, or the substrate temperature, or any combination thereof can be updated during the second corrective actions.

In 2440, new "heavy-gas" stabilization plasma and new light-gas processing plasma can be created during the processing time associated with the GIGDSC procedure.

In some embodiments, a new gas mixture can be provided to the top portion and/or the bottom portion of the process chamber (210, FIG. 2) during the processing time, and the new gas mixture can include new heavy plasma generation gas and new light process gas. In addition, one or more gas supply elements (235, 245, 255, and/or 265, FIG. 2) can be coupled to the process chamber (210, FIG. 2), and one or more of the gas supply elements (235, 245, 255, and/or 265, FIG. 2) can be configured to provide the new gas mixture, can be configured to control the new gas mixture components, the new gas mixture flow rates and the new gas mixture flow directions. For example, the gravity separation effect can be used to allow the new heavy plasma generation gas to move (diffuse) into the plasma generation space (225a, FIG. 2) at the bottom of the process chamber (210, FIG. 2) during the processing time. In addition, the gravity separation effect can be used to allow the new light process gas to move (diffuse) into the plasma processing space (225b, FIG. 2) at the top of the process chamber (210, FIG. 2) during the processing time.

In other embodiments, the new heavy plasma generation gas can be provided to the bottom portion of the process chamber (210, FIG. 2), and the new light process gas can be provided to the top portion of the process chamber (210, FIG. 2) during the processing time. One or more gas supply elements (235 and/or 255, FIG. 2) can be coupled to the process chamber (210, FIG. 2) proximate to the top portion of the process chamber, and one or more of the gas supply elements (235 and/or 255, FIG. 2) can be configured to provide the light process gas to a plasma processing space (225b, FIG. 2) proximate to the surface of the substrate (221, FIG. 2) during the first processing time. For example, the gravity separation effect can be used to allow the new light process gas to remain in and/or near the plasma processing space (225b, FIG. 2) at the top of the process chamber (210, FIG. 2) during the processing time. One or more additional gas supply elements (245 and/or 265, FIG. 2) can be coupled to the process chamber (210, FIG. 2) proximate to the bottom portion of the process chamber, and one or more of the additional gas supply elements (245 and/or 265, FIG. 2) can be configured to provide the heavy plasma generation gas to a plasma generation space (225a, FIG. 2) proximate to the to the plasma-facing surface (216, FIG. 2) during the first processing time. In addition, the gravity separation effect can be used to allow the new heavy plasma generation gas to move in and/or near the plasma generation space (225a, FIG. 2) at the bottom of the process chamber (210, FIG. 2) during the processing time.

During some GIGDSC procedures, the plasma source (215, FIG. 2) can be configured to provide new processing power through the plasma-facing surface (216, FIG. 2) to the heavy plasma generation gas during the first processing time, thereby creating the new "heavy-gas" stabilization plasma in the plasma generation space proximate to the plasma-facing surface (216, FIG. 2) during the first processing time. In various embodiments, the new processing power can be provided by a surface wave plasma (SWP) source, a microwave source, and/or a radio frequency (RF) source, and the new processing power can vary from about 100 watts to about 10000 watts.

In addition, the plasma source (215, FIG. 2) can be configured to provide new additional processing power to the light process gas as it flows and/or diffuses into the plasma processing space (225b, FIG. 2) during the first processing time, thereby creating the new "light gas" processing plasma in the plasma processing space (225b, FIG. 2) proximate to the substrate (221, FIG. 2) during the first processing time. In various embodiments, the new additional processing power can be provided by a surface wave plasma (SWP) source, a microwave source, and/or a radio frequency (RF) source, and the new additional processing power can vary from about 100 watts to about 10000 watts.

When the new "heavy-gas" stabilization plasma is created, high-energy electrons and/or ions can be created in the plasma generation space (225a, FIG. 2) and can be transferred to the new "light gas" processing plasma in the plasma processing space (225b, FIG. 2) during the processing time. For example, the flow rates for the "light gas" can vary from about zero sccm to about 400 sccm, and the flow rates for the "heavy process gas" can vary from about 0 sccm to about 400 sccm during the pre-processing time and/or the processing time.

In 2445, a new "heavy-gas" stabilization value can be determined for the new heavy-gas stabilization plasma and can be compared to new "heavy-gas" stabilization limits during the processing time. A new query can be performed to determine if the new "heavy-gas" stabilization value exceeds the new "heavy-gas" stabilization limits. When the new "heavy-gas" stabilization value exceeds one or more of the new "heavy-gas" stabilization limits, procedure 2400 can branch to 2450 and continue as shown in FIG. 24. When the new "heavy-gas" stabilization value does not exceed at least one of the new "heavy-gas" stabilization limits, procedure 2400 can branch to 2455 and continue as shown in FIG. 24. One or more of the process sensors coupled to the process chamber can be used to determine the new "heavy-gas" stabilization values.

In addition, new "light process gas" stabilization values can be determined for the new light gas processing plasma and can be compared to new "light process gas" limits during the processing time. A new additional query can be performed to determine if the new "light process gas" stabilization value exceeds the new "light process gas" stabilization limits during the processing time. When the new "light process gas" stabilization value exceeds the new "light process gas" stabilization limits, procedure 2400 can branch to 2450 and continue as shown in FIG. 24. When the new "light process gas" stabilization value does not exceed the new "light process gas" stabilization limits, procedure 2400 can branch to 2455 and continue as shown in FIG. 21. For example, one or more of the process sensors can be used to determine the first "heavy process gas" stabilization values.

In 2450, at least one new corrective action can be performed to improve the new "light process gas" stabilization values and/or the new "light-gas" stabilization values during the processing time. For example, the new gas mixture components, the new gas mixture flow rates, the new gas mixture flow directions, the number of new "light process gas" gases, the new "light process gas" flow rates, the new "light process gas" flow directions, the number of new heavy-gases, the new heavy-gas flow rate, the new heavy-gas flow direction, the chamber pressure, the chamber temperature, the processing power, or the substrate temperature, or any combination thereof can be updated during the new corrective actions.

In 2455, the substrate can be processed using the first "light gas" processing plasma during the processing times associated with the GIGDSC procedure being performed.

In some embodiments, the GIGDSC plasma processing system (100 or 200), can comprise: a GIGDSC plasma processing subsystem (105 or 205) configured to perform a GIGDSC etching procedure, a non-GIGDSC etching procedure, a GIGDSC deposition procedure, or a non-GIGDSC deposition procedure, or any combination thereof Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for processing a substrate using a Gravity-Induced Gas-Diffusion Separation-Controlled (GIGDSC) plasma processing subsystem, the method comprising:
    positioning a substrate on a substrate holder in a lower portion of a process chamber configured to perform a GIGDSC procedure;
    creating a first light-gas stabilization plasma in a plasma generation space in an upper portion of the process chamber during a first pre-processing time using a light plasma generation gas;
    determining a first light gas stabilization value during the first pre-processing time;
    comparing the first light gas stabilization value to first stabilization limits during the first pre-processing time;
    performing at least one corrective action to improve the first light gas stabilization value when the first light gas stabilization value exceeds one or more of the stabilization limits during the first pre-processing time; and
    creating a second light-gas stabilization plasma and an initial heavy-gas pre-processing plasma during a second pre-processing time when the first light gas stabilization value does not exceed at least one of the stabilization limits during the first pre-processing time, wherein the initial heavy-gas pre-processing plasma is created using at least one heavy process gas in a plasma processing space proximate the substrate.

2. The method of claim 1, further comprising:
    determining an initial heavy-gas stabilization value during the second pre-processing time;
    comparing the initial heavy-gas stabilization value to initial heavy-gas stabilization limits during the second pre-processing time;
    performing at least one second corrective action to improve the initial heavy-gas stabilization value when the initial heavy-gas stabilization value exceeds one or more of the initial heavy-gas stabilization limits during the second pre-processing time; and
    creating a new light-gas stabilization plasma and a new heavy-gas processing plasma during a processing time when the initial heavy-gas stabilization value does not exceed at least one of the initial heavy-gas stabilization limits during the second pre-processing time, wherein the substrate is processed using the new heavy-gas processing plasma during the processing time.

3. The method of claim 1, wherein the light plasma generation gas comprises Helium (He), Hydrogen ($H_2$), or Neon (Ne), or any combination thereof and wherein the at least one heavy process gas comprises Argon (Ar), an Oxygen-containing gas, a Fluorocarbon gas, a Hydrofluorocarbon gas, or a Halogen-containing gas, or any combination thereof, the Fluorocarbon gas having a form $C_xF_y$, wherein x and y are equal to 1 or more, the Hydrofluorocarbon gas having a form $C_xF_yH_z$, wherein x, y and z are equal to 1 or more, and the) Halogen-containing gas having a halogen atom selected from the group consisting of Cl, Br, and F.

4. The method of claim 1, wherein a first gas mixture is provided to the process chamber using at least one gas supply element coupled to the process chamber, the first gas mixture including one or more lighter gaseous constituents that diffuse into the plasma generation space and one or more heavier gaseous constituents that diffuse into the plasma processing space, the lighter gaseous constituents including the light plasma generation gas and the heavier gaseous constituents including the at least one heavy process gas.

5. The method of claim 1, wherein the light plasma generation gas is provided to the process chamber using a first gas supply element coupled to the upper portion of the process chamber and the at least one heavy process gas is provided to the process chamber using a second gas supply element coupled to the lower portion of the process chamber.

6. The method of claim 1, wherein a plasma source is coupled to the plasma generation space and is configured to generate the GIGDSC plasma using at least one lighter gaseous constituent of the light plasma generation gas that diffuse into the plasma generation space, wherein the plasma source includes a plasma-facing surface configured to form a top wall in the process chamber, and the plasma-facing surface has a first recess therein.

7. A method for processing a substrate using a Gravity-Induced Gas-Diffusion Separation-Controlled (GIGDSC) plasma processing subsystem, the method comprising:

positioning a substrate on a substrate holder in a lower portion of a process chamber configured to perform a GIGDSC procedure;

creating an initial light-gas stabilization plasma in a plasma generation space in an upper portion of the process chamber during a first pre-processing time using a light plasma generation gas;

creating an initial heavy-gas pre-processing plasma in a plasma processing space in the lower portion of the process chamber during the first pre-processing time using at least one heavy process gas;

determining an initial heavy-gas stabilization value during the first pre-processing time;

comparing the initial heavy-gas stabilization value to initial heavy-gas stabilization limits during the first pre-processing time;

performing at least one corrective action to improve the initial heavy-gas stabilization value when the initial heavy-gas stabilization value exceeds one or more of the initial heavy-gas stabilization limits during the first pre-processing time; and creating a new light-gas stabilization plasma and a new heavy-gas processing plasma during a processing time when the initial heavy-gas stabilization value does not exceed at least one of the initial heavy-gas stabilization limits during the first pre-processing time, wherein the new heavy-gas pre-processing plasma is created using at least one new heavy process gas in the plasma processing space proximate the substrate during the processing time.

8. The method of claim 7, further comprising:

determining an initial light-gas stabilization value during the first pre-processing time;

comparing the initial light-gas stabilization value to initial light-gas stabilization limits during the first pre-processing time; and performing at least one additional corrective action to improve the initial light-gas stabilization value when the initial light-gas stabilization value exceeds one or more of the initial light-gas stabilization limits during the first pre-processing time.

9. The method of claim 7, further comprising:

determining a new heavy-gas stabilization value during the processing time;

comparing the new heavy-gas stabilization value to new heavy-gas stabilization limits during the processing time; and performing at least one new corrective action to improve the new heavy-gas stabilization value when the new heavy-gas stabilization value exceeds one or more of the new heavy-gas stabilization limits during the processing time.

10. The method of claim 7, further comprising:

determining a new light-gas stabilization value during the processing time;

comparing the new light-gas stabilization value to new light-gas stabilization limits during the processing time; and performing at least one new corrective action to improve the new light-gas stabilization value when the new light-gas stabilization value exceeds one or more of the new light-gas stabilization limits during the processing time.

11. The method of claim 7, wherein the light plasma generation gas comprises Helium (He), Hydrogen ($H_2$), or Neon (Ne), or any combination thereof and wherein the at least one heavy process gas comprises Argon (Ar), an Oxygen-containing gas, a Fluorocarbon gas, a Hydrofluorocarbon gas, or a Halogen-containing gas, or any combination thereof, the Fluorocarbon gas having a form $C_xF_y$, wherein x and y are equal to 1 or more, the Hydrofluorocarbon gas having a form $C_xF_yH_z$, wherein x, y and z are equal to 1 or more, and the) Halogen-containing gas having a halogen atom selected from the group consisting of Cl, Br, and F.

12. The method of claim 7, wherein a first gas mixture is provided to the process chamber using at least one gas supply element coupled to the process chamber, the first gas mixture including one or more lighter gaseous constituents that diffuse into the plasma generation space and one or more heavier gaseous constituents that diffuse into the plasma processing space, the lighter gaseous constituents including the light plasma generation gas and the heavier gaseous constituents including the at least one heavy process gas.

13. The method of claim 7, wherein the light plasma generation gas is provided to the process chamber using a first gas supply element coupled to the upper portion of the process chamber and the at least one heavy process gas is provided to the process chamber using a second gas supply element coupled to the lower portion of the process chamber.

14. The method of claim 7, wherein a plasma source is coupled to the plasma generation space and is configured to generate the GIGDSC plasma using at least one lighter gaseous constituent of the light plasma generation gas that diffuse into the plasma generation space, wherein the plasma source includes a plasma-facing surface configured to form a top wall in the process chamber, and the plasma-facing surface has a first recess therein.

15. A method for processing a substrate using a Gravity-Induced Gas-Diffusion Separation-Controlled (GIGDSC) plasma processing subsystem, the method comprising:

positioning a substrate on a substrate holder in an upper portion of a process chamber configured to perform a GIGDSC procedure;

creating an initial heavy-gas stabilization plasma in a plasma generation space in an lower portion of the process chamber during a first pre-processing time using a heavy plasma generation gas;

creating an initial light-gas pre-processing plasma in a plasma processing space in the upper portion of the process chamber during the first pre-processing time using at least one light process gas;

determining an initial light-gas stabilization value during the first pre-processing time;

comparing the initial light-gas stabilization value to initial light-gas stabilization limits during the first pre-processing time;

performing at least one corrective action to improve the initial light-gas stabilization value when the initial light-gas stabilization value exceeds one or more of the initial light-gas stabilization limits during the first pre-processing time; and creating a new heavy-gas stabilization plasma and a new light-gas processing plasma during a processing time when the initial light-gas stabilization value does not exceed at least one of the initial light-gas stabilization limits during the first pre-processing time, wherein the new light-gas processing plasma is created using at least one new light process gas in the plasma processing space proximate the substrate during the processing time.

16. The method of claim 15, further comprising:

determining an initial heavy-gas stabilization value during the first pre-processing time;

comparing the initial heavy-gas stabilization value to initial heavy-gas stabilization limits during the first pre-processing time; and performing at least one additional corrective action to improve the initial heavy-gas stabilization value when the initial heavy-gas stabilization value exceeds one or more of the initial heavy-gas stabilization limits during the first pre-processing time.

17. The method of claim 15, further comprising:

determining a new light-gas stabilization value during the processing time;

comparing the new light-gas stabilization value to new light-gas stabilization limits during the processing time; and performing at least one new corrective action to improve the new light-gas stabilization value when the new light-gas stabilization value exceeds one or more of the new light-gas stabilization limits during the processing time.

18. The method of claim 15, further comprising:

determining a new heavy-gas stabilization value during the processing time;

comparing the new heavy-gas stabilization value to new heavy-gas stabilization limits during the processing time; and performing at least one new corrective action to improve the new heavy-gas stabilization value when the new heavy-gas stabilization value exceeds one or more of the new heavy-gas stabilization limits during the processing time.

19. The method of claim 15, wherein the heavy plasma generation gas comprises Xeon (Xe), or Krypton (Kr), or any combination thereof and the at least one light process gas comprises Argon (Ar), an Oxygen-containing gas, a Fluorocarbon gas, a Hydrofluorocarbon gas, or a Halogen-containing gas, or any combination thereof, the Fluorocarbon gas having a form $C_xF_y$, wherein x and y are equal to 1 or more, the Hydrofluorocarbon gas having a form $C_xF_yH_z$, wherein x, y and z are equal to 1 or more, and the) Halogen-containing gas having a halogen atom selected from the group consisting of Cl, Br, and F.

20. The method of claim 15, wherein a first gas mixture is provided to the process chamber using at least one gas supply element coupled to the process chamber, the first gas mixture including one or more lighter gaseous constituents that diffuse into the plasma processing space and one or more heavier gaseous constituents that diffuse into the plasma generation space, the lighter gaseous constituents including the new light process gas and the heavier gaseous constituents including at least one heavy plasma generation gas.

* * * * *